(12) United States Patent
Yamazaki et al.

(10) Patent No.: US 12,354,636 B2
(45) Date of Patent: Jul. 8, 2025

(54) SEMICONDUCTOR DEVICE AND ELECTRONIC DEVICE

(71) Applicant: Semiconductor Energy Laboratory Co., Ltd., Atsugi (JP)

(72) Inventors: Shunpei Yamazaki, Setagaya (JP); Hajime Kimura, Atsugi (JP); Hitoshi Kunitake, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 125 days.

(21) Appl. No.: 18/025,457

(22) PCT Filed: Sep. 8, 2021

(86) PCT No.: PCT/IB2021/058147
§ 371 (c)(1),
(2) Date: Mar. 9, 2023

(87) PCT Pub. No.: WO2022/064303
PCT Pub. Date: Mar. 31, 2022

(65) Prior Publication Data
US 2023/0335173 A1 Oct. 19, 2023

(30) Foreign Application Priority Data

Sep. 22, 2020 (JP) .................... 2020-158053
Mar. 5, 2021 (JP) .................... 2021-034922

(51) Int. Cl.
*G11C 11/22* (2006.01)
(52) U.S. Cl.
CPC ........ *G11C 11/221* (2013.01); *G11C 11/2293* (2013.01); *G11C 11/2273* (2013.01); *G11C 11/2275* (2013.01)

(58) Field of Classification Search
CPC .............. G11C 11/221; G11C 11/2293; G11C 11/2273; G11C 11/2275; G11C 11/2259; G11C 11/38; G11C 13/00
(Continued)

(56) References Cited

U.S. PATENT DOCUMENTS 5,532,953 A * 7/1996 Ruesch ................... G11C 11/22
365/145
5,808,929 A * 9/1998 Sheikholeslami ... G11C 15/046
365/49.13
(Continued)

FOREIGN PATENT DOCUMENTS

CN 001748199 A 3/2006
EP 1591885 A 11/2005
(Continued)

OTHER PUBLICATIONS

International Search Report (Application No. PCT/IB2021/058147) Dated Nov. 16, 2021.
(Continued)

*Primary Examiner* — Michael T Tran
(74) *Attorney, Agent, or Firm* — Eric J. Robinson; Robinson Intellectual Property Law Office, P.C.

(57) ABSTRACT

A semiconductor device with low power consumption that is capable of non-destructive reading is provided. The semiconductor device includes a first transistor, a second transistor, a third transistor, a first FTJ element, and a second FTJ element. A first terminal of the first transistor is electrically connected to an output terminal of the first FTJ element, an input terminal of the second FTJ element, and a gate of the second transistor. A first terminal of the second transistor is electrically connected to a second terminal of the third transistor. For data writing, polarization is caused in each of the first FTJ element and the second FTJ element in accordance with data. For data reading, a voltage that does
(Continued)

not cause a change in polarization is applied between the input terminal of the first FTJ element and the output terminal of the second FTJ element, a potential is supplied to the gate of the second transistor, and a current or voltage corresponding to data is obtained from the first terminal of the second transistor.

6 Claims, 34 Drawing Sheets

(58) Field of Classification Search
USPC .................................. 365/145, 158
See application file for complete search history.

(56) References Cited

U.S. PATENT DOCUMENTS

| | | | | |
|---|---|---|---|---|
| 6,013,950 | A * | 1/2000 | Nasby | H01L 29/7391 |
| | | | | 257/295 |
| 6,898,104 | B2 * | 5/2005 | Ogiwara | G11C 7/067 |
| | | | | 365/205 |
| 7,464,131 | B2 | 12/2008 | Kameyama et al. | |
| 7,492,629 | B2 | 2/2009 | Sugibayashi et al. | |
| 9,728,259 | B1 * | 8/2017 | Jung | G11C 15/046 |
| 9,812,204 | B1 * | 11/2017 | Yan | H10B 53/30 |
| 10,014,036 | B1 * | 7/2018 | Zhou | G11C 7/10 |
| 10,353,715 | B2 * | 7/2019 | Luo | G06F 1/305 |
| 10,650,766 | B2 | 5/2020 | Kurokawa. et al. | |
| 10,763,786 | B1 * | 9/2020 | Dick | H03B 5/364 |
| 10,803,942 | B1 * | 10/2020 | Jung | H04L 9/3278 |
| 11,043,497 | B1 * | 6/2021 | Sharma | H10N 70/826 |
| 11,062,666 | B2 | 7/2021 | Kurokawa. et al. | |
| 11,069,402 | B1 * | 7/2021 | Jaiswal | G11C 16/0408 |
| 11,101,302 | B2 | 8/2021 | Ikeda et al. | |
| 11,636,890 | B2 * | 4/2023 | Ingalls | G11C 7/1006 |
| | | | | 365/145 |
| 11,769,541 | B2 * | 9/2023 | Li | G11C 11/2273 |
| | | | | 365/145 |
| 11,769,804 | B2 * | 9/2023 | Xu | H10D 64/033 |
| | | | | 365/145 |
| 2002/0141233 | A1 * | 10/2002 | Hosotani | B82Y 10/00 |
| | | | | 365/158 |
| 2005/0275647 | A1 | 12/2005 | Numao | |
| 2006/0067097 | A1 * | 3/2006 | Lien | G11C 11/22 |
| | | | | 365/158 |
| 2006/0139844 | A1 | 6/2006 | Kameyama et al. | |
| 2007/0159876 | A1 | 7/2007 | Sugibayashi et al. | |
| 2009/0129141 | A1 * | 5/2009 | Hosotani | G11C 13/0007 |
| | | | | 365/189.16 |
| 2009/0167532 | A1 * | 7/2009 | Kang | G06K 19/0723 |
| | | | | 340/572.1 |
| 2009/0173978 | A1 | 7/2009 | Kato | |
| 2009/0279342 | A1 * | 11/2009 | Rodriguez | G11C 11/22 |
| | | | | 365/65 |
| 2010/0020588 | A1 * | 1/2010 | Shuto | G11C 11/22 |
| | | | | 365/230.03 |
| 2011/0310651 | A1 * | 12/2011 | Evans, Jr. | G11C 11/22 |
| | | | | 365/145 |
| 2012/0020140 | A1 * | 1/2012 | Chen | G11C 11/22 |
| | | | | 257/E45.001 |
| 2012/0317343 | A1 * | 12/2012 | Fuchikami | G06F 12/0246 |
| | | | | 711/E12.008 |
| 2013/0258751 | A1 * | 10/2013 | Toops | G06F 30/39 |
| | | | | 365/145 |
| 2017/0154909 | A1 | 6/2017 | Ishizu | |
| 2017/0270405 | A1 | 9/2017 | Kurokawa | |
| 2017/0277459 | A1 * | 9/2017 | Rodriguez | G11C 11/221 |
| 2017/0344430 | A1 * | 11/2017 | Greer | G06F 11/1456 |
| 2018/0181862 | A1 | 6/2018 | Ikeda | |
| 2019/0019458 | A1 | 1/2019 | Teraguchi | |
| 2019/0058007 | A1 * | 2/2019 | Tsai | G11C 11/1673 |
| 2019/0237121 | A1 * | 8/2019 | Liu | H01G 4/08 |
| 2020/0006567 | A1 | 1/2020 | Endo et al. | |
| 2020/0091162 | A1 * | 3/2020 | Morris | H01L 27/0886 |
| 2020/0105771 | A1 * | 4/2020 | Morris | H01L 23/16 |
| 2020/0168261 | A1 * | 5/2020 | Jaiswal | G11C 11/18 |
| 2020/0266787 | A1 * | 8/2020 | Kang | H03G 5/28 |
| 2020/0328220 | A1 * | 10/2020 | Derner | G11C 11/221 |
| 2020/0357453 | A1 * | 11/2020 | Slesazeck | G11C 11/2273 |
| 2021/0028178 | A1 * | 1/2021 | You | H01L 21/823821 |
| 2021/0118408 | A1 | 4/2021 | Kurokawa | |
| 2021/0118950 | A1 * | 4/2021 | Hatcher | H01F 10/3254 |
| 2021/0202508 | A1 * | 7/2021 | Jeon | H01L 29/78391 |
| 2022/0045125 | A1 | 2/2022 | Kimura et al. | |
| 2022/0157817 | A1 | 5/2022 | Yamazaki et al. | |
| 2022/0157986 | A1 | 5/2022 | Yamazaki et al. | |
| 2023/0298650 | A1 * | 9/2023 | Yamazaki | H10B 53/30 |
| | | | | 365/145 |

FOREIGN PATENT DOCUMENTS

| | | |
|---|---|---|
| JP | 05-347422 A | 12/1993 |
| JP | 2003-178577 A | 6/2003 |
| JP | 2004-264896 A | 9/2004 |
| JP | 2007-207406 A | 8/2007 |
| JP | 2009-164473 A | 7/2009 |

OTHER PUBLICATIONS

Written Opinion (Application No. PCT/IB2021/058147) Dated Nov. 16, 2021.
Agrawal.A et al., "X-SRAM: Enabling In-Memory Boolean Computations in CMOS Static Random Access Memories", IEEE Transactions on Circuits and Systems, Jul. 2, 2018, pp. 1-14.
Moradi.S et al., "An Event-Based Neural Network Architecture With an Asynchronous Programmable Synaptic Memory", IEEE Transactions on Biomedical Circuits and Systems, Jun. 4, 2013, vol. 8, No. 1, pp. 98-107.
Kang.M et al., "A 19.4-nJ/Decision, 364-K Decisions/s, In-Memory Random Forest Multi-Class Inference Accelerator", IEEE Journal of Solid-State Circuits, May 2, 2018, vol. 53, No. 7, pp. 2126-2135.
Akyel.K et al., "DRC²: Dynamically Reconfigurable Computing Circuit based on memory architecture", IEEE International Conference on Rebooting Computing, Oct. 17, 2016, pp. 1-8pages.
Zhang.J et al., "In-Memory Computation of a Machine-Learning Classifier in a Standard 6T SRAM Array", IEEE Journal of Solid-State Circuits, Mar. 10, 2017, vol. 52, No. 4, pp. 915-924.

* cited by examiner

FIG. 31A
| Amorphous | Intermediate state<br>New crystalline phase<br>Crystalline | Crystal |
|---|---|---|
| • completely amorphous | • CAAC<br>• nc<br>• CAC<br>excluding single crystal and poly crystal | • single crystal<br>• poly crystal |
FIG. 31B
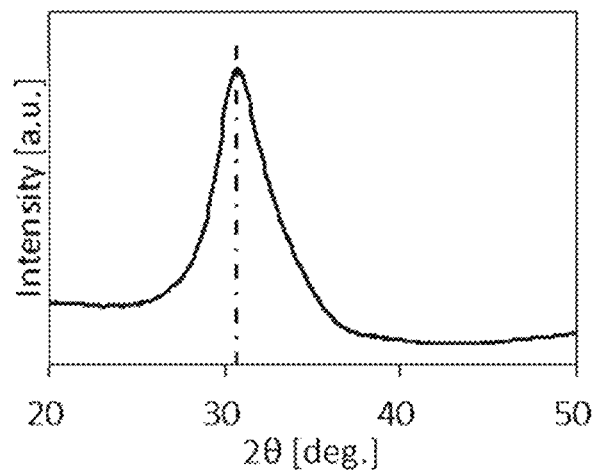
FIG. 31C
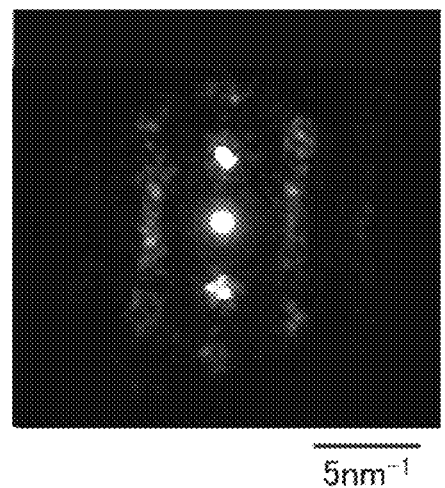

SEMICONDUCTOR DEVICE AND ELECTRONIC DEVICE

TECHNICAL FIELD

One embodiment of the present invention relates to a semiconductor device and an electronic device.

Note that one embodiment of the present invention is not limited to the above technical field. The technical field of the invention disclosed in this specification and the like relates to an object, a driving method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a signal processing device, a processor, an electronic device, a system, a driving method thereof, a manufacturing method thereof, and a testing method thereof.

BACKGROUND ART

In recent years, semiconductor devices have been developed; an LSI (Large Scale Integration), a CPU (Central Processing Unit), a memory, and the like have been mainly used for semiconductor devices. A CPU is an assembly of semiconductor elements each including a chip of a semiconductor integrated circuit (including at least a transistor and a memory) processed from a semiconductor wafer and an electrode serving as a connection terminal.

Moreover, semiconductor devices including the above-described semiconductor integrated circuit provided with any of a ferroelectric capacitor, an FTJ (Ferroelectric Tunnel Junction or Ferroelectric Transportation Junction) element, an FeFET (Ferroelectric FET), and the like, each of which includes a dielectric that shows ferroelectricity, have been developed. For example, Patent Document 1 discloses a semiconductor memory cell including a transistor in which a ferroelectric film is provided as a gate insulating film on the back gate side. Furthermore, for example, Patent Document 2 discloses a memory having a structure in which a ferroelectric capacitor is electrically connected to a gate of a transistor.

REFERENCES

Patent Documents

[Patent Document 1] Japanese Published Patent Application No. 2009-164473
[Patent Document 2] Japanese Published Patent Application No. 2003-178577

SUMMARY OF THE INVENTION

Problems to be Solved by the Invention

The amount of data handled in electronic devices or the like tends to increase recently, and miniaturization of memory devices, specifically, memory cells has been attempted in order to increase storage capacity. In the case where a capacitor is downsized for miniaturization of a memory cell, the capacitance value of the capacitor becomes small, so that it becomes difficult to retain data for a long time. In addition, the number of refresh operations for retaining data increases, so that power consumption may also increase. Therefore, a memory device preferably includes a memory cell capable of retaining data for a long time.

In particular, in a structure where a DRAM (Dynamic Random Access Memory) is used as a memory device, when data is read from a memory cell, retained data is broken (destructive reading is performed); thus, data rewriting is essential. Therefore, a DRAM sometimes requires a circuit for restoring data after the data is read. In addition, since data rewriting is performed, power consumption may also increase.

An object of one embodiment of the present invention is to provide a semiconductor device that does not require data rewriting (a semiconductor device that performs non-destructive reading). Another object of one embodiment of the present invention is to provide a semiconductor device with reduced power consumption. Another object of one embodiment of the present invention is to provide a semiconductor device with reduced circuit area. Another object of one embodiment of the present invention is to provide a novel semiconductor device. Another object of one embodiment of the present invention is to provide an electronic device including any of the above-described semiconductor devices.

Note that the objects of one embodiment of the present invention are not limited to the objects listed above. The objects listed above do not preclude the existence of other objects. The other objects are objects that are not described in this section and will be described below. The objects that are not described in this section are derived from the description of the specification, the drawings, or the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

Means for Solving the Problems (1)

One embodiment of the present invention is a semiconductor device including a first transistor, a second transistor, a first FTJ element, and a second FTJ element. In particular, the first FTJ element and the second FTJ element each include an input terminal, a tunnel insulating film, a dielectric, and an output terminal. In the first FTJ element and the second FTJ element, the input terminal, the tunnel insulating film, the dielectric, and the output terminal are stacked in this order. One of a source and a drain of the first transistor is preferably electrically connected to the output terminal of the first FTJ element, the input terminal of the second FTJ element, and a gate of the second transistor.

(2)

In the above (1), one embodiment of the present invention preferably has a structure in which the tunnel insulating film includes silicon oxide or silicon nitride and the dielectric includes an oxide containing one or both of hafnium and zirconium.

(3)

Alternatively, one embodiment of the present invention is a semiconductor device including a first transistor, a second transistor, a first ferroelectric capacitor, and a second ferroelectric capacitor. In particular, a first terminal of the first transistor is preferably electrically connected to a first terminal of the first ferroelectric capacitor, a first terminal of the second ferroelectric capacitor, and a gate of the second transistor.

(4)

Alternatively, in the above (3), one embodiment of the present invention preferably has a structure in which the ferroelectric capacitor includes a dielectric. In particular, the dielectric preferably includes an oxide containing one or both of hafnium and zirconium.

(5)

Alternatively, one embodiment of the present invention is a semiconductor device including a first transistor, a second transistor, a first circuit element, and a second circuit element. In particular, one of a source and a drain of the first transistor is preferably electrically connected to an output terminal of the first circuit element, an input terminal of the second circuit element, and a gate of the second transistor. The first circuit element and the second circuit element each include any one of a variable resistor, an MTJ element, and a phase-change memory element.

(6)

Alternatively, in any one of the above (1) to (5), one embodiment of the present invention may have a structure in which one of a source and a drain of the second transistor is electrically connected to the other of the source and the drain of the first transistor.

(7)

Alternatively, in any one of the above (1) to (5), one embodiment of the present invention may have a structure in which a third transistor is included and one of a source and a drain of the second transistor is electrically connected to one of a source and a drain of the third transistor.

(8)

Alternatively, in the above (7), one embodiment of the present invention may have a structure in which the other of the source and the drain of the third transistor is electrically connected to the other of the source and the drain of the first transistor.

(9)

Alternatively, one embodiment of the present invention is an electronic device including the semiconductor device in any one of the above (1) to (8) and a housing.

Note that in this specification and the like, a semiconductor device refers to a device that utilizes semiconductor characteristics, and means a circuit including a semiconductor element (a transistor, a diode, a photodiode, or the like), a device including the circuit, and the like. The semiconductor device also means devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves are semiconductor devices in some cases, or include semiconductor devices in some cases.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts.

Each of X and Y denotes an object (e.g., a device, an element, a circuit, a wiring, an electrode, a terminal, a conductive film, or a layer).

For example, in the case where X and Y are electrically connected, at least one element that enables electrical connection between X and Y (e.g., a switch, a transistor, a capacitor, an inductor, a resistor, a diode, a display device, a light-emitting device, or a load) can be connected between X and Y. Note that a switch has a function of being controlled to be turned on or off. That is, the switch has a function of being in a conducting state (on state) or a non-conducting state (off state) to control whether a current flows or not.

For example, in the case where X and Y are functionally connected, one or more circuits that allow functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of a current, or the like, an operational amplifier, a differential amplifier circuit, a source follower circuit, a buffer circuit, or the like); a signal generation circuit; a memory circuit; or a control circuit) can be connected between X and Y. For instance, even if another circuit is provided between X and Y, X and Y are regarded as being functionally connected when a signal output from X is transmitted to Y.

Note that an explicit description, X and Y are electrically connected, includes the case where X and Y are electrically connected (i.e., the case where X and Y are connected through another element or another circuit) and the case where X and Y are directly connected (i.e., the case where X and Y are connected without through another element or another circuit).

It can be expressed as, for example, "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that the above expressions are examples, and there is no limitation on the expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both of the components that are a wiring and an electrode. Thus, electrical connection in this specification includes, in its category, such a case where one conductive film has functions of a plurality of components.

In this specification and the like, a "resistor" can be, for example, a circuit element or a wiring having a resistance value higher than 0Ω. Therefore, in this specification and the like, a "resistor" sometimes includes a wiring having a resistance value, a transistor in which a current flows between its source and drain, a diode, and a coil. Thus, the term "resistor" can be replaced with the terms "resistance", "load", "region having a resistance value", and the like in some cases; inversely, the terms "resistance", "load", and "region having a resistance value" can be replaced with the term "resistor" and the like in some cases. The resistance value can be, for example, preferably greater than or equal to 1 mΩ and less than or equal to 10Ω, further preferably greater than or equal to 5 mΩ and less than or equal to 5Ω, still further preferably greater than or equal to 10 mΩ and less than or equal to 1Ω. As another example, the resistance value may be greater than or equal to 1Ω and less than or equal to $1\times10^9 \Omega$.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. Therefore, in this specification and the like, a "capacitor" includes a circuit element or the like that has a pair of electrodes and a dielectric between the electrodes. The terms "capacitor", "parasitic capacitance", "gate capacitance", and the like can be replaced with the term "capacitance" and the like in some cases; inversely, the term "capacitance" can be replaced with the terms "capacitor", "parasitic capacitance", "gate capacitance", and the like in some cases. The term "pair of electrodes" in "capacitor" can be replaced with "pair of conductors", "pair of conductive regions", "pair of regions", and the like. Note that the electrostatic capacitance value can be greater than or equal to 0.05 fF and less than or equal to 10 pF, for example. As another example, the electrostatic capacitance value may be greater than or equal to 1 pF and less than or equal to 10 μF.

In this specification and the like, a transistor includes three terminals called a gate, a source, and a drain. The gate is a control terminal for controlling the conducting state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms "source" and "drain" can be replaced with each other in this specification and the like in some cases. In this specification and the like, expressions "one of a source and a drain" (or a first electrode or a first terminal) and "the other of the source and the drain" (or a second electrode or a second terminal) are used in description of the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. In some cases, the terms "gate" and "back gate" can be replaced with each other in one transistor. In the case where a transistor includes three or more gates, the gates may be referred to as a first gate, a second gate, and a third gate, for example, in this specification and the like.

In this specification and the like, for example, a transistor with a multi-gate structure having two or more gate electrodes can be used as the transistor. With the multi-gate structure, channel formation regions are connected in series; accordingly, a plurality of transistors are connected in series. Thus, with the multi-gate structure, the amount of off-state current can be reduced, and the withstand voltage of the transistor can be increased (the reliability can be improved). Alternatively, with the multi-gate structure, drain-source current does not change very much even if drain-source voltage changes at the time of an operation in a saturation region, so that a flat slope of voltage-current characteristics can be obtained. By utilizing the flat slope of the voltage-current characteristics, an ideal current source circuit or an active load having an extremely high resistance value can be obtained. As a result, a differential circuit, a current mirror circuit, or the like having excellent properties can be obtained.

The case where a single circuit element is illustrated in a circuit diagram may indicate a case where the circuit element includes a plurality circuit elements. For example, the case where a single resistor is illustrated in a circuit diagram may indicate a case where two or more resistors are electrically connected to each other in series. For another example, the case where a single capacitor is illustrated in a circuit diagram may indicate a case where two or more capacitors are electrically connected to each other in parallel. For another example, the case where a single transistor is illustrated in a circuit diagram may indicate a case where two or more transistors are electrically connected to each other in series and their gates are electrically connected to each other. Similarly, for another example, the case where a single switch is illustrated in a circuit diagram may indicate a case where a switch includes two or more transistors which are electrically connected to each other in series or in parallel and whose gates are electrically connected to each other.

In this specification and the like, a node can be referred to as a terminal, a wiring, an electrode, a conductive layer, a conductor, an impurity region, or the like depending on the circuit structure and the device structure. Furthermore, a terminal and a wiring can each be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, are changed with a change of the reference potential.

In this specification and the like, the terms "high-level potential" and "low-level potential" do not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer (electrical conduction); for example, the description "electrical conduction of positively charged particles is caused" can be rephrased as "electrical conduction of negatively charged particles is caused in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of a current" in a wiring or the like refers to the direction in which a carrier with a positive charge moves, and the amount of a current is expressed as a positive value. In other words, the direction in which a carrier with a negative charge moves is opposite to the direction of a current, and the amount of a current is expressed as a negative value. Thus, in the case where the polarity of a current (or the direction of a current) is not specified in this specification and the like, the description "a current flows from element A to element B" can be rephrased as "a current flows from element B to element A", for example. As another example, the description "current is input to element A" can be rephrased as "current is output from element A".

Ordinal numbers such as "first", "second", and "third" in this specification and the like are used in order to avoid confusion among components. Thus, the terms do not limit the number of components. Furthermore, the terms do not limit the order of components. For example, a "first" component in one embodiment in this specification and the like can be referred to as a "second" component in other embodiments or claims. For another example, a "first" component in one embodiment in this specification and the like can be omitted in other embodiments or claims.

In this specification and the like, the terms for describing positioning, such as "over" and "under", are sometimes used for convenience to describe the positional relation between components with reference to drawings. The positional relation between components is changed as appropriate in accordance with the direction from which each component is described. Thus, the positional relation is not limited to that described with a term in this specification and the like and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

Furthermore, the term "over" or "under" does not necessarily mean that a component is placed directly over or directly under and in direct contact with another component. For example, the expression "electrode B over insulating layer A" does not necessarily mean that the electrode B is formed on and in direct contact with the insulating layer A, and does not exclude the case where another component is provided between the insulating layer A and the electrode B.

In this specification and the like, the terms such as "film" and "layer" can be interchanged with each other depending on the situation. For example, the term "conductive layer" can be changed into the term "conductive film" in some cases. Moreover, the term "insulating film" can be changed into the term "insulating layer" in some cases. Alternatively, the term "film", "layer", or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "electrode," "wiring," and "terminal" do not functionally limit those components. For example, an "electrode" is used as part of a wiring in some cases, and vice versa. Furthermore, the term "electrode", "wiring", or the like can also include the case where a plurality of "electrodes", "wirings", or the like are formed in an integrated manner. For example, a "terminal" is used as part of a "wiring", an "electrode", or the like in some cases, and vice versa. Furthermore, the term "terminal" can also include the case where a plurality of "electrodes", "wirings", "terminals", or the like are formed in an integrated manner. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region", for example.

In this specification and the like, the terms "wiring", "signal line", "power supply line", and the like can be interchanged with each other depending on the case or according to circumstances. For example, the term "wiring" can be changed into the term "signal line" in some cases. As another example, the term "wiring" can be changed into the term "power supply line" in some cases. Conversely, the term "signal line", "power supply line", or the like can be changed into the term "wiring" in some cases. The term "power supply line" or the like can be changed into the term "signal line" or the like in some cases. Conversely, the term "signal line" or the like can be changed into the term "power supply line" or the like in some cases. The term "potential" that is applied to a wiring can be changed into the term "signal" or the like depending on the case or according to circumstances. Conversely, the term "signal" or the like can be changed into the term "potential" in some cases.

In this specification and the like, an impurity in a semiconductor refers to, for example, elements other than the main components of a semiconductor layer. For instance, an element with a concentration lower than 0.1 atomic % is an impurity. When an impurity is contained, for example, the density of defect states in a semiconductor is increased, carrier mobility is decreased, or crystallinity is decreased in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specifically, there are hydrogen (contained also in water), lithium, sodium, silicon, boron, phosphorus, carbon, nitrogen, and the like, for example. Specifically, when the semiconductor is a silicon layer, examples of impurities that change the characteristics of the semiconductor include Group 1 elements, Group 2 elements, Group 13 elements, and Group 15 elements (except oxygen and hydrogen).

In this specification and the like, a switch has a function of being in a conducting state (on state) or a non-conducting state (off state) to determine whether a current flows or not. Alternatively, a switch has a function of selecting and changing a current path. Thus, a switch may have two or more terminals through which a current flows, in addition to a control terminal. For example, an electrical switch or a mechanical switch can be used. That is, a switch can be any element capable of controlling current, and is not limited to a particular element.

Examples of an electrical switch include a transistor (e.g., a bipolar transistor and an MOS transistor), a diode (e.g., a PN diode, a PIN diode, a Schottky diode, an MIM (Metal Insulator Metal) diode, an MIS (Metal Insulator Semiconductor) diode, and a diode-connected transistor), and a logic circuit in which such elements are combined. Note that in the case of using a transistor as a switch, a "conducting state" of the transistor refers to, for example, a state where a source electrode and a drain electrode of the transistor can be regarded as being electrically short-circuited or a state where current can flow between the source electrode and the drain electrode. Furthermore, a "non-conducting state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology. Such a switch includes an electrode that can be moved mechanically, and operates by controlling conduction and non-conduction with movement of the electrode.

In this specification, "parallel" indicates a state where two straight lines are placed at an angle greater than or equal to −10° and less than or equal to 10°. Thus, the case where the angle is greater than or equal to −5° and less than or equal to 5° is also included. Moreover, "approximately parallel" or "substantially parallel" indicates a state where two straight lines are placed at an angle greater than or equal to −30° and less than or equal to 30°. In addition, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

Effect of the Invention

One embodiment of the present invention can provide a semiconductor device that does not require data rewriting (a semiconductor device that performs non-destructive reading). Another embodiment of the present invention can provide a semiconductor device with reduced power consumption. Another embodiment of the present invention can provide a semiconductor device with reduced circuit area. Another embodiment of the present invention can provide a novel semiconductor device. Alternatively, one embodiment of the present invention can provide an electronic device including any of the above-described semiconductor devices.

Note that the effects of one embodiment of the present invention are not limited to the effects listed above. The effects listed above do not preclude the existence of other effects. The other effects are effects that are not described in this section and will be described below. The effects that are not described in this section are derived from the description of the specification, the drawings, or the like and can be extracted as appropriate from the description by those skilled in the art. Note that one embodiment of the present invention has at least one of the effects listed above and the other effects. Accordingly, one embodiment of the present invention does not have the effects listed above in some cases.

BRIEF DESCRIPTION OF THE DRAWINGS

FIG. 31A is a diagram showing classifications of crystal structures of IGZO, FIG. 31B is a diagram showing an XRD spectrum of crystalline IGZO, and FIG. 31C is a diagram showing a nanobeam electron diffraction pattern of the crystalline IGZO.

MODE FOR CARRYING OUT THE INVENTION

Figure 1A:
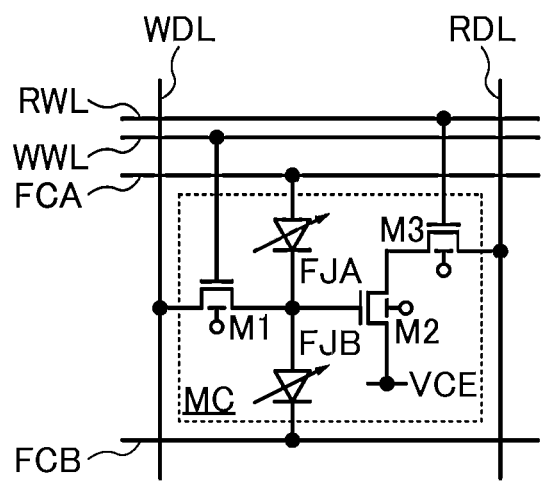
FIG. 1A and FIG. 1B are circuit diagrams each showing a structure example of a memory cell of a semiconductor device.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide included in a channel formation region of a transistor is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also referred to as a metal oxide in some cases. A metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, content described in the embodiment is content described using a variety of diagrams or content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification will be described with reference to the drawings. Note that the embodiments can be implemented in many different modes, and it will be readily appreciated by those skilled in the art that modes and details can be changed in various ways without departing from the spirit and scope thereof. Therefore, the present invention should not be construed as being limited to the description of the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification and the like, when a plurality of components are denoted by the same reference numerals, and in particular need to be distinguished from each other, an identification sign such as "_1", "[n]", or "[m,n]" is sometimes added to the reference numerals. Components denoted with identification signs such as "_1", "[n]", and "[m,n]" in the drawings and the like are sometimes denoted without such identification signs in this specification and the like when the components do not need to be distinguished from each other.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes, values, or the like shown in the drawings. For example, variations in signal, voltage, or current due to noise, variations in signal, voltage, or current due to difference in timing, or the like can be included.

Embodiment 1

In this embodiment, a semiconductor device of one embodiment of the present invention will be described.

Structure Example 1

FIG. 1A shows a circuit structure example a memory cell MC included in a memory device that is a semiconductor device of one embodiment of the present invention.

The memory cell MC includes a transistor M1 to a transistor M3, an FTJ element FJA, and an FTJ element FJB.

The FTJ element FJA and the FTJ element FJB are each a tunnel junction element including a pair of electrodes, a material that can show ferroelectricity, and an insulator functioning as a tunnel insulating film. The FTJ element has a function of changing its resistance value in accordance with the direction, intensity, or the like of the polarization of the material that can show ferroelectricity.

The insulator is provided to overlap with the material that can show ferroelectricity and the insulator and the material that can show ferroelectricity are provided between the pair of electrodes. In the FTJ element, the insulator functioning as a tunnel insulating film is provided to overlap with the material that can show ferroelectricity; thus, the FTJ element has rectifying characteristics. When the FTJ element has a structure in which one of the pair of electrodes, the insulator functioning as a tunnel insulating film, the material that can show ferroelectricity, and the other of the pair of electrodes are stacked in this order, for example, the forward direction in which a current flows in the FTJ element is a direction from the one of the pair of electrodes to the other of the pair of electrodes. Note that in this specification, the one of the pair of electrodes is referred to as an input terminal and the other of the pair of electrodes is referred to as an output terminal in some cases.

An FTJ element described in this specification and the like can be formed by, for example, stacking a first conductor, a tunnel insulating film, a material that can show ferroelectricity, and a second conductor in this order over a flat insulating film or a flat conductive film. Note that the first conductor can be rephrased as a lower electrode and the second conductor can be rephrased as an upper electrode. Here, the first conductor and the second conductor are the pair of electrodes described above, and the first conductor (the lower electrode) and the second conductor (the upper electrode) function as an input terminal and an output terminal, respectively, for example. An FTJ element described in this specification and the like may be formed by, for example, stacking a first conductor (a lower electrode), a material that can show ferroelectricity, a tunnel insulating film, and a second conductor (an upper electrode) in this order over a flat insulating film or a flat conductive film. Here, the first conductor (the lower electrode) and the second conductor (the upper electrode) function as an output terminal and an input terminal, respectively, for example.

For the tunnel insulating film, silicon oxide, silicon nitride, or a stack of silicon oxide and silicon nitride can be used, for example.

As described above, the resistance value of the FTJ element changes in accordance with the direction or intensity of the polarization of the material that can show ferroelectricity. For example, in the material that can show ferroelectricity between the input terminal and the output terminal of the FTJ element, when the polarization direction is a direction from the output terminal to the input terminal (at this time, the direction of a polarization vector is negative), the amount of a current flowing from the input terminal to the output terminal in the FTJ element is large. Meanwhile, in the material that can show ferroelectricity between the input terminal and the output terminal of the FTJ element, when the polarization direction is a direction from the input terminal to the output terminal (at this time, the direction of a polarization vector is positive), the amount of a current flowing from the input terminal to the output terminal in the FTJ element is small. That is, in the case where the polarization direction is a direction from the input terminal to the output terminal in the FTJ element, a resistance value with respect to a current flowing from the input terminal to the output terminal of the FTJ element is large, and in the case where the polarization direction is a direction from the output terminal to the input terminal in the FTJ element, a resistance value with respect to a current flowing from the input terminal to the output terminal of the FTJ element is small.

Note that as a method for causing polarization (changing the polarization direction) in the material that can show ferroelectricity of the FTJ element, for example, application of a high voltage between the input terminal and the output terminal of the FTJ element is given. For example, by applying a high-level potential and a low-level potential to the input-terminal side and the output-terminal side of the FTJ element, respectively, the polarization direction becomes a direction from the input terminal to the output terminal (a positive direction) in the material that can show ferroelectricity of the FTJ element; meanwhile, by applying a low-level potential and a high-level potential to the input-terminal side and the output-terminal side of the FTJ element, respectively, the polarization direction becomes a direction from the output terminal to the input terminal (a negative direction). Note that since the FTJ element has hysteresis characteristics in the intensity of polarization, application of a voltage corresponding to the structure of the FTJ element is required to cause polarization (change the polarization direction), and with a voltage lower than the above-described voltage, polarization is not caused (the polarization direction does not change) in the FTJ element.

Note that in the drawings of this specification, the FTJ element is represented by a circuit symbol of a diode with an arrow. In the drawings of this specification, a side of a triangle corresponding to an anode of the circuit symbol of the diode that is connected to a wiring represents the input terminal of the FTJ element, and a vertex and a line of the triangle corresponding to a cathode of the circuit symbol of the diode that is connected to a wiring represent the output terminal of the FTJ element.

As the material that can show ferroelectricity, hafnium oxide is preferably used, for example. In the case of using hafnium oxide as the material that can show ferroelectricity and is included in the FTJ element, the thickness of the hafnium oxide (or the distance between the pair of electrodes of the FTJ element) is preferably less than or equal to 10 nm, further preferably less than or equal to 5 nm, still further preferably less than or equal to 2 nm.

Other than hafnium oxide, examples of the material that can show ferroelectricity include zirconium oxide, hafnium zirconium oxide (denoted by $HfZrO_X$ (X is a real number greater than 0) in some cases), a material in which an element J1 (the element J1 here is zirconium (Zr), silicon (Si), aluminum (Al), gadolinium (Gd), yttrium (Y), lanthanum (La), strontium (Sr), or the like) is added to hafnium oxide, and a material in which an element J2 (the element J2 here is hafnium (Hf), silicon (Si), aluminum (Al), gadolinium (Gd), yttrium (Y), lanthanum (La), strontium (Sr), or the like) is added to zirconium oxide. As the material that can show ferroelectricity, a piezoelectric ceramic having a perovskite structure such as lead titanate (denoted by $PbTiO_X$ in some cases), barium strontium titanate (BST), strontium titanate, lead zirconate titanate (PZT), strontium bismuth tantalate (SBT), bismuth ferrite (BFO), or barium titanate may be used. As the material that can show ferroelectricity, a mixture or a compound of materials selected from the above-listed materials can be used, for example. Alternatively, the material that can show ferroelectricity can have a stacked-layer structure including a plurality of materials selected from the above-listed materials. Since hafnium oxide, zirconium oxide, hafnium zirconium oxide, a material in which the element J1 is added to hafnium oxide, and the like may change its crystal structure (characteristics) according to various processes and the like as well as deposition conditions, not only a material that exhibits ferroelectricity is referred to not only as a ferroelectric but also as a material that can show ferroelectricity in this specification and the like.

In the case where hafnium zirconium oxide is used as the material that can show ferroelectricity, the hafnium zirconium oxide is preferably deposited by an atomic layer deposition (ALD) method, specifically, a thermal ALD method. In the case where the material that can show ferroelectricity is deposited by a thermal ALD method, a material not containing hydrocarbon (also referred to as Hydro Carbon or HC) is suitably used as a precursor. In the case where the material that can show ferroelectricity contains one or both of hydrogen and carbon, crystallization of the material that can show ferroelectricity is hindered in some cases. Therefore, it is preferable to use a precursor not containing hydrocarbon as described above in order to reduce the concentration of one or both of hydrogen and carbon in the material that can show ferroelectricity. Examples of a precursor not containing hydrocarbon include a chlorine-based material. In the case where a material containing hafnium oxide and zirconium oxide (e.g., hafnium zirconium oxide) is used as the material that can show ferroelectricity, $HfCl_4$ and/or $ZrCl_4$ are used as a precursor.

Note that in the case where a film containing the material that can show ferroelectricity is deposited, by completely eliminating impurities in the film, which are here at least one of hydrogen, hydrocarbon, and carbon, a highly purified intrinsic film that can show ferroelectricity can be formed. The manufacturing processes of the highly purified intrinsic film that can show ferroelectricity and a highly purified intrinsic semiconductor described in an embodiment below are extremely consistent with each other. Accordingly, a method for manufacturing a semiconductor device with high productivity can be provided.

In the case where hafnium zirconium oxide is used as the material that can show ferroelectricity, hafnium oxide and zirconium oxide are preferably alternately deposited by a thermal ALD method so that the composition is 1:1.

In the case where the material that can show ferroelectricity is deposited by a thermal ALD method, $H_2O$ or $O_3$ can be used as an oxidizer. Note that an oxidizer for a thermal ALD method is not limited to this. For example, one or more selected from $O_2$, $O_3$, $N_2O$, $NO_2$, $H_2O$, and $H_2O_2$ may be included as an oxidizer for a thermal ALD method.

The crystal structure of the material that can show ferroelectricity is not particularly limited. The crystal structure of the material that can show ferroelectricity is any one selected from a cubic crystal structure, a tetragonal crystal structure, an orthorhombic crystal structure, and a monoclinic crystal structure or a composite structure of them, for example. It is particularly preferable that the material that can show ferroelectricity have the orthorhombic crystal structure because ferroelectricity is exhibited. Alternatively, the material that can show ferroelectricity may have a composite structure including an amorphous structure and a crystal structure.

As each of the transistor M1 to the transistor M3, for example, an OS transistor can be used. In addition, as a metal oxide included in a channel formation region of the OS transistor, an oxide containing at least one of indium, gallium, and zinc is preferably included. Alternatively, the metal oxide may be an oxide containing at least one of indium, an element M (as the element M, for example, one or more kinds selected from aluminum, yttrium, copper, vanadium, beryllium, boron, titanium, iron, nickel, germanium, zirconium, molybdenum, lanthanum, cerium, neodymium, hafnium, tantalum, tungsten, magnesium, and the like can be given), and zinc, for example. It is further preferable that the transistor M1 to the transistor M3 have a structure of a transistor described in Embodiment 6.

As each of the transistor M1 to the transistor M3, a transistor including silicon in its channel formation region (hereinafter, referred to as a Si transistor) may be used other than an OS transistor. The silicon may be amorphous silicon (referred to as hydrogenated amorphous silicon in some cases), microcrystalline silicon, polycrystalline silicon, or single crystal silicon, for example.

Alternatively, other than an OS transistor and a Si transistor, a transistor including Ge or the like in a channel formation region, a transistor including a compound semiconductor such as ZnSe, CdS, GaAs, InP, GaN, or SiGe in a channel formation region, a transistor including a carbon nanotube in a channel formation region, a transistor including an organic semiconductor in a channel formation region, or the like may be used as each of the transistor M1 to the transistor M3.

Note that the channel formation regions of the transistor M1 to the transistor M3 may include the same material or different materials. For example, one or two of the transistor M1 to the transistor M3 may be an OS transistor and the rest may be a Si transistor.

The transistor M1 to the transistor M3 illustrated in FIG. 1A are each a transistor having a structure including gates over and under a channel, and the transistor M1 to the transistor M3 each include a first gate and a second gate. For convenience, the first gate is referred to as a gate (referred to as a front gate in some cases) and the second gate is referred to as a back gate so that they are distinguished from each other, for example; however, the first gate and the second gate can be interchanged with each other. Therefore, in this specification and the like, the term "gate" can be replaced with the term "back gate". Similarly, the term "back gate" can be replaced with the term "gate". As a specific example, a connection structure in which "a gate is electrically connected to a first wiring and a back gate is electrically connected to a second wiring" can be replaced with a connection structure in which "a back gate is electrically connected to a first wiring and a gate is electrically connected to a second wiring".

The memory cell MC of the semiconductor device of one embodiment of the present invention does not depend on the connection structure of a back gate of a transistor. In the transistor M1 to the transistor M3 illustrated in FIG. 1A, the back gate is illustrated and the connection structure of the back gate is not illustrated; however, a target to which the back gate is electrically connected can be determined at the design stage. For example, in a transistor including a back gate, a gate and the back gate may be electrically connected to each other to increase the on-state current of the transistor. In other words, the gate and the back gate of the transistor M1 may be electrically connected to each other, for example. Alternatively, for example, in a transistor including a back gate, a wiring electrically connected to an external circuit or the like may be provided and a fixed potential or a variable potential may be supplied to the back gate of the transistor by the external circuit or the like to change the threshold voltage of the transistor or to reduce the off-state current of the transistor. Note that the same applies to a transistor described in other parts of the specification and a transistor illustrated in other drawings, not only to that in FIG. 1A.

Figure 1B:
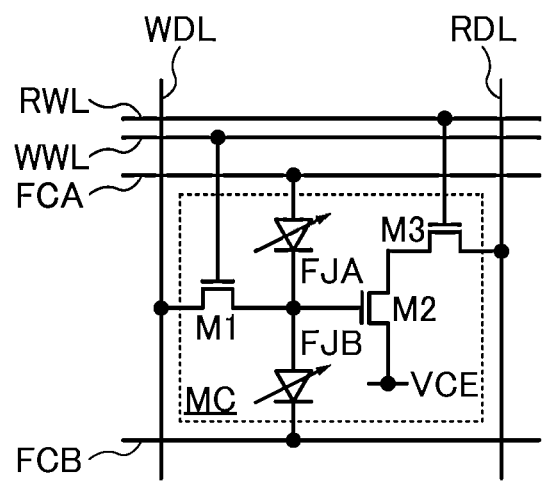

The memory cell MC of the semiconductor device of one embodiment of the present invention does not depend on the structure of the transistor included in the memory cell MC. For example, each of the transistor M1 to the transistor M3 illustrated in FIG. 1A may be a transistor having a structure not including a back gate, that is, a single-gate structure as illustrated in FIG. 1B. It is also possible that one or two of the transistors may have a structure including a back gate and the rest may have a structure not including a back gate. Note that the same applies to a transistor described in other parts of the specification and a transistor illustrated in other drawings, not only to that in FIG. 1A.

Although the transistor M1 to the transistor M3 illustrated in FIG. 1A are illustrated as n-channel transistors as an example, all, one, or two of them may be replaced with p-channel transistors according to circumstances or depending on the case. In the case where the n-channel transistor is replaced with a p-channel transistor, a potential or the like input to the memory cell MC or the like needs to be changed appropriately so that the memory cell MC normally operates. In addition, the result output from the memory cell MC may also change. Note that the same applies to a transistor described in other parts of the specification and a transistor illustrated in other drawings, not only to that in FIG. 1A. In this embodiment, the structure and operation of the memory cell MC are described on the assumption that the transistor M1 to the transistor M3 are n-channel transistors.

In the memory cell MC in FIG. 1A, a first terminal of the transistor M1 is electrically connected to a wiring WDL and the gate of the transistor M1 is electrically connected to a wiring WWL. An input terminal of the FTJ element FJA is electrically connected to a wiring FCA. An output terminal of the FTJ element FJA is electrically connected to a second terminal of the transistor M1, an input terminal of the FTJ element FJB, and the gate of the transistor M2. An output terminal of the FTJ element FJB is electrically connected to a wiring FCB. A first terminal of the transistor M2 is electrically connected to a wiring VCE and a second terminal of the transistor M2 is electrically connected to a first terminal of the transistor M3. A second terminal of the transistor M3 is electrically connected to a wiring RDL and the gate of the transistor M3 is electrically connected to a wiring RWL.

The wiring WDL functions as a wiring for transmitting data to be written to the memory cell MC, for example. That is, the wiring WDL may function as a write data line.

The wiring RDL functions as a wiring for transmitting data read from the memory cell MC, for example. That is, the wiring RDL may function as a read data line.

The wiring WWL functions as a wiring for selecting the memory cell MC as a target for data writing, for example. In other words, the wiring WWL may function as a write word line.

The wiring RWL functions as a wiring for selecting the memory cell MC as a target for data reading, for example. In other words, the wiring RWL may function as a read word line.

The wiring FCA and the wiring FCB function as wirings supplying potentials that cause polarization in the materials that can show ferroelectricity and are included in the FTJ element FJA and the FTJ element FJB in writing data to the memory cell MC, for example. The wiring FCA and the wiring FCB also function as wirings supplying potentials that do not change polarization in the materials that can show ferroelectricity in reading data from the memory cell MC, for example.

The wiring VCE functions as a wiring that supplies a constant voltage, for example. The constant voltage can be, for example, a high-level potential, a low-level potential, a ground potential, or the like.

A detailed operation example will be described later, and as an operation of the memory cell MC, a voltage is applied between the wiring FCA and the wiring FCB and voltages obtained by dividing the voltage are applied to the FTJ element FJA and the FTJ element FJB. At this time, tunnel currents flow through the FTJ element FJA and the FTJ element FJB. Here, in the case where leakage of the tunnel current through the transistor M1 needs to be prevented, an OS transistor is preferably used as the transistor M1. The OS transistor has an extremely low off-state current and thus, in some cases, can prevent leakage of the tunnel currents flowing through the FTJ element FJA and/or the FTJ element FJB to the wiring WDL side.

Operation Examples

Next, examples of a data writing operation and a data reading operation in the memory cell MC in FIG. 1A will be described.

<<Data Writing Operation Example>>

Figure 2:
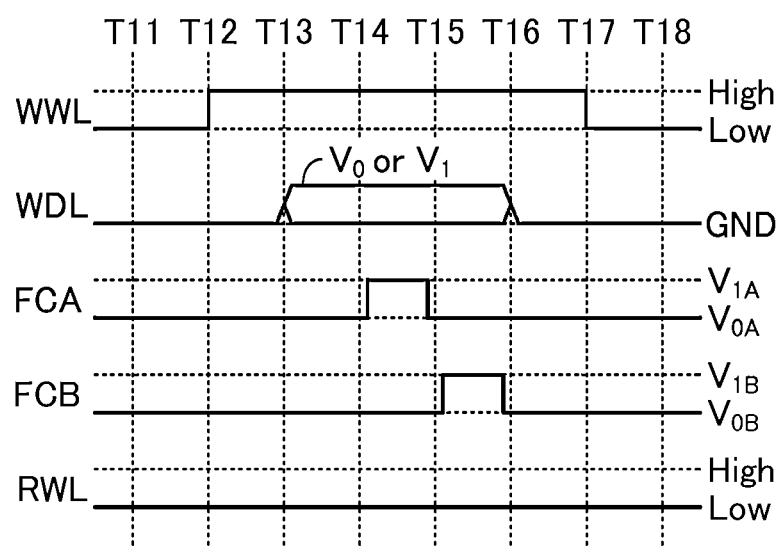
FIG. 2 is a timing chart showing an operation example of a memory cell of a semiconductor device.

FIG. 2 is a timing chart showing an example of a data writing operation in the memory cell MC in FIG. 1A. The timing chart in FIG. 2 shows changes in the potentials of the wiring WWL, the wiring WDL, the wiring FCA, the wiring FCB, and the wiring RWL in the period from Time T11 to Time T18 and time around the period.

Note that in this operation example, the potential of the wiring RDL does not change and thus is not shown in the timing chart in FIG. 2. The potential of the wiring RDL in the period from Time T11 to Time T18 is not particularly limited.

Although a potential supplied by the wiring VCE can be a high-level potential, a low-level potential, a ground potential, or the like as described above, a low-level potential $V_{SS}$ is used in this operation example.

[From Time T11 to Time T12]

In the period from Time T11 to Time T12, the potentials of the wiring WWL and the wiring RWL are low-level potentials (denoted by Low in FIG. 2). Thus, the low-level potential is input to the gate of the transistor M1 and the low-level potential is input to the gate of the transistor M3. Thus, the transistor M1 and the transistor M3 are in an off state.

In addition, data to be written to the memory cell MC has not been input to the wiring WDL yet. Therefore, in this operation example, the potential of the wiring WDL is a ground potential (denoted by GND in FIG. 2) in the period from Time T11 to Time T12, for example. Note that in this operation example, the ground potential is preferably 0 V.

Potentials supplied by the wiring FCA and the wiring FCB are $V_{0A}$ and $V_{0B}$, respectively. For example, $V_{0A}$ and $V_{0B}$ can each be a reference potential or an approximate value of the reference potential. When the reference potential is $V_C$, the approximate value of the reference potential is preferably a potential higher than or equal to $V_C-0.1$ [V], higher than or equal to $V_C-0.05$ [V], or higher than or equal to $V_C-0.01$ [V] and lower than or equal to $V_C+0.01$ [V], lower than or equal to $V_C+0.05$ [V], or lower than or equal to $V_C+0.1$ [V], for example. Note that the above-described lower limits and upper limits can be combined with each other. It is further preferable that the reference potential $V_C$ be 0 [V] or a ground potential, for example. It is further preferable that $V_{0A}$ and $V_{0B}$ be potentials equal to each other.

[From Time T12 to Time T13]

In the period from Time T12 to Time T13, the potential supplied by the wiring WWL changes from a low-level potential to a high-level potential (denoted by High in FIG. 2). Thus, the high-level potential is input to the gate of the transistor M1, so that the transistor M1 is turned on. That is, a conducting state is established between the wiring WDL and the gate of the transistor M2 (the output terminal of the FTJ element FJA and the input terminal of the FTJ element FJB). Thus, the ground potential supplied by the wiring WDL is supplied to the gate of the transistor M2 (the output terminal of the FTJ element FJA and the input terminal of the FTJ element FJB). Accordingly, the potential of the gate of the transistor M2 (the output terminal of the FTJ element FJA and the input terminal of the FTJ element FJB) becomes the ground potential.

[From Time T13 to Time T14]

In the period from Time T13 to Time T14, data to be written to the memory cell MC is transmitted from the wiring WDL to the memory cell MC. Specifically, $V_0$ or $V_1$ is supplied to the wiring WDL as a potential corresponding to the data, for example. The transistor M1 has been in an on state before Time T13, so that $V_0$ or $V_1$ supplied by the wiring WDL is supplied to the gate of the transistor M2 (the output terminal of the FTJ element FJA and the input terminal of the FTJ element FJB). Accordingly, the potential of the gate of the transistor M2 (the output terminal of the FTJ element FJA and the input terminal of the FTJ element FJB) becomes $V_0$ or $V_1$.

Note that $V_0$ and $V_1$ are potentials representing binary data (digital values). For example, $V_0$ can be a potential representing one of "0" and "1" and $V_1$ can be a potential representing the other of "0" and "1". In this operation example, $V_0$ is described as a potential representing "0" and $V_1$ is described as a potential representing "1". Moreover, the levels of $V_0$ and $V_1$ can be set so that $V_1-V_0$ is a voltage that causes polarization or rewrites the polarization direction in the FTJ element FJA and the FTJ element FJB. For example, in the case where a voltage of 3 V causes polarization (changes the polarization direction) in the FTJ element FJA and the FTJ element FJB, $V_1$ and $V_0$ are set so that $V_1-V_0$ is higher than or equal to 3 V. Note that $V_0$ is preferably equal to the potential of $V_{OA}$ and/or $V_{OB}$, for example. Specifically, $V_0$ is set to 0 V or the like and $V_1$ is set to 3 V or the like, for example. Although this operation example describes writing and reading of binary data, writing and/or reading of multilevel data or an analog potential can sometimes be performed on the memory cell MC, for example.

[From Time T14 to Time T15]

In the period from Time T14 to Time T15, a potential $V_{1A}$ is supplied to the wiring FCA and the potential $V_{OB}$ is supplied to the wiring FCB. For example, $V_{1A}$ is a potential higher than $V_{OA}$. In addition, $V_{1A}$ is a potential that causes polarization in the FTJ element FJA when the output terminal of the FTJ element FJA has $V_0$. Note that at this time, the polarization direction is a direction from the input terminal to the output terminal of the FTJ element FJA (a positive direction).

Note that in this operation example, $V_{1A}$ is preferably equal to the potential of $V_1$, for example.

First, the FTJ element FJA is focused on. When the potential of the output terminal of the FTJ element FJA (the gate of the transistor M2) is $V_0$, polarization is caused in a direction from the input terminal to the output terminal (a positive direction) in a dielectric that shows ferroelectricity and is included in the FTJ element FJA. Meanwhile, when the potential of the output terminal of the FTJ element FJA (the gate of the transistor M2) is $V_1$, polarization does not change in the dielectric that shows ferroelectricity and is included in the FTJ element FJA.

Next, the FTJ element FJB is focused on. When the potential of the input terminal of the FTJ element FJB (the gate of the transistor M2) is $V_0$, polarization does not change in a dielectric that shows ferroelectricity and is included in the FTJ element FJB. Meanwhile, when the potential of the input terminal of the FTJ element FJB (the gate of the transistor M2) is $V_1$, polarization is caused in a direction from the input terminal to the output terminal (a positive direction) in the dielectric that shows ferroelectricity and is included in the FTJ element FJB.

[From Time T15 to Time T16]

In the period from Time T15 to Time T16, the potential $V_{OA}$ is supplied to the wiring FCA and a potential $V_{1B}$ is supplied to the wiring FCB. For example, $V_{1B}$ is a potential higher than $V_{OB}$. In addition, $V_{1B}$ is a potential that causes polarization (changes the polarization direction) in the FTJ element FJB when the input terminal of the FTJ element FJB has $V_0$. Note that at this time, the polarization direction is a direction from the output terminal to the input terminal of the FTJ element FJB (a negative direction).

Note that $V_{1B}$ is preferably equal to $V_{1A}$. That is, $V_{1B}$ is preferably equal to $V_1$.

First, the FTJ element FJA is focused on. When the potential of the output terminal of the FTJ element FJA (the gate of the transistor M2) is $V_0$, the polarization direction does not change in the dielectric that shows ferroelectricity and is included in the FTJ element FJA. Meanwhile, when the potential of the output terminal of the FTJ element FJA (the gate of the transistor M2) is $V_1$, polarization is caused in a direction from the output terminal to the input terminal (a negative direction) in the dielectric that shows ferroelectricity and is included in the FTJ element FJA.

Next, the FTJ element FJB is focused on. When the potential of the input terminal of the FTJ element FJB (the gate of the transistor M2) is $V_0$, polarization is caused in a direction from the output terminal to the input terminal (a negative direction) in the dielectric that shows ferroelectricity and is included in the FTJ element FJB. Meanwhile, when the potential of the input terminal of the FTJ element FJB (the gate of the transistor M2) is $V_1$, the polarization direction does not change in the dielectric that shows ferroelectricity and is included in the FTJ element FJB.

In the period from Time T14 to Time T16, the potentials of the wiring FCA and the wiring FCB change as shown in the timing chart in FIG. 2, so that in accordance with the potential supplied from the wiring WDL to the gate of the transistor M2, the polarization directions in the FTJ element FJA and the FTJ element FJB are defined as shown in the following table.

TABLE 1

| Potential written from wiring WDL (potential of gate of transistor M2) | Polarization direction in FTJ element FJA | Polarization direction in FTJ element FJB |
|---|---|---|
| $V_0$ | Direction from input terminal (wiring FCA) to output terminal (positive direction) | Direction from output terminal (wiring FCB) to input terminal (negative direction) |
| $V_1$ | Direction from output terminal to input terminal (wiring FCA) (negative direction) | Direction from input terminal to output terminal (wiring FCB) (positive direction) |

Note that after Time T16, potentials supplied by the wiring FCA and the wiring FCB are $V_{OA}$ and $V_{OB}$, respectively. That is, the potentials supplied by the wiring FCA and the wiring FCB after Time T16 are similar to the potentials supplied by the wiring FCA and the wiring FCB before Time T14.

[From Time T16 to Time T17]

In the period from Time T16 to Time T17, transmission of data from the wiring WDL to the memory cell MC is completed. Specifically, a ground potential is supplied to the wiring WDL, for example. The transistor M1 has been in an on state before Time T16, so that the ground potential supplied by the wiring WDL is supplied to the gate of the transistor M2 (the output terminal of the FTJ element FJA and the input terminal of the FTJ element FJB). Accordingly, the potential of the gate of the transistor M2 (the output terminal of the FTJ element FJA and the input terminal of the FTJ element FJB) becomes the ground potential.

The transistor M1 has been in an on state before Time T16, so that the ground potential supplied by the wiring WDL is supplied to the gate of the transistor M2 (the output terminal of the FTJ element FJA and the input terminal of the FTJ element FJB). Accordingly, the potential of the gate of the transistor M2 (the output terminal of the FTJ element FJA and the input terminal of the FTJ element FJB) becomes the ground potential. Note that even when the potential of the gate of the transistor M2 (the output terminal of the FTJ element FJA and the input terminal of the FTJ element FJB) becomes the ground potential, the polarization directions in the FTJ element FJA and the FTJ element FJB written in the period from Time T14 to Time T16 do not change.

[From Time T17 to Time T18]

In the period from Time T17 to Time T18, the potential of the wiring WWL changes from a high-level potential to a low-level potential. Thus, the low-level potential is input to the gate of the transistor M1, so that the transistor M1 is turned off.

Through the above-described operation in the period from Time T11 to Time T18, data can be written to the memory cell MC in FIG. 1A.

<<Data Reading Operation Example>>

Figure 3A:
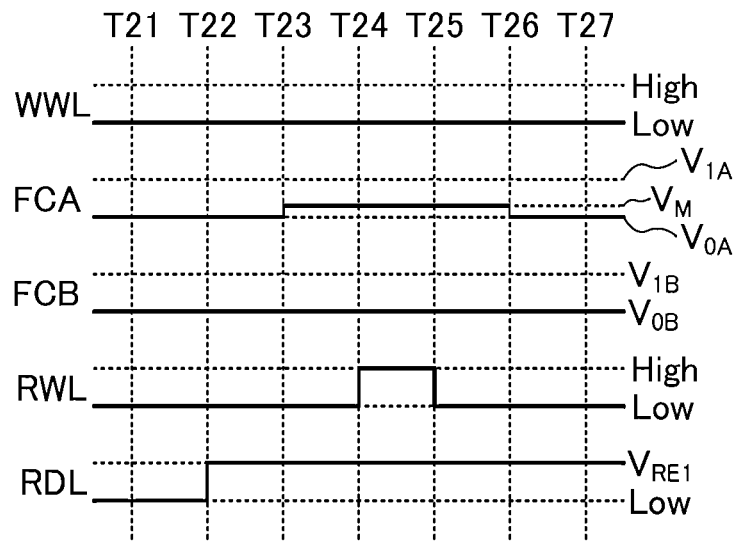
FIG. 3A and FIG. 3B are timing charts each showing an operation example of a memory cell of a semiconductor device.

FIG. 3A is a timing chart showing an example of a data reading operation in the memory cell MC in FIG. 1A. The timing chart in FIG. 3A shows changes in the potentials of the wiring WWL, the wiring FCA, the wiring FCB, the wiring RWL, and the wiring RDL in the period from Time T21 to Time T27 and time around the period.

Note that in this operation example, the potential of the wiring WDL does not change and thus is not shown in the timing chart in FIG. 3A. The potential of the wiring WDL in the period from Time T21 to Time T27 is not particularly limited. Note that in this operation example, a ground potential is supplied, for example.

Although a potential supplied by the wiring VCE can be a high-level potential, a low-level potential, a ground potential, or the like as described above, the low-level potential $V_{SS}$ is used in this operation example.

[From Time T21 to Time T22]

In the period from Time T21 to Time T22, the potentials of the wiring WWL and the wiring RWL are low-level potentials (denoted by Low in FIG. 3A). Thus, the low-level potential is input to the gate of the transistor M1 and the low-level potential is input to the gate of the transistor M3. Thus, the transistor M1 and the transistor M3 are in an off state.

In the period from Time T21 to Time T22, potentials supplied by the wiring FCA and the wiring FCB are $V_{OA}$ and $V_{OB}$, respectively, like the potentials supplied by the wiring FCA and the wiring FCB in the period from Time T11 to Time T12.

[From Time T22 to Time T23]

In the period from Time T22 to Time T23, a potential $V_{RE1}$, which is a constant voltage, is supplied as the potential of the wiring RDL. Note that $V_{RE1}$ is a constant voltage for reading, which is higher than $V_{SS}$.

[From Time T23 to Time T24]

In the period from Time T23 to Time T24, a potential $V_M$ is supplied to the wiring FCA and the potential $V_{OB}$ is supplied to the wiring FCB. Note that $V_M$ is a potential higher than $V_{OA}$ and $V_{OB}$ and lower than $V_{1A}$. When the potential of the wiring FCB is $V_{OB}$, $V_M$ is a potential that does not cause a change in polarization (does not cause a change in the polarization direction) in the FTJ element FJA and the FTJ element FJB.

Here, a voltage of $V_M-V_{OB}$ is applied between the wiring FCA and the wiring FCB, so that voltages obtained by dividing the voltage are applied to the FTJ element FJA and the FTJ element FJB. For example, the following case is considered: the voltage $V_M-V_{OB}$ is applied between the wiring FCA and the wiring FCB and the divided voltages are applied to the FTJ element FJA and the FTJ element FJB at a ratio of a:b (a and b are positive real numbers). When a voltage between the input terminal and the output terminal of the FTJ element FJA is $V_{FJA}$, $V_{FJA}=(V_M-V_{OB})\times a/(a+b)$ is satisfied, and when a voltage between the input terminal and the output terminal of the FTJ element FJB is $V_{FJB}$, $V_{FJB}=(V_M-V_{OB})\times b/(a+b)$ is satisfied. Note that $V_{FJA}$ and $V_{FJB}$ satisfy the relation of $V_M-V_{OB}=V_{FJA}+V_{FJB}$.

In the FTJ element FJA, when the polarization direction is a direction from the input terminal (the wiring FCA) to the output terminal (a positive direction), $V_{FJA}$ is high, and when the polarization direction is a direction from the output terminal to the input terminal (the wiring FCA) (a negative direction), $V_{FJA}$ is low. Similarly, in the FTJ element FJB, when the polarization direction is a direction from the output terminal (the wiring FCB) to the input terminal (a negative direction), $V_{FJB}$ is low, and when the polarization direction is a direction from the input terminal to the output terminal (the wiring FCB) (a positive direction), $V_{FJB}$ is high.

Here, when the potential written to the memory cell MC is $V_0$ in the operation example in the timing chart in FIG. 2, for example, the polarization direction in the FTJ element FJA is a direction from the input terminal (the wiring FCA) to the output terminal (a positive direction) so that $V_{FJA}$ is high and the polarization direction in the FTJ element FJB is a direction from the output terminal (the wiring FCB) to the input terminal (a negative direction) so that $V_{FJB}$ is low. In other words, the ratio a:b of the divided voltages applied to the FTJ element FJA and the FTJ element FJB is a>b. Here, the potential of the gate of the transistor M2 (the output terminal of the FTJ element FJA and the input terminal of the FTJ element FJB) is $V_{HLD0}$.

When the potential written to the memory cell MC is $V_1$ in the operation example in the timing chart in FIG. 2, for example, the polarization direction in the FTJ element FJA is a direction from the output terminal to the input terminal (the wiring FCA) (a negative direction) so that $V_{FJA}$ is low and the polarization direction in the FTJ element FJB is a direction from the input terminal to the output terminal (the wiring FCB) (a positive direction) so that $V_{FJB}$ is high. In other words, the ratio a:b of the divided voltages applied to the FTJ element FJA and the FTJ element FJB is b>a. Here, the potential of the gate of the transistor M2 (the output terminal of the FTJ element FJA and the input terminal of the FTJ element FJB) is $V_{HLD1}$.

The voltage $V_{FJB}$ between the input terminal and the output terminal of the FTJ element FJB is higher in the case where the potential written to the memory cell MC is $V_1$ than in the case where the potential is $V_0$. Thus, when the potential $V_{OB}$ supplied by the wiring FCB is used as a reference, the potential of the gate of the transistor M2 (the output terminal of the FTJ element FJA and the input terminal of the FTJ element FJB) is higher in the case where the potential written to the memory cell MC is $V_1$ than in the case where the potential is $V_0$. That is, $V_{HLD1}>V_{HLD0}$ is satisfied.

[From Time T24 to Time T25]

In the period from Time T24 to Time T25, the potential supplied by the wiring RWL changes from a low-level potential to a high-level potential (denoted by High in FIG.

3A). Thus, the high-level potential is input to the gate of the transistor M3, so that the transistor M3 is turned on.

Note that the potential of the gate of the transistor M2 is $V_{HLD0}$ or $V_{HLD1}$ and the potential of the first terminal of the transistor M2 is $V_{SS}$. Moreover, the transistor M3 is in an on state, so that the constant potential $V_{RE1}$ higher than $V_{SS}$ is input from the wiring RDL to the second terminal of the transistor M2, for example. Here, when the gate-source voltage $V_{HLD0}-V_{SS}$ (or $V_{HLD1}-V_{SS}$) of the transistor M2 is higher than the threshold voltage $V_{th}$ of the transistor M2, a current corresponding to the gate-source voltage $V_{HLD0}-V_{SS}$ (or $V_{HLD1}-V_{SS}$) flows through the transistor M2.

In other words, by turning on the transistor M3, the amount of a current flowing through the wiring RDL is determined in accordance with the potential of the gate of the transistor M2 (the output terminal of the FTJ element FJA and the input terminal of the FTJ element FJB). Specifically, $V_{HLD1} > V_{HLD0}$ is satisfied, so that the current flowing from the transistor M2 to the wiring RDL is higher in the case where the potential supplied from the wiring WDL to the memory cell MC is $V_1$ than in the case where the potential is $V_0$.

Here, by inputting the current flowing through the wiring RDL to a reading circuit (e.g., a current/voltage converter circuit) or the like, data retained in the memory cell MC can be read.

[From Time T25 to Time T26]

In the period from Time T25 to Time T26, the potential of the wiring RWL changes from a high-level potential to a low-level potential. Thus, the low-level potential is input to the gate of the transistor M3, so that the transistor M3 is turned off.

[From Time T26 to Time T27]

In the period from Time T26 to Time T27, the potential $V_{OA}$ is supplied to the wiring FCA and the potential $V_{OB}$ is supplied to the wiring FCB. That is, the potentials supplied by the wiring FCA and the wiring FCB after Time T26 are similar to the potentials supplied by the wiring FCA and the wiring FCB before Time T23.

Through the above-described operation example in the period from Time T21 to Time T27, data written to the memory cell MC in FIG. 1A can be read. When the data is read from the memory cell MC in FIG. 1A, the polarization directions do not change in the FTJ element FJA and the FTJ element FJB; thus, the above-described data reading operation example is not destructive reading. That is, while the data written to the memory cell MC is retained, the data can be read from the memory cell MC.

In the reading operation example in the timing chart in FIG. 3A, although the potential supplied by the wiring VCE is the low-level potential $V_{SS}$, the potential supplied by the wiring VCE may be a high-level potential. A timing chart in FIG. 3B shows an operation example in the case where the potential supplied by the wiring VCE is a high-level potential in the reading operation example in the timing chart in FIG. 3A.

The reading operation example in the timing chart in FIG. 3B will be described below. Note that descriptions of the reading operation in the timing chart in FIG. 3B are omitted for the parts where the content overlaps with that of the reading operation in the timing chart in FIG. 3A. In this operation example, a high-level potential supplied by the wiring VCE is $V_{DD}$.

Figure 3B:
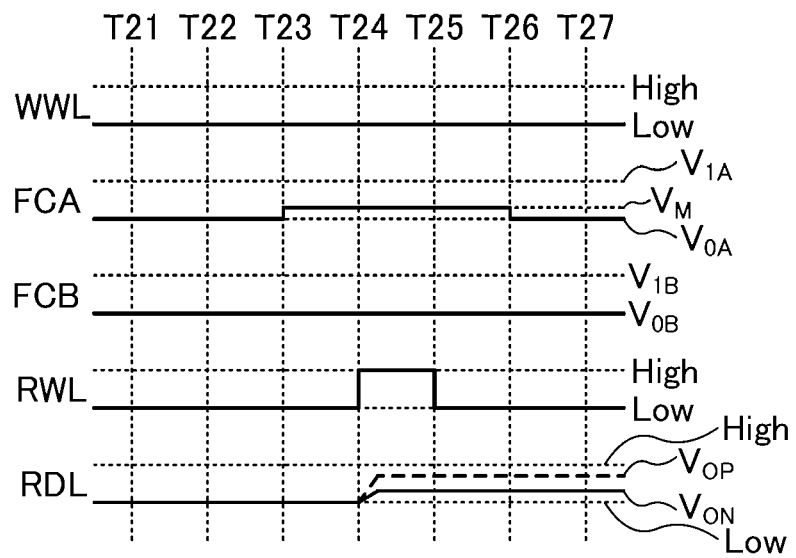

After Time T24 in the timing chart in FIG. 3B, changes in the potential of the wiring RDL are indicated by a solid line and a broken line. The potential change indicated by the solid line corresponds to the case where $V_0$ is input from the wiring WDL to the memory cell MC in the writing operation in the timing chart in FIG. 2, and the potential change indicated by the broken line corresponds to the case where $V_1$ is input from the wiring WDL to the memory cell MC in the writing operation in the timing chart in FIG. 2.

In the period from Time T22 to Time T23 in the timing chart in FIG. 3B, the wiring RDL is precharged to the low-level potential $V_{SS}$. After the wiring RDL is precharged, the wiring RDL is brought into a floating state.

In the period from Time T24 to Time T25, the potential of the wiring RWL changes from a low-level potential to a high-level potential. Thus, the high-level potential is input to the gate of the transistor M3, so that the transistor M3 is turned on.

At this time, the potential of the gate of the transistor M2 is $V_{HLD0}$ or $V_{HLD1}$ and the potential of the first terminal of the transistor M2 is $V_{DD}$. Moreover, the transistor M3 is in an on state, so that the potential used for precharging of the wiring RDL is input to the second terminal of the transistor M2. Here, when the gate-source voltage $V_{HLD0}-V_{SS}$ (or $V_{HLD1}-V_{SS}$) of the transistor M2 is higher than the threshold voltage $V_{th}$ of the transistor M2, the potential of the wiring RDL increases from $V_{SS}$ to a predetermined potential. For example, when the potential of the gate of the transistor M2 (the output terminal of the FTJ element FJA and the input terminal of the FTJ element FJB) is $V_{HLD0}$, the potential of the wiring RDL ideally increases from $V_{SS}$ to $V_{HLD0}-V_{th}$ (denoted by VON in FIG. 3B). In addition, for example, when the potential of the gate of the transistor M2 (the output terminal of the FTJ element FJA and the input terminal of the FTJ element FJB) is $V_{HLD1}$, the potential of the wiring RDL ideally increases from $V_{SS}$ to $V_{HLD1}-V_{th}$ (denoted by $V_{OP}$ in FIG. 3B).

As described above, even in the case where the potential supplied by the wiring VCE is a high-level potential, by setting the potential used for precharging of the wiring RDL to an optimal value, the data retained in the memory cell MC can be read as in the reading operation example in the timing chart in FIG. 3A.

Although the description is made on the example of the operation of reading the data retained in the memory cell MC by obtaining the current flowing through the wiring RDL or the potential of the wiring RDL in the period from Time T24 to Time T25 in each of the timing charts in FIG. 3A and FIG. 3B, the reading operation in the memory cell MC is not limited to the operation example described above.

For example, in the operation example in the timing chart in FIG. 3A, the data retained in the memory cell MC can be read by setting the potential supplied by the wiring VCE to $V_{DD}$, supplying to the wiring RDL a constant voltage for reading lower than $V_{DD}$ after Time T22, and obtaining the amount of a current flowing through the wiring RDL as in the operation in the timing chart in FIG. 3A.

The operations in the timing charts in FIG. 2, FIG. 3A, and FIG. 3B described in this embodiment are examples, and thus the operations can be changed according to circumstances or depending on the case. For example, although in the timing chart in FIG. 2, a high-level potential is supplied to the wiring WWL in the period from Time T12 to Time T17 and $V_0$ or $V_1$ is supplied to the wiring WDL in the period from Time T13 to Time T16, a high-level potential may be supplied to the wiring WWL in the period where $V_0$ or $V_1$ is supplied to the wiring WDL. The period where the potential $V_{1A}$ is supplied to the wiring FCA and the potential $V_{OB}$ is supplied to the wiring FCB and the period where the potential $V_{OA}$ is supplied to the wiring FCA and the potential $V_{1B}$ is supplied to the wiring FCB are provided at any timing in the period where a high-level potential is supplied to the wiring WWL and $V_0$ or $V_1$ is supplied to the wiring WDL. The period where the potential $V_{0A}$ is supplied to the wiring FCA and the potential $V_{1B}$ is supplied to the wiring FCB may precede the period where the potential $V_{1A}$ is supplied to the wiring FCA and the potential $V_{0B}$ is supplied to the wiring FCB.

Structure Example 2

The circuit structure of the memory cell MC included in the memory device that is the semiconductor device of one embodiment of the present invention is not limited to the circuit structure in FIG. 1A. The circuit structure of the memory cell MC included in the memory device may be changed depending on the case or according to circumstances. This structure example describes the memory cell MC in which one of the FTJ element FJA and the FTJ element FJB included in the memory cell MC in FIG. 1A is replaced with another circuit element.

Figure 4A:
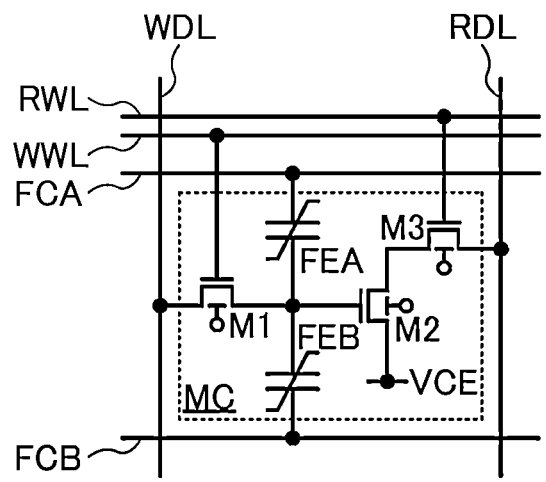
FIG. 4A to FIG. 4C are circuit diagrams each showing a structure example of a memory cell of a semiconductor device.

As illustrated in FIG. 4A, the memory cell MC may have a structure in which the FTJ element FJA is replaced with a ferroelectric capacitor FEA and the FTJ element FJB is replaced with a ferroelectric capacitor FEB, for example.

Note that in the drawings of this specification, the circuit symbol of a ferroelectric capacitor (e.g., the ferroelectric capacitor FEA, the ferroelectric capacitor FEB, or the like) is a circuit symbol of a capacitor with a diagonal line as in FIG. 4A. As another circuit symbol, a circuit symbol of a capacitor with a plurality of diagonal lines between two parallel lines may be used as in FIG. 4B.

Figure 4B:
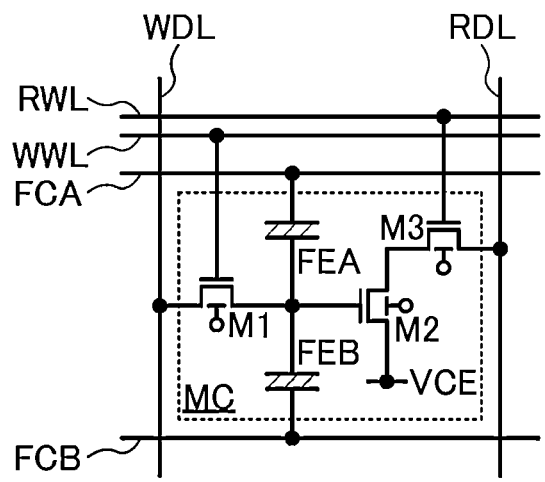

As illustrated in the memory cells MC in FIG. 4A and FIG. 4B, even when the FTJ element FJA and the FTJ element FJB of the memory cell MC in FIG. 1A are replaced with the ferroelectric capacitor FEA and the ferroelectric capacitor FEB, respectively, a voltage applied between the wiring FCA and the wiring FCB can be divided by the ferroelectric capacitor FEA and the ferroelectric capacitor FEB as in the memory cell MC in FIG. 1A. In the memory cell MC in FIG. 4A (FIG. 4B), the ratio of the divided voltages of the ferroelectric capacitor FEA and the ferroelectric capacitor FEB is determined in accordance with data written to the memory cell MC in FIG. 4A (FIG. 4B) as in the memory cell MC in FIG. 1A; therefore, in some cases, data can be written to the memory cell MC and the retained data can be read without being broken.

Figure 4C:
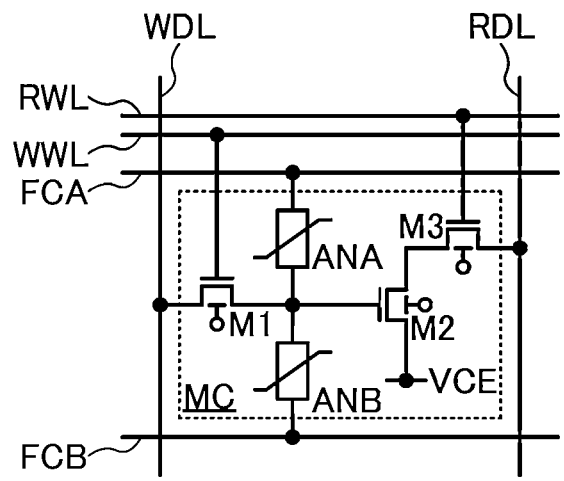

Although FIG. 4A and FIG. 4B each show the example in which the FTJ element FJA and the FTJ element FJB of the memory cell MC in FIG. 1A are replaced with the ferroelectric capacitor FEA and the ferroelectric capacitor FEB, respectively, the FTJ element FJA and the FTJ element FJB of the memory cell MC in FIG. 1A may each be replaced with a circuit element other than a ferroelectric capacitor. For example, as illustrated in FIG. 4C, the FTJ element FJA and the FTJ element FJB of the memory cell MC in FIG. 1A may be respectively replaced with a circuit element ANA and a circuit element ANB that can change a resistance value. Specifically, an input terminal of the circuit element ANA is electrically connected to the wiring FCA; an output terminal of the circuit element ANA is electrically connected to the second terminal of the transistor M1, the gate of the transistor M2, and an input terminal of the circuit element ANB; and an output terminal of the circuit element ANB is electrically connected to the wiring FCB. Examples of the circuit element ANA and the circuit element ANB include a variable resistor used for ReRAM (Resistive Random Access Memory) or the like, an MTJ (Magnetic Tunnel Junction or Magnetic Transportation Junction) element used for MRAM (Magnetoresistive Random Access Memory) or the like, and a phase-change memory (PCM) element.

As illustrated in the memory cell MC in FIG. 4C, even when the FTJ element FJA and the FTJ element FJB of the memory cell MC in FIG. 1A are replaced with the circuit element ANA and the circuit element ANB, respectively, a voltage applied between the wiring FCA and the wiring FCB can be divided by the circuit element ANA and the circuit element ANB as in the memory cell MC in FIG. 1A. In the memory cell MC in FIG. 4C, the ratio of the divided voltages of the circuit element ANA and the circuit element ANB is determined in accordance with data written to the memory cell MC in FIG. 4C as in the memory cell MC in FIG. 1A; therefore, in some cases, data can be written to the memory cell MC and the retained data can be read without being broken.

Figure 5A:
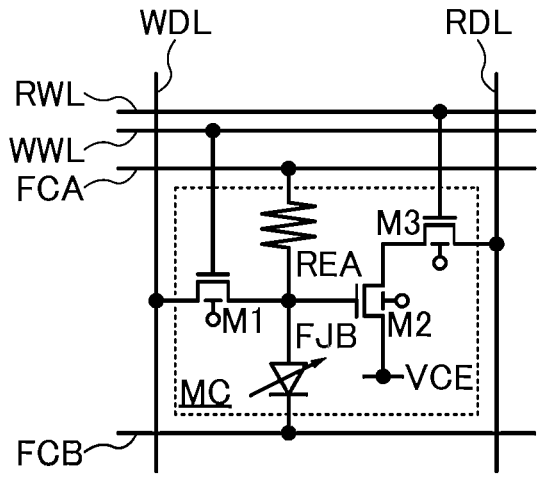
FIG. 5A to FIG. 5F are circuit diagrams each showing a structure example of a memory cell of a semiconductor device.

Alternatively, as illustrated in FIG. 5A, the memory cell MC may have a structure in which the FTJ element FJA of the memory cell MC in FIG. 1A is replaced with a resistor REA, for example. Alternatively, as illustrated in FIG. 5B, a structure may be employed in which the FTJ element FJA is not replaced with the resistor REA and the FTJ element FJB is replaced with a resistor REB.

Even when one of the FTJ element FJA and the FTJ element FJB of the memory cell MC in FIG. 1A is replaced with a resistor, the other of the FTJ element FJA and the FTJ element FJB can retain data written to the memory cell MC. According to the above-described writing operation example in the timing chart in FIG. 2, the direction of polarization caused in the other of the FTJ element FJA and the FTJ element FJB can be determined in accordance with the data ($V_0$ or $V_1$). Thus, even when the circuit structure of the memory cell MC in FIG. 5A or FIG. 5B is employed, the retained data can be read without being broken.

Figure 5B:
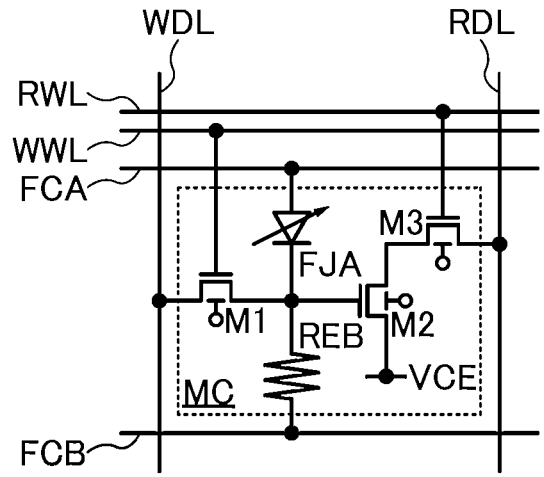
Figure 5C:
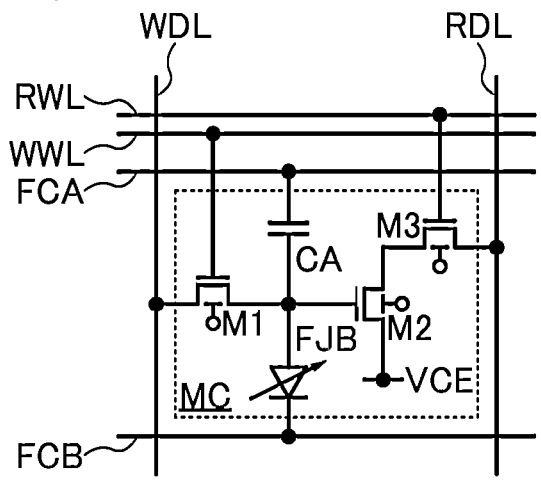
Figure 5D:
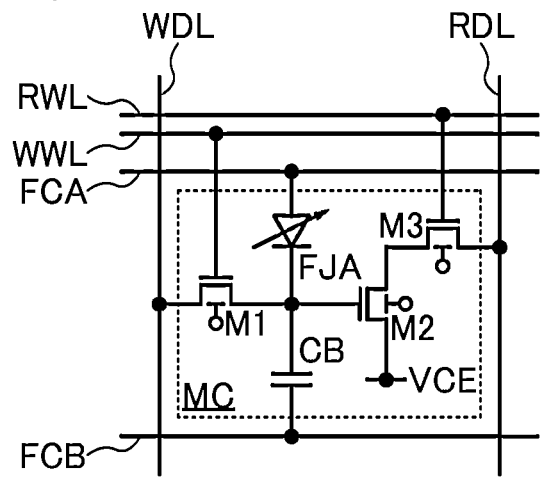

Alternatively, as illustrated in FIG. 5C, the memory cell MC may have a structure in which the FTJ element FJA of the memory cell MC in FIG. 1A is replaced with a capacitor CA, for example. Alternatively, as illustrated in FIG. 5D, a structure may be employed in which the FTJ element FJA is not replaced with the capacitor CA and the FTJ element FJB is replaced with a capacitor CB.

Even when one of the FTJ element FJA and the FTJ element FJB of the memory cell MC in FIG. 1A is replaced with the capacitor CA, the other of the FTJ element FJA and the FTJ element FJB can retain data written to the memory cell MC as in FIG. 5A and FIG. 5B. Even when the memory cell MC illustrated in FIG. 5C or FIG. 5D is used, the retained data can be read without being broken as in FIG. 5A and FIG. 5B.

Figure 5E:
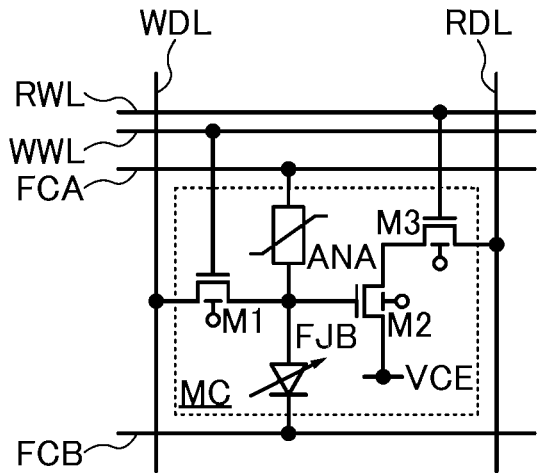
Figure 5F:
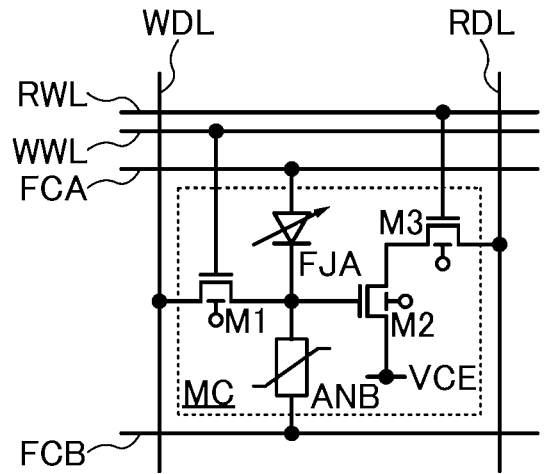

Alternatively, as illustrated in FIG. 5E, the memory cell MC may have a structure in which the FTJ element FJA of the memory cell MC in FIG. 1A is replaced with the circuit element ANA described with reference to FIG. 4C, for example. Alternatively, as illustrated in FIG. 5F, a structure may be employed in which the FTJ element FJA is not replaced with the circuit element ANA and the FTJ element FJB is replaced with the circuit element ANB described with reference to FIG. 4C. As each of the circuit element ANA and the circuit element ANB respectively illustrated in FIG. 5E and FIG. 5F, a variable resistor used for ReRAM or the like, an MTJ element used for MRAM or the like, a phase-change memory element, or a ferroelectric capacitor can be used, for example.

When one of the FTJ element FJA and the FTJ element FJB of the memory cell MC in FIG. 1A is replaced with the circuit element ANA (the circuit element ANB), the other of the FTJ element FJA and the FTJ element FJB can retain data written to the memory cell MC as in FIG. 5A and FIG. 5B. Even when the memory cell MC illustrated in FIG. 5E or FIG. 5F is used, the retained data can be read without being broken as in FIG. 5A and FIG. 5B.

Figure 6A:
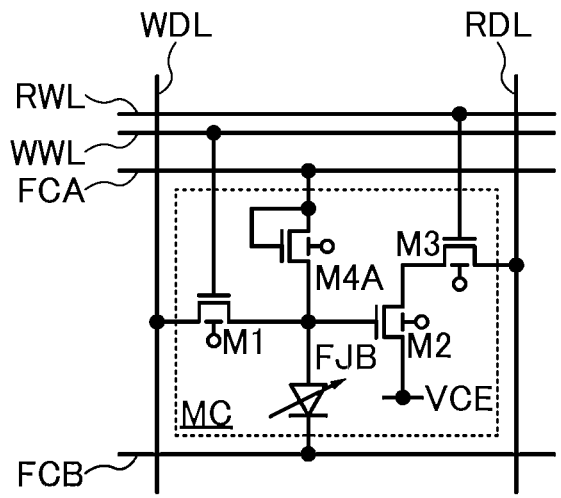
FIG. 6A to FIG. 6F are circuit diagrams each showing a structure example of a memory cell of a semiconductor device.
Figure 6B:
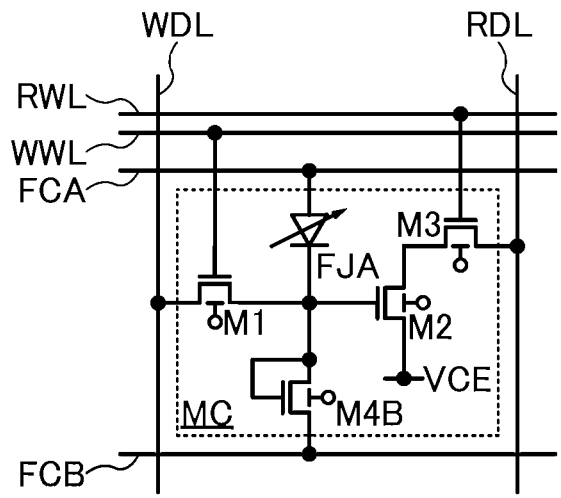
Figure 6C:
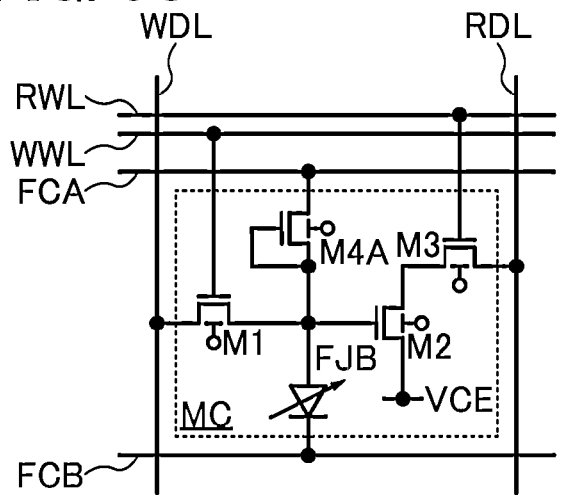

Alternatively, as illustrated in FIG. 6A and FIG. 6C, the memory cell MC may have a structure in which the FTJ element FJA is replaced with a transistor M4A, for example.

Specifically, in the memory cell MC in FIG. 6A, a first terminal of the transistor M4A is electrically connected to the wiring FCA and a gate of the transistor M4A and a second terminal of the transistor M4A is electrically connected to the second terminal of the transistor M1, the gate of the transistor M2, and the input terminal of the FTJ element FJB. In the memory cell MC in FIG. 6C, the first terminal of the transistor M4A is electrically connected to the wiring FCA, the second terminal of the transistor M4A is electrically connected to the gate of the transistor M4A, the second terminal of the transistor M1, the gate of the transistor M2, and the input terminal of the FTJ element FJB.

Figure 6D:
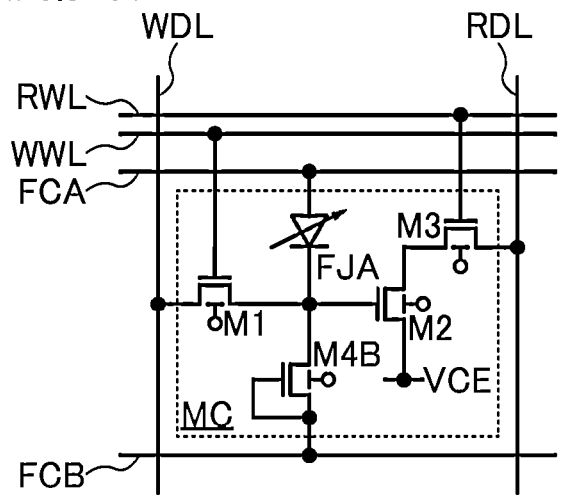

Alternatively, as illustrated in FIG. 6B and FIG. 6D, a structure may be employed in which the FTJ element FJA is not replaced with the transistor M4A and the FTJ element FJB is replaced with a transistor M4B, for example.

Specifically, in the memory cell MC in FIG. 6B, a first terminal of the transistor M4B is electrically connected to a gate of the transistor M4B, the second terminal of the transistor M1, the gate of the transistor M2, and the output terminal of the FTJ element FJA and a second terminal of the transistor M4B is electrically connected to the wiring FCB. In the memory cell MC in FIG. 6D, the first terminal of the transistor M4B is electrically connected to the second terminal of the transistor M1, the gate of the transistor M2, and the output terminal of the FTJ element FJA and the second terminal of the transistor M4B is electrically connected to the gate of the transistor M4B and the wiring FCB.

In FIG. 6A and FIG. 6C, the transistor M4A has a so-called diode-connected structure. In FIG. 6B and FIG. 6D, the transistor M4B also has a diode-connected structure. As illustrated in FIG. 6A to FIG. 6D, even when one of the FTJ element FJA and the FTJ element FJB is replaced with a circuit element having rectifying characteristics, such as a diode, the other of the FTJ element FJA and the FTJ element FJB can retain data written to the memory cell MC. Even when the memory cell MC illustrated in any of FIG. 6A to FIG. 6D is used, the retained data can be read without being broken as in FIG. 5A to FIG. 5D.

Figure 6E:
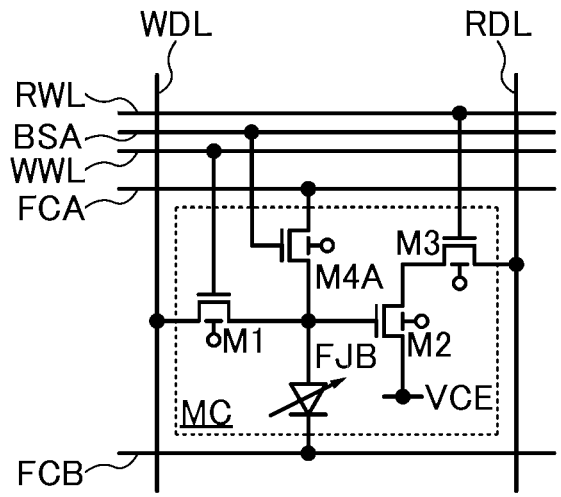

Although FIG. 6A and FIG. 6C each show the structure in which the transistor M4A has a diode-connected structure, as illustrated in FIG. 6E, the gate of the transistor M4A may be electrically connected to not the first terminal and the second terminal of the transistor M4A but a wiring BSA that supplies a constant voltage, for example. The wiring BSA functions as a wiring that supplies a bias voltage to the gate of the transistor M4A as a constant voltage. When the wiring BSA supplies a bias voltage to the gate of the transistor M4A, a current corresponding to the potentials of the first terminal, the second terminal, and the gate of the transistor M4A flows between the first terminal and the second terminal of the transistor M4A. The voltage between the first terminal and the second terminal of the transistor M4A and the voltage between the input terminal and the output terminal of the FTJ element FJB are voltages obtained by dividing the voltage between the wiring FCA and the wiring FCB; thus, when the polarization direction in the FTJ element FJB is determined, the voltage between the input terminal and the output terminal of the FTJ element FJB is determined and the voltage between the first terminal and the second terminal of the transistor M4A is also determined. Therefore, the potential of the gate of the transistor M2 is determined in accordance with data written to the memory cell MC, so that even when the memory cell MC illustrated in FIG. 6E is used, data can be written and the data can be read without being broken as in FIG. 5A to FIG. 5D and FIG. 6A to FIG. 6D.

Figure 6F:
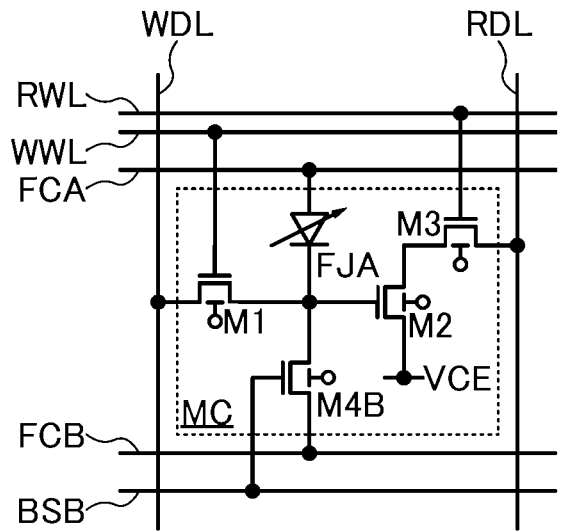

Although FIG. 6B and FIG. 6D each show the structure in which the transistor M4B has a diode-connected structure, as illustrated in FIG. 6F, the gate of the transistor M4B may be electrically connected to not the first terminal and the second terminal of the transistor M4B but a wiring BSB that supplies a constant voltage, for example. That is, in the memory cell MC in FIG. 6F, the voltage between the input terminal and the output terminal of the FTJ element FJA and the voltage between the first terminal and the second terminal of the transistor M4B are determined in accordance with written data as in the memory cell MC in FIG. 6E. In addition, as in the memory cell in FIG. 6E, the retained data can be read without being broken.

Structure Example 3

This structure example describes a memory cell that is different from the memory cell MC in FIG. 1A and can be included in a memory device that is a semiconductor device of one embodiment of the present invention.

Figure 7:
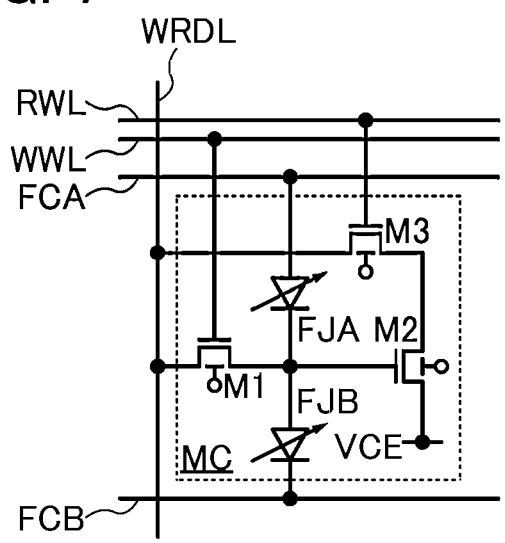
FIG. 7 is a circuit diagram showing a structure example of a memory cell of a semiconductor device.

The memory cell MC illustrated in FIG. 7 is a modification example of the memory cell MC in FIG. 1A and has a structure in which the wiring WDL and the wiring RDL are combined into one wiring WRDL and the second terminal of the transistor M3 is electrically connected to the wiring WRDL.

In other words, the memory cell MC in FIG. 7 has a circuit structure of the case where a write data line and a read data line are combined into one wiring. Thus, the wiring WRDL also functions as a wiring for transmitting data to be written to the memory cell MC.

For an example of an operation of writing data to the memory cell MC in FIG. 7, the timing chart in FIG. 2 is referred to. In particular, a potential supplied to the wiring WRDL is similar to the potential supplied to the wiring WDL shown in the timing chart in FIG. 2. For an example of an operation of reading data from the memory cell MC in FIG. 7, the timing chart in FIG. 3A or FIG. 3B is referred to. In particular, a potential supplied to the wiring WRDL is similar to the potential supplied to the wiring RDL shown in the timing chart in FIG. 3A or FIG. 3B.

Next, a memory cell is described that is different from the memory cells MC in FIG. 1A, FIG. 1B, and FIG. 7 and can be included in a memory device that is a semiconductor device of one embodiment of the present invention.

Figure 8A:
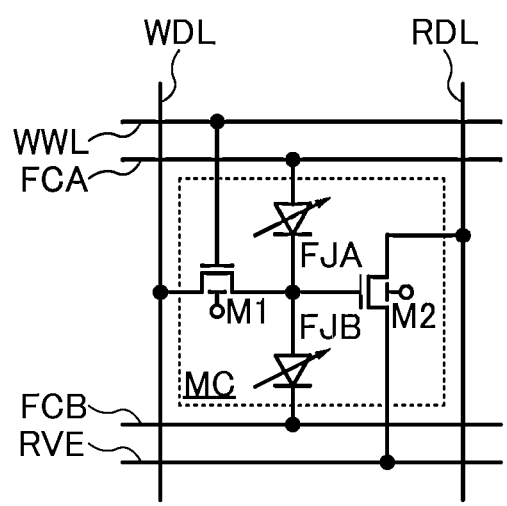
FIG. 8A and FIG. 8B are circuit diagrams each showing a structure example of a memory cell of a semiconductor device.

The memory cell MC illustrated in FIG. 8A is a modification example of the memory cell MC in FIG. 1A and has a structure in which the transistor M3 is not provided. Since the transistor M3 is not provided, the wiring RWL is also not provided in FIG. 8A. In the memory cell MC in FIG. 8A, the first terminal of the transistor M2 is electrically connected to not the wiring VCE but a wiring RVE. Note that the wiring RVE functions as a wiring that supplies a variable potential, for example. Specifically, the wiring RVE can supply potentials such as a high-level potential (e.g., $V_{DD}$) and a low-level potential (e.g., $V_{SS}$) according to circumstances.

The memory cell MC in FIG. 1A has a structure in which a conducting state or a non-conducting state is established between the second terminal of the transistor M2 and the wiring RDL by switching the on state and the off state of the transistor M3, and the memory cell MC in FIG. 8A has a structure in which a conducting state or a non-conducting state is established between the second terminal of the transistor M2 and the wiring RDL by changing a potential supplied to the wiring RVE.

The operation example in the timing chart in FIG. 2 is referred to for changes in the potentials of the wiring WWL, the wiring WDL, the wiring FCA, and the wiring FCB in the case of writing data to the memory cell MC in FIG. 8A. At this time, by supplying potentials that are equal to each other (e.g., low-level potentials or ground potentials) to the wiring RVE and the wiring RDL, the transistor M2 can be turned off regardless of the potential of the gate of the transistor M2. Also in the case where data is not read from the memory cell MC (when data is retained in the memory cell MC), by supplying potentials that are equal to each other to the wiring RVE and the wiring RDL, the transistor M2 is turned off.

Figure 9A:
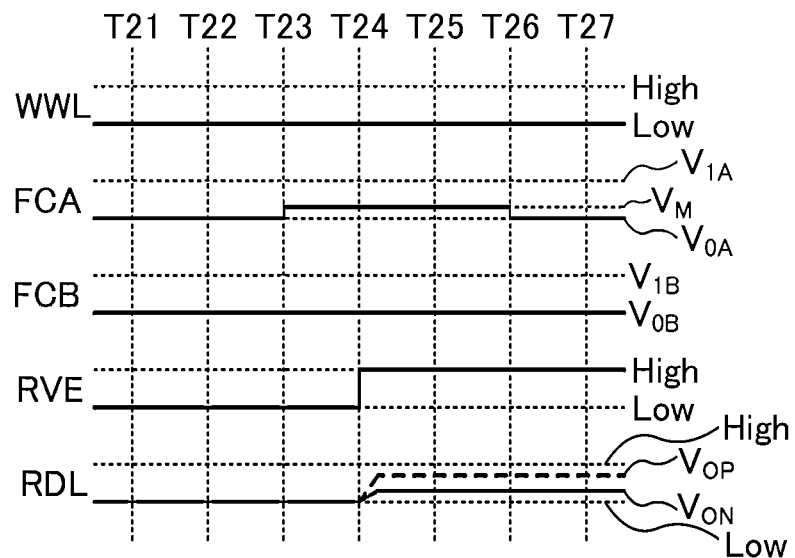
FIG. 9A and FIG. 9B are timing charts each showing an operation example of a memory cell of a semiconductor device.

In the case where data is read from the memory cell MC in FIG. 8A, an operation in a timing chart shown in FIG. 9A is performed, for example. Note that changes in the potentials of the wiring WWL, the wiring WDL, the wiring FCA, and the wiring FCB are similar to those in the operation examples in the timing charts in FIG. 3A and FIG. 3B, so that the description of the timing charts in FIG. 3A and FIG. 3B is referred to for the changes in the potentials of these wirings.

In the period from Time T21 to Time T24 in the timing chart in FIG. 9A, the potential of the wiring RVE changes in a manner similar to that of the wiring RDL. In the period from Time T21 to Time T24 in the timing chart in FIG. 9A, the potentials of the wiring RVE and the wiring RDL are low-level potentials. Accordingly, in the period from Time T21 to Time T24, the voltage between the first terminal and the second terminal of the transistor M2 is 0 V, so that the transistor M2 can be turned off.

In the period from Time T22 to Time T23 in the timing chart in FIG. 9A, the wiring RDL is brought into a floating state.

After that, in the period from Time T24 to Time T25 in the timing chart in FIG. 9A, by changing the potential of the wiring RVE from a low-level potential (denoted by Low in FIG. 9) to a high-level potential (denoted by High in FIG. 9), the transistor M2 is temporarily turned on, and as in the period from Time T24 to Time T25 in the timing chart in FIG. 3A, the high-level potential of the wiring RDL can be changed to a potential corresponding to the potential of the gate of the transistor M2. After that, by obtaining the potential of the wiring RDL by a reading circuit or the like, the data retained in the memory cell MC in FIG. 8A can be read without being broken.

Next, an example of an operation of reading data from the memory cell MC in FIG. 8A, which is different from that in FIG. 9A, will be described. The operation example shown in the timing chart in FIG. 9B is different from that in the timing chart in FIG. 9A in a change in a voltage supplied to the wiring RDL.

Figure 9B:
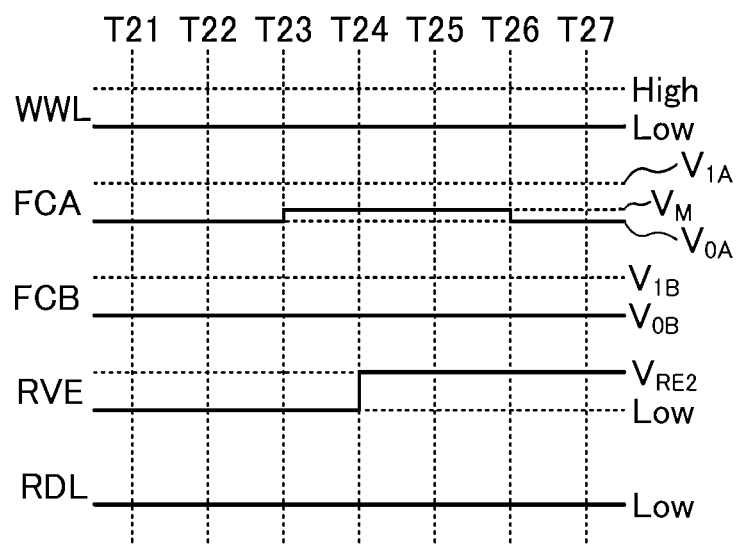

In the period from Time T21 to Time T24 in the timing chart in FIG. 9B, the potential of the wiring RVE changes in a manner similar to that of the wiring RDL. In the period from Time T21 to Time T24 in the timing chart in FIG. 9B, the potentials of the wiring RVE and the wiring RDL are low-level potentials. Accordingly, in the period from Time T21 to Time T24, the voltage between the first terminal and the second terminal of the transistor M2 is 0 V, so that the transistor M2 can be turned off.

Unlike in FIG. 9A, the wiring RDL does not need to be brought into a floating state in the period from Time T22 to Time T23 in the timing chart in FIG. 9B.

After that, in the period from Time T24 to Time T25 in the timing chart in FIG. 9B, by changing the potential of the wiring RVE to a constant voltage $V_{RE2}$ for reading higher than a low-level potential (denoted by Low in FIG. 9B), the transistor M2 is turned on, and a current corresponding to the potential of the gate of the transistor M2 flows between the wiring RVE and the wiring RDL through the transistor M2. After that, by obtaining the amount of a current flowing through the wiring RDL by a current reading circuit or the like, the data retained in the memory cell MC in FIG. 8A can be read without being broken.

The circuit structure of the memory cell MC relating to the semiconductor device of one embodiment of the present invention is not limited to the circuit structure of the memory cell MC in FIG. 8A. Depending on the case or according to circumstances, the circuit structure of the memory cell MC relating to the semiconductor device of one embodiment of the present invention may be a structure in which the memory cell MC in FIG. 8A is changed.

Figure 8B:
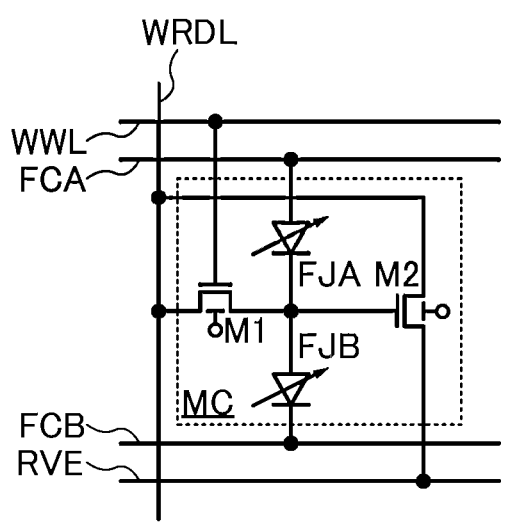

For example, the circuit structure of the memory cell MC in FIG. 8A may be changed to a circuit structure of the memory cell MC illustrated in FIG. 8B. Like the memory cell MC illustrated in FIG. 7, the memory cell MC in FIG. 8B has a structure in which the wiring WDL and the wiring RDL illustrated in FIG. 8A are combined into one wiring WRDL.

Like the wiring WRDL electrically connected to the memory cell MC in FIG. 7, the wiring WRDL functions as a wiring for transmitting data to be written to the memory cell MC and functions as a wiring for supplying a precharge potential for reading data from the memory cell MC, for example.

For an example of an operation of writing data to the memory cell MC in FIG. 8B, the description of the example of the operation of writing data to the memory cell MC in FIG. 7 is referred to. In particular, a potential supplied to the wiring WRDL is similar to the potential supplied to the wiring WDL shown in the timing chart in FIG. 2. For an example of an operation of reading data to the memory cell MC in FIG. 7, the timing chart in FIG. 9A or FIG. 9B is referred to. In particular, a potential supplied to the wiring WRDL is similar to the potential supplied to the wiring RDL shown in the timing chart in FIG. 3A or FIG. 3B.

By applying the memory cell MC to the semiconductor device described in this embodiment, a semiconductor device that does not require data rewriting (a semiconductor device that performs non-destructive reading) can be formed. Moreover, by applying the memory cell MC to the semiconductor device, data rewriting is not required, so that power consumption required for rewriting can be reduced. Furthermore, by applying the memory cell MC to the semiconductor device, a circuit that performs data rewriting does not need to be provided, so that the circuit area of the semiconductor device can be reduced.

Note that this embodiment can be combined with any of the other embodiments in this specification as appropriate.

Embodiment 2

In this embodiment, a memory device that can include the memory cell MC described in the above embodiment will be described.

<Structure Example of Memory Device>

Figure 10:
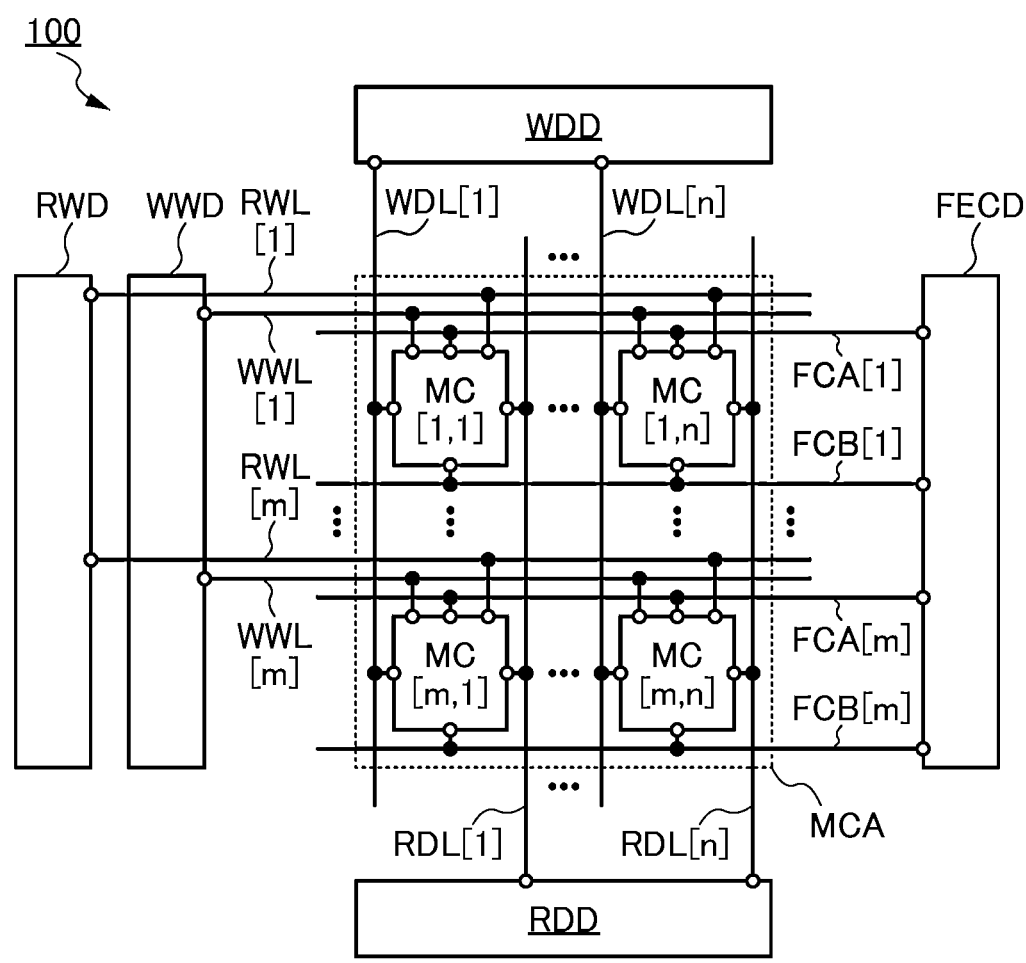
FIG. 10 is a block diagram showing a structure example of a memory device.

FIG. 10 shows an example of a circuit structure of the memory device. A memory device 100 includes a memory cell array MCA, a circuit WDD, a circuit RDD, a circuit WWD, a circuit RWD, and a circuit FECD. As an example, the memory cell MC that can be used for the memory device 100 in FIG. 10 is the memory cell MC in FIG. 1A (FIG. 1B).

The memory cell array MCA includes a plurality of memory cells MC. In the memory cell array MCA, the plurality of memory cells MC are arranged in a matrix of m rows and n columns (m and n are each an integer greater than or equal to 1). The memory cell MC which is positioned at an i-th column and a j-th row (i is an integer greater than or equal to 1 and less than or equal to m, and j is an integer greater than or equal to 1 and less than or equal to n) is represented as a memory cell MC[i,j] in FIG. 10, for example (the memory cell MC[i,j] is not illustrated).

In the memory cell array MCA of the memory device 100, a wiring WDL[1] to a wiring WDL[n] and a wiring RDL[1] to a wiring RDL[n] extend in the column direction. Note that [1] added to each of the wiring WDL and the wiring RDL represents a wiring in the first column, and [n] added to each of the wiring WDL and the wiring RDL represents a wiring in the n-th column. A wiring RWL[1] to a wiring RWL[m], a wiring WWL[1] to a wiring WWL[m], a wiring FCA[1] to a wiring FCA[m], and a wiring FCB[1] to a wiring FCB[m] extend in the row direction. Note that [1] added to each of the wiring RWL, the wiring WWL, the wiring FCA, and the wiring FCB represents a wiring in the first row, and [m] added to each of the wiring RWL, the wiring WWL, the wiring FCA, and the wiring FCB represents a wiring in the m-th row.

The wiring WDL[1] to the wiring WDL[n] each correspond to the wiring WDL of the memory cell MC in FIG. 1A (FIG. 1B), and the wiring RDL[1] to the wiring RDL[n] each correspond to the wiring RDL of the memory cell MC in FIG. 1A (FIG. 1B). The wiring RWL [1] to the wiring RWL[m] each correspond to the wiring RWL of the memory cell MC in FIG. 1A (FIG. 1B), the wiring WWL[1] to the wiring WWL[m] each correspond to the wiring WWL of the memory cell MC in FIG. 1A (FIG. 1B), the wiring FCA[1] to the wiring FCA[m] each correspond to the wiring FCA of the memory cell MC in FIG. 1A (FIG. 1B), and the wiring FCB[1] to the wiring FCB[m] each correspond to the wiring FCB of the memory cell MC in FIG. 1A (FIG. 1B).

The circuit WDD is electrically connected to the wiring WDL[1] to the wiring WDL[n]. The circuit RWD is electrically connected to the wiring RWL[1] to the wiring RWL[m]. The circuit WWD is electrically connected to the wiring WWL[1] to the wiring WWL[m]. The circuit FECD is electrically connected to the wiring FCA[1] to the wiring FCA[m] and the wiring FCB[1] to the wiring FCB[m]. The circuit RDD is electrically connected to the wiring RDL[1] to the wiring RDL[n].

The circuit WWD functions as a write word line driver circuit, for example. For example, the circuit WWD transmits a selection signal to one wiring among the wiring WWL[1] to the wiring WWL[m] and transmits non-selection signals to the other wirings, whereby a plurality of memory cells MC subjected to a wiring operation can be selected in the memory cell array MCA. Specifically, in the case of the memory cell MC in FIG. 1A, for example, the selection signal is a high-level potential and the non-selection signal is a low-level potential. In the memory cell MC in FIG. 1A, when the wiring WWL is supplied with a high-level potential, the transistor M1 is in an on state; thus, data for writing can be transmitted from the wiring WDL to the memory cell MC. In contrast, in the memory cell MC in FIG. 1A (FIG. 1B), when the wiring WWL is supplied with a low-level potential, the transistor M1 is in an off state; thus, even when data for writing is transmitted from the wiring WDL to another memory cell MC, the data is not written to the memory cell MC supplied with the low-level potential from the wiring WWL.

The circuit RWD functions as a read word line driver circuit, for example. For example, the circuit RDD transmits a selection signal to one wiring among the wiring RWL[1] to the wiring RWL[m] and transmits non-selection signals to the other wirings, whereby a plurality of memory cells MC subjected to a reading operation can be selected in the memory cell array MCA.

Specifically, in the case of the memory cell MC in FIG. 1A, for example, the selection signal is a high-level potential and the non-selection signal is a low-level potential. In the memory cell MC in FIG. 1A, when the wiring RWL is supplied with a high-level potential, the transistor M1 is in an on state; thus, data retained in the memory cell MC can be transmitted from the memory cell MC to the wiring RDL. In contrast, in the memory cell MC in FIG. 1A, when the wiring RWL is supplied with a low-level potential, the transistor M3 is in an off state; thus, the data retained in the memory cell MC is not transmitted from the memory cell MC to the wiring RDL.

The circuit FECD has a function of supplying a constant potential to each of the wiring FCA and the wiring FCB, for example. Specifically, for example, the circuit FECD supplies a constant potential to each of the wiring FCA and the wiring FCB at the time of writing data to the memory cell MC, whereby polarization can be caused (the polarization direction can be changed) in each of the FTJ elements FJA and the FTJ elements FJB included in the plurality of memory cells MC. Alternatively, the circuit FECD supplies a constant potential to each of the wiring FCA and the wiring FCB at the time of reading data from the memory cell MC, whereby divided voltages that correspond to a difference between the potentials of the wiring FCA and the wiring FCB can be applied between the input terminal and the output terminal of the FTJ element FJA and between the input terminal and the output terminal of the FTJ element FJB.

The circuit WDD functions as a write data line driver circuit, for example. For example, the circuit WDD transmits data for writing (e.g., voltage) to each of the wiring WDL[1] to the wiring WDL[n], whereby the data for writing can be written to each of the plurality of memory cells MC arranged in a predetermined row selected by the circuit WWD.

The circuit RDD functions as a reading circuit, for example. For example, the circuit RDD obtains, from each of the wiring RDL[1] to the wiring RDL[n], data (e.g., voltage or current) output from the plurality of memory cells MC arranged in a predetermined row selected by the circuit RWD, whereby the data can be read. The circuit WDD includes, for example, one or more selected from a pre-charge circuit, a sense amplifier circuit, a current-voltage converter circuit, and the like.

<Operation Examples of Memory Device>

Next, operation examples of the memory device 100 are described.

Writing Operation Example 1

Figure 11:
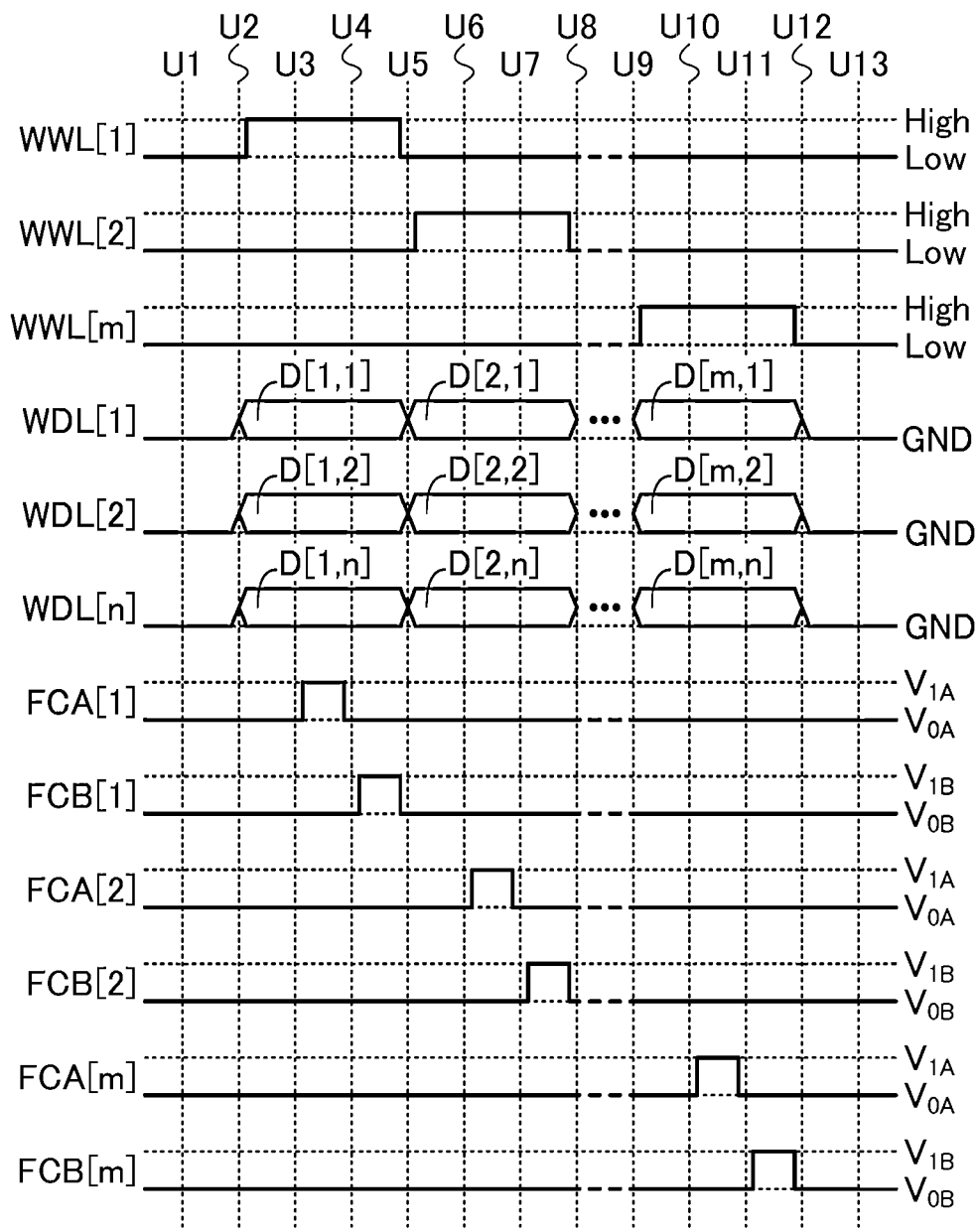
FIG. 11 is a timing chart showing an operation example of a memory device.

FIG. 11 is a timing chart showing an example of an operation of writing data to the memory cell MC of the memory device 100. Note that the timing chart in FIG. 2 described in the above embodiment shows an operation example in one memory cell MC, and the timing chart in FIG. 11 shows an example of an operation of writing data to the plurality of memory cells MC included in the memory cell array MCA.

The timing chart in FIG. 11 shows changes in the potentials of the wiring WWL[1], the wiring WWL[2], the wiring WWL[m], the wiring WDL[1], the wiring WDL[2], the wiring WDL[n], the wiring FCA[1], the wiring FCB[1], the wiring FCA[2], the wiring FCB[2], the wiring FCA[m], and the wiring FCB[m] in the period from Time U1 to Time U13 and time around the period.

In the period from Time U1 to Time U2, the circuit WWD supplies low-level potentials (denoted by Low in FIG. 11) as initial potentials to the wiring WWL[1] to the wiring WWL[m], for example. Thus, the low-level potentials are supplied to the gates of the transistors M1 of all of the memory cells MC included in the memory cell array MCA, so that the transistors M1 are turned off.

In the period from Time U1 to Time U2, the circuit WDD does not transmit data for writing to the wiring WDL[1] to the wiring WDL[n]. Therefore, in the period from Time U1 to Time U2, the circuit WDD supplies ground potentials to the wiring WDL[1] to the wiring WDL[n], for example.

In the period from Time U1 to Time U2, the circuit FECD supplies the potentials $V_{OA}$ to the wiring FCA[1] to the wiring FCA[m] and supplies the potentials $V_{OB}$ to the wiring FCB[1] to the wiring FCB[m]. For the potential $V_{OA}$ and the potential $V_{OB}$, the description of the timing chart in FIG. 2 is referred to.

In the period from Time U2 to Time U5, the circuit WWD supplies a high-level potential (denoted by High in FIG. 11) to the wiring WWL[1] and supplies low-level potentials to the wiring WWL[2] to the wiring WWL[m]. Thus, the high-level potential is supplied to each of the gates of the transistors M1 included in the memory cell MC[1,1] to the memory cell MC[1,n] arranged in the first row in the memory cell array MCA, so that the transistors M1 included in the memory cell MC[1,1] to the memory cell MC[1,n] are turned on. The low-level potentials are supplied to the gates of the transistors M1 included in the memory cell MC[2,1] to the memory cell MC[m,n] arranged in the second row to the m-th row in the memory cell array MCA, so that the transistors M1 included in the memory cell MC[2,1] to the memory cell MC[m,n] are turned off. That is, the circuit WWD supplies a high-level potential to the wiring WWL[1] and supplies low-level potentials to the wiring WWL[2] to the wiring WWL[m], so that the memory cells MC arranged in the first row of the memory cell array MCA can be selected as targets for writing.

In the period from Time U2 to Time U5, the circuit WDD supplies D[1,1] to D[1,n] as data for writing to the wiring WDL[1] to the wiring WDL[n], respectively, for example. The memory cells MC arranged in the first row of the memory cell array MCA are selected as targets for writing by the circuit WWD, so that potentials corresponding to D[1,1] to D[1,n] are respectively supplied to the gates of the transistor M2 of the memory cell MC[1,1] to the memory cell MC[1,n].

In the period from Time U3 to Time U4, the circuit FECD supplies the potential $V_{1A}$ to the wiring FCA[1] and supplies the potential $V_{OB}$ to the wiring FCB[1]. Note that the circuit FECD supplies the potentials $V_{OA}$ to the wiring FCA[2] to the wiring FCA[m] and supplies the potentials $V_{OB}$ to the wiring FCB[2] to the wiring FCB[m].

Furthermore, in the period from Time U4 to Time U5, the circuit FECD supplies the potential $V_{OA}$ to the wiring FCA[1] and supplies the potential $V_{1B}$ to the wiring FCB[1]. Note that the circuit FECD continuously supplies the potentials $V_{OA}$ to the wiring FCA[2] to the wiring FCA[m] and supplies the potentials $V_{OB}$ to the wiring FCB[2] to the wiring FCB[m].

For the potential $V_{1A}$ and the potential $V_{1B}$, the description of the timing chart in FIG. 2 is referred to.

By the operation in the period from Time U2 to Time U5, the direction of polarization caused in each of the FTJ elements FJA and the FTJ elements FJB included in the memory cell MC[1,1] to the memory cell MC[1,n] in the first row of the memory cell array MCA is determined in accordance with D[1,1] to D[1,n] transmitted from the wiring WDL[1] to the wiring WDL[n]. In other words, through the operation in the period from Time U2 to Time U5, D[1,1] to D[1,n] are written to the memory cell MC[1,1] to the memory cell MC[1,n], respectively.

In the period from Time U5 to Time U8, the circuit WWD supplies a high-level potential to the wiring WWL[2] and supplies low-level potentials to the wiring WWL[1] and the wiring WWL[3] to the wiring WWL[m]. Thus, the high-level potential is supplied to each of the gates of the transistors M1 included in the memory cell MC[2,1] to the memory cell MC[2,n] arranged in the second row in the memory cell array MCA, so that the transistors M1 included in the memory cell MC[2,1] to the memory cell MC[2,n] are turned on. The high-level potentials are supplied to the gates of the transistors M1 included in the memory cell MC[1,1] to the memory cell MC[1,n] and the memory cell MC[3,1] to the memory cell MC[m,n] arranged in the first row and the third row to the m-th row in the memory cell array MCA, so that the transistors M1 included in the memory cell MC[1,1] to the memory cell MC[1,n] and the memory cell MC[3,1] to the memory cell MC[m,n] are turned off. That is, the circuit WWD supplies a high-level potential to the wiring WWL[2] and supplies low-level potentials to the wiring WWL[1] and the wiring WWL[3] to the wiring WWL[m], so that the memory cells MC arranged in the second row of the memory cell array MCA can be selected as targets for writing.

In the period from Time U5 to Time U8, the circuit WDD supplies D[2,1] to D[2,n] as data for writing to the wiring WDL[1] to the wiring WDL[n], respectively, for example. The memory cells MC arranged in the second row of the memory cell array MCA are selected as targets for writing by the circuit WWD, so that potentials corresponding to D[2,1] to D[2,n] are respectively supplied to the gates of the transistor M2 of the memory cell MC[2,1] to the memory cell MC[2,n].

In the period from Time U6 to Time U7, the circuit FECD supplies the potential $V_{1A}$ to the wiring FCA[2] and supplies the potential $V_{OB}$ to the wiring FCB[2]. Note that the circuit FECD supplies the potentials $V_{OA}$ to the wiring FCA[1] and the wiring FCA[3] to the wiring FCA[m] and supplies the potentials $V_{OB}$ to the wiring FCB[1] and the wiring FCB[3] to the wiring FCB[m].

Furthermore, in the period from Time U7 to Time U8, the circuit FECD supplies the potential $V_{OA}$ to the wiring FCA[2] and supplies the potential $V_{1B}$ to the wiring FCB[2]. Note that the circuit FECD continuously supplies the potentials $V_{OA}$ to the wiring FCA[1] and the wiring FCA[3] to the wiring FCA[m] and supplies the potentials $V_{OB}$ to the wiring FCB[1] and the wiring FCB[3] to the wiring FCB[m].

By the operation in the period from Time U5 to Time U8, the direction of polarization caused in each of the FTJ elements FJA and the FTJ elements FJB included in the memory cell MC[2,1] to the memory cell MC[2,n] in the second row of the memory cell array MCA is determined in accordance with D[2,1] to D[2,n] transmitted from the wiring WDL[1] to the wiring WDL[n]. In other words, through the operation in the period from Time U5 to Time U8, D[2,1] to D[2,n] are written to the memory cell MC[2,1] to the memory cell MC[2,n], respectively.

In the period from Time U8 to Time U9, an operation of writing data to the memory cells MC arranged in the third row to the m−1-th row of the memory cell array MCA is performed in a manner similar to those of the operation of writing data to the memory cells MC arranged in the first row of the memory cell array MCA performed in the period from Time U2 to Time U5 and the operation of writing data to the memory cells MC arranged in the second row of the memory cell array MCA performed in the period from Time U5 to Time U8.

In the period from Time U9 to Time U12, the circuit WWD supplies a high-level potential to the wiring WWL[m] and supplies low-level potentials to the wiring WWL[1] to the wiring WWL[m−1]. Thus, the high-level potential is supplied to each of the gates of the transistors M1 included in the memory cell MC[m,1] to the memory cell MC[m,n] arranged in the m-th row in the memory cell array MCA, so that the transistors M1 included in the memory cell MC[m,1] to the memory cell MC[m,n] are turned on. The low-level potentials are supplied to the gates of the transistors M1 included in the memory cell MC[1,1] to the memory cell MC[m−1,n] arranged in the first row to the m−1-th row in the memory cell array MCA, so that the transistors M1 included in the memory cell MC[1,1] to the memory cell MC[m−1,n] are turned off. That is, the circuit WWD supplies a high-level potential to the wiring WWL[m] and supplies low-level potentials to the wiring WWL[1] to the wiring WWL[m−1], so that the memory cells MC arranged in the m-th row of the memory cell array MCA can be selected as targets for writing.

In the period from Time U9 to Time U12, the circuit WDD supplies D[m,1] to D[m,n] as data for writing to the wiring WDL[1] to the wiring WDL[n], respectively, for example. The memory cells MC arranged in the m-th row of the memory cell array MCA are selected as targets for writing by the circuit WWD, so that potentials corresponding to D[m,1] to D[m,n] are respectively supplied to the gates of the transistor M2 of the memory cell MC[m,1] to the memory cell MC[m,n].

In the period from Time U10 to Time U11, the circuit FECD supplies the potential $V_{1A}$ to the wiring FCA[m] and supplies the potential $V_{0B}$ to the wiring FCB[m]. Note that the circuit FECD supplies the potentials $V_{0A}$ to the wiring FCA[1] to the wiring FCA[m−1] and supplies the potentials $V_{0B}$ to the wiring FCB[1] to the wiring FCB[m−1].

Furthermore, in the period from Time U11 to Time U12, the circuit FECD supplies the potential $V_{0A}$ to the wiring FCA[m] and supplies the potential $V_{1B}$ to the wiring FCB[m]. Note that the circuit FECD continuously supplies the potentials $V_{0A}$ to the wiring FCA[1] to the wiring FCA[m−1] and supplies the potentials $V_{0B}$ to the wiring FCB[1] to the wiring FCB[m−1].

By the operation in the period from Time U9 to Time U12, the direction of polarization caused in each of the FTJ elements FJA and the FTJ elements FJB included in the memory cell MC[m,1] to the memory cell MC[m,n] in the m-th row of the memory cell array MCA is determined in accordance with D[m,1] to D[m,n] transmitted from the wiring WDL[1] to the wiring WDL[n]. In other words, through the operation in the period from Time U9 to Time U12, D[m,1] to D[m,n] are written to the memory cell MC[m,1] to the memory cell MC[m,n], respectively.

By performing the operation in the period from Time U1 to Time U12, D[1,1] to D[m,n] can be respectively written to the memory cell MC[1,1] to the memory cell MC[m,n] included in the memory cell array MCA.

In the timing chart in FIG. 11, as an operation after the operation of writing data to the memory cell MC[1,1] to the memory cell MC[m,n] (the operation in the period from Time U12 to Time U13) is ended, the circuit WWD supplies low-level potentials to the wiring WWL[1] to the wiring WWL[m], for example. The circuit WDD supplies ground potentials to the wiring WDL[1] to the wiring WDL[n], for example. The circuit FECD supplies the potentials $V_{0A}$ and the potentials $V_{0B}$ to the wiring FCA[1] to the wiring FCA[m] and the wiring FCB[1] to the wiring FCB[m], respectively, for example.

The operation in the timing chart in FIG. 11 is an example, and thus the operation may be changed according to circumstances or depending on the case. For example, although in the operation in the period from Time U2 to Time U5 in the timing chart in FIG. 11, a high-level potential is supplied to the wiring WWL[1] and D[1,1] to D[1,n] are supplied to the wiring WDL[1] to the wiring WDL[n], D[1,1] to D[1,n] may be supplied to the wiring WDL[1] to the wiring WDL[n] in the period where a high-level potential is supplied to the wiring WWL[1], and a high-level potential may be supplied to the wiring WWL[1] in the period where D[1,1] to D[1,n] are supplied to the wiring WDL[1] to the wiring WDL[n]. The period where the potential $V_{1A}$ is supplied to the wiring FCA[1] and the potential $V_{0B}$ is supplied to the wiring FCB[1] and the period where the potential $V_{0A}$ is supplied to the wiring FCA[1] and the potential $V_{1B}$ is supplied to the wiring FCB[1] are provided at any timing in the period where a high-level potential is supplied to the wiring WWL[1] and D[1,1] to D[1,n] are supplied to the wiring WDL[1] to the wiring WDL[n]. The period where the potential $V_{0A}$ is supplied to the wiring FCA[1] and the potential $V_{1B}$ is supplied to the wiring FCB[1] may precede the period where the potential $V_{1A}$ is supplied to the wiring FCA[1] and the potential $V_{0B}$ is supplied to the wiring FCB[1].

Writing Operation Example 2

Next, an example of an operation of writing data to the memory cell MC of the memory device 100, which is different from that in the timing chart in FIG. 11, will be described.

Figure 12:
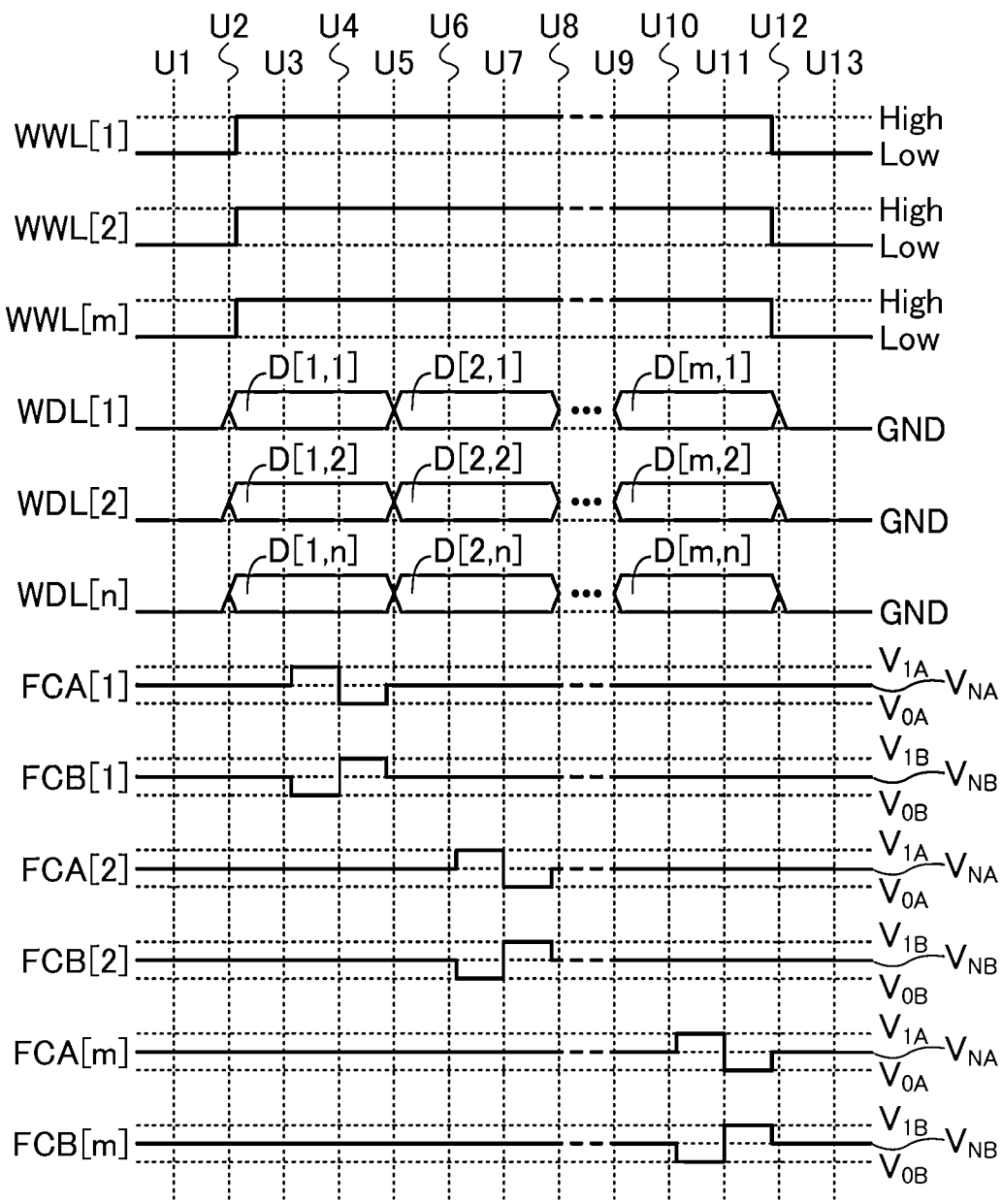
FIG. 12 is a timing chart showing an operation example of a memory device.

A timing chart shown in FIG. 12 shows a data writing operation example different from the data writing operation example in the timing chart in FIG. 11. Like the timing chart in FIG. 11, the timing chart in FIG. 12 shows changes in the potentials of the wiring WWL[1], the wiring WWL[1], the wiring WWL[m], the wiring WDL[1], the wiring WDL[2], the wiring WDL[n], the wiring FCA[1], the wiring FCB[1], the wiring FCA[2], the wiring FCB[2], the wiring FCA[m], and the wiring FCB[m] in the period from Time U1 to Time U13 and time around the period.

The writing operation in the timing chart in FIG. 12 is different from the writing operation in the timing chart in FIG. 11 in input of high-level potentials to the wiring WWL[1] to the wiring WWL[m] in the period from Time U2 to Time U12 and changes in the potentials of the wiring FCA[1] to the wiring FCA[m] and the wiring FCB[1] to the wiring FCB[m] in the period from Time U1 to Time U13.

In the period from Time U2 to Time U12 in the timing chart in FIG. 12, high-level potentials are input to the wiring WWL[1] to the wiring WWL[m], so that in the period from Time U2 to Time U12, the high-level potentials are input to the gates of the transistors M1 of the memory cell MC[1,1] to the memory cell MC[m,n] included in the memory cell array MCA. Accordingly, the transistors M1 of the memory cell MC[1,1] to the memory cell MC[m,n] are turned on. In other words, when the j-th column is focused on, a conducting state is established between the wiring WDL[j] and the gates of the transistors M2 of the memory cell MC[1,j] to the memory cell MC[m,j].

In the period from Time U1 to Time U2 in the timing chart in FIG. 12, potentials $V_{NA}$ are supplied to the wiring FCA[1] to the wiring FCA[m] and potentials $V_{NB}$ are supplied to the wiring FCB[1] to the wiring FCB[m].

Note that $V_{NA}$ is a potential that does not cause (does not change) polarization in the FTJ element FJA with respect to all data (potential) input from the wiring WDL to the gate of the transistor M2 and $V_{NB}$ is a potential that does not cause (does not change) polarization in the FTJ element FJB with respect to all data (potential) input from the wiring WDL to the gate of the transistor M2. For example, $V_{NA}$ can be a potential higher than $V_{0A}$ and lower than $V_{1A}$. For example, $V_{NB}$ can be a potential higher than $V_{0B}$ and lower than $V_{1B}$.

In the period from Time U3 to Time U4 in the timing chart in FIG. 12, the potential $V_{1A}$ is supplied to the wiring FCA[1] and the potential $V_{0B}$ is supplied to the wiring FCB[1]. The potentials $V_{NA}$ are continuously supplied to the wiring FCA[2] to the wiring FCA[m] and the potentials $V_{NB}$ are continuously supplied to the wiring FCB[2] to the wiring FCB[m].

In the period from Time U4 to Time U5 in the timing chart in FIG. 12, the potential $V_{0A}$ is supplied to the wiring FCA[1] and the potential $V_{1B}$ is supplied to the wiring FCB[1]. The potentials $V_{NA}$ are continuously supplied to the wiring FCA[2] to the wiring FCA[m] and the potentials $V_{NB}$ are continuously supplied to the wiring FCB[2] to the wiring FCB[m].

By the operation in the period from Time U2 to Time U5 in the timing chart in FIG. 12, the direction of polarization caused in each of the FTJ elements FJA and the FTJ elements FJB included in the memory cell MC[1,1] to the memory cell MC[1,n] in the first row of the memory cell array MCA is determined in accordance with D[1,1] to D[1,n] transmitted from the wiring WDL[1] to the wiring WDL[n]. Meanwhile, in the period from Time U2 to Time U5, the potentials $V_{NA}$ are supplied to the wiring FCA[2] to the wiring FCA[m] and the potentials $V_{NB}$ are supplied to the wiring FCB[2] to the wiring FCB[m], so that even when the transistors M1 of the memory cell MC[2,1] to the memory cell MC[m,n] are in an on state, D[1,1] to D[1,n] are not written to the memory cells MC in each column.

That is, in the operation in the timing chart in FIG. 12, the wiring FCA[1] to the wiring FCA[m] and the wiring FCB[1] to the wiring FCB[m] can function as not only wirings for controlling polarization in the FTJ element FJA and the FTJ element FJB but also selection signal lines for data writing.

Also at and after Time U5 in the timing chart in FIG. 12, in accordance with data transmitted from the wiring WDL[1] to the wiring WDL[n], the memory cells MC in the second row to the m-th row of the memory cell array MCA are selected row by row with use of the wiring FCA[1] to the wiring FCA[m] and the wiring FCB[1] to the wiring FCB[m], whereby D[2,1] to D[m,n] can be respectively written to the memory cell MC[2,1] to the memory cell MC[m,n] included in the memory cell array MCA in a manner similar to that in the operation example in the timing chart in FIG. 11.

Reading Operation Example 1

Figure 13:
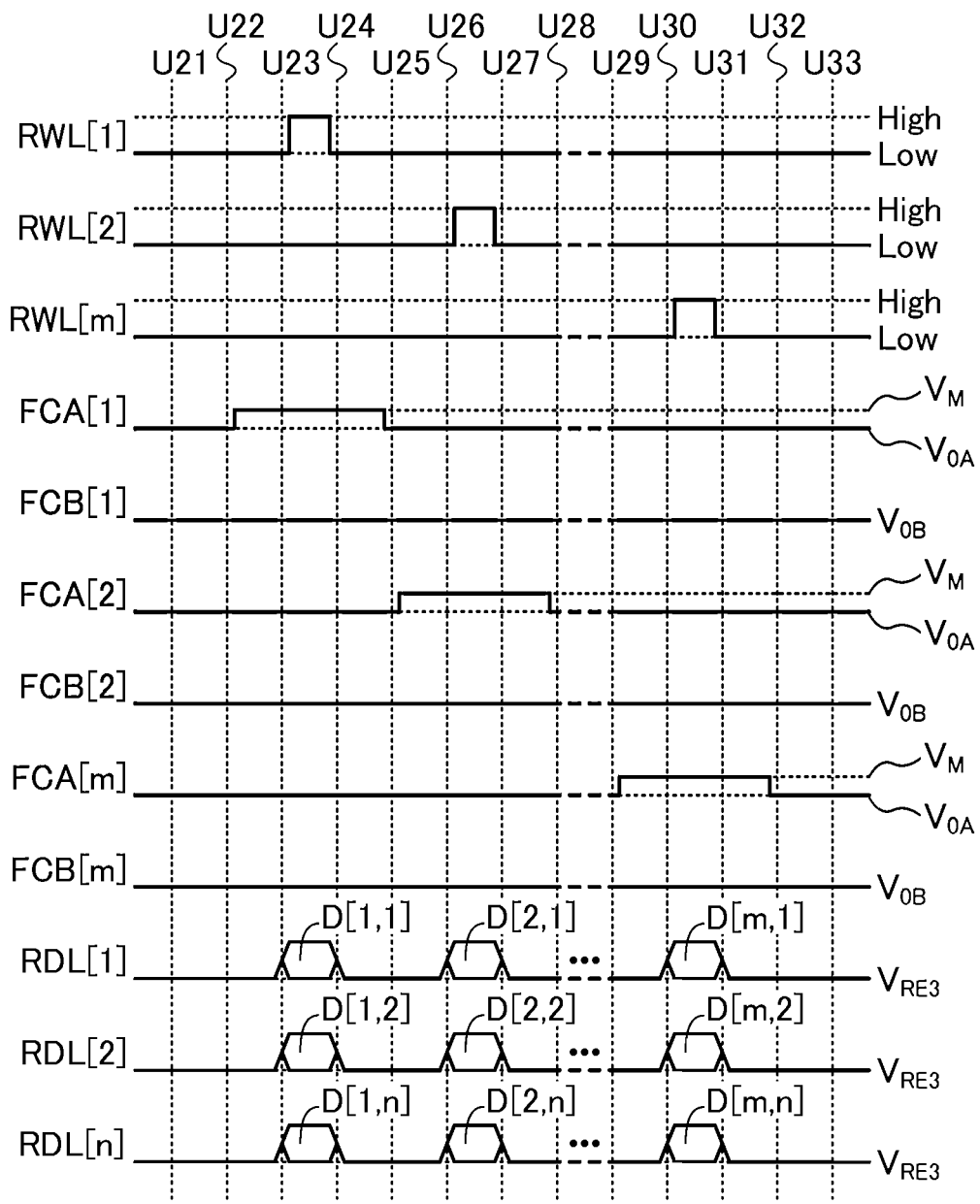
FIG. 13 is a timing chart showing an operation example of a memory device.

FIG. 13 is a timing chart showing an example of an operation of reading data from the memory cell MC of the memory device 100. Note that the timing charts in FIG. 3A, FIG. 3B, and the like described in the above embodiment show operation examples of one memory cell MC, and the timing chart in FIG. 13 shows an example of an operation of reading data from the plurality of memory cells MC included in the memory cell array MCA.

The timing chart in FIG. 13 shows changes in the potentials of the wiring RWL[1], the wiring RWL[2], the wiring RWL[m], the wiring FCA[1], the wiring FCB[1], the wiring FCA[2], the wiring FCB[2], the wiring FCA[m], the wiring FCB[m], the wiring RDL[1], the wiring RDL[2], and the wiring RDL[n] in the period from Time U21 to Time U33 and time around the period.

In the period from Time U21 to Time U22, the circuit RWD supplies low-level potentials (denoted by Low in FIG. 13) as initial potentials to the wiring RWL[1] to the wiring RWL[m], for example. Thus, the low-level potentials are supplied to the gates of the transistors M3 of all of the memory cells MC included in the memory cell array MCA, so that the transistors M3 are turned off.

In the period from Time U21 to Time U22, the circuit FECD supplies the potentials $V_{0A}$ to the wiring FCA[1] to the wiring FCA[m] and supplies the potentials $V_{0B}$ to the wiring FCB[1] to the wiring FCB[m]. For the potential $V_{0A}$ and the potential $V_{0B}$, the description of the timing charts in FIG. 2, FIG. 3A, and the like is referred to.

In the period from Time U21 to Time U22, potentials corresponding to a potential supplied to the wiring VCE are preferably supplied to the wiring RDL[1] to the wiring RDL[n], for example. When the wiring VCE has a low-level potential, high-level potentials are preferably supplied to the wiring RDL[1] to the wiring RDL[n], or when the wiring VCE has a high-level potential, low-level potentials are preferably supplied to the wiring RDL[1] to the wiring RDL[n], for example. In this operation example, VIES is supplied to the wiring RDL[1] to the wiring RDL[n] as a potential that does not hinder reading of data from the memory cell MC.

In the period from Time U22 to Time U25, the circuit FECD supplies the potential $V_M$ to the wiring FCA[1] and supplies the potential $V_{0B}$ to the wiring FCB[1]. The circuit FECD supplies the potentials $V_{0A}$ to the wiring FCA[2] to the wiring FCA[m] and supplies the potentials $V_{0B}$ to the wiring FCB[1] to the wiring FCB[m]. Here, a voltage of $V_M$-$V_{0B}$ is applied between the wiring FCA[1] and the wiring FCB[1], so that voltages obtained by dividing the voltage are applied to the FTJ elements FJA and the FTJ elements FJB of the memory cell MC[1,1] to the memory cell MC[1,n] in the first row of the memory cell array MCA. Thus, the potentials of the gates of the transistors M2 of the memory cell MC[1,1] to the memory cell MC[1,n] are determined in accordance with the polarization directions in the FTJ element FJA and the FTJ element FJB, i.e., data written in the memory cell MC.

For the potential $V_M$, the description of the timing charts in FIG. 3A and the like is referred to.

In the period from Time U23 to Time U24, the circuit RWD supplies a high-level potential (denoted by High in FIG. 13) to the wiring RWL[1]. The circuit RWD also supplies low-level potentials to the wiring RWL[2] to the wiring RWL[m]. Thus, the high-level potential is supplied to each of the gates of the transistors M3 included in the memory cell MC[1,1] to the memory cell MC[1,n] arranged in the first row in the memory cell array MCA, so that the transistors M3 included in the memory cell MC[1,1] to the memory cell MC[1,n] are turned on. The low-level potentials are supplied to the gates of the transistors M3 included in the memory cell MC[2,1] to the memory cell MC[m,n] arranged in the second row to the m-th row in the memory cell array MCA, so that the transistors M3 included in the memory cell MC[2,1] to the memory cell MC[m,n] are turned off.

That is, the circuit FECD supplies the potential $V_M$ to the wiring FCA[1], supplies the potential $V_{OB}$ to the wiring FCB[1], supplies the potentials $V_{OA}$ to the wiring FCA[2] to the wiring FCA[m], and supplies the potentials $V_{OB}$ to the wiring FCB[2] to the wiring FCB[m], and the circuit RWD supplies a high-level potential to the wiring RWL[1] and supplies low-level potentials to the wiring RWL[2] to the wiring RWL[m], whereby the memory cells MC arranged in the first row of the memory cell array MCA can be selected as targets for reading.

In the period from Time U23 to Time U24, a conducting state is established between the wiring VCE of the memory cell MC[1,1] to the memory cell MC[1,n] in the first row of the memory cell array MCA and the wiring RDL[1] to the wiring RDL[n], so that currents corresponding to the potentials of the gates of the transistors M2 of the memory cell MC[1,1] to the memory cell MC[1,n] flow through the wiring RDL[1] to the wiring RDL[n]. Alternatively, in accordance with the potentials of the gates of the transistors M2 of the memory cell MC[1,1] to the memory cell MC[1,n], the potentials of the wiring RDL[1] to the wiring RDL[n] change. In other words, to the wiring RDL[1] to the wiring RDL[n], data (e.g., current or voltage) corresponding to D[1,1] to D[1,n] are transmitted as data retained in the memory cell MC[1,1] to the memory cell MC[1,n].

Here, the circuit RDD or the like obtains data (e.g., current or voltage) transmitted to the wiring RDL[1] to the wiring RDL[n], whereby D[1,1] to D[1,n] retained in the memory cell MC[1,1] to the memory cell MC[1,n], respectively, can be read.

In the period from Time U25 to Time U27, the circuit FECD supplies the potential $V_M$ to the wiring FCA[2] and supplies the potential $V_{OB}$ to the wiring FCB[2]. The circuit FECD supplies the potentials $V_{OA}$ to the wiring FCA[1] and the wiring FCA[3] to the wiring FCA[m] and supplies the potentials $V_{OB}$ to the wiring FCB[1] and the wiring FCB[3] to the wiring FCB[m]. Here, a voltage of $V_M$-$V_{OB}$ is applied between the wiring FCA[2] and the wiring FCB[2], so that voltages obtained by dividing the voltage are applied to the FTJ elements FJA and the FTJ elements FJB of the memory cell MC[2,1] to the memory cell MC[2,n] in the second row of the memory cell array MCA. Thus, the potentials of the gates of the transistors M2 of the memory cell MC[2,1] to the memory cell MC[2,n] are determined in accordance with the polarization directions in the FTJ element FJA and the FTJ element FJB, i.e., data written in the memory cell MC.

In the period from Time U26 to Time U27, the circuit RWD supplies a high-level potential to the wiring RWL[2]. The circuit RWD also supplies low-level potentials to the wiring RWL[1] and the wiring RWL[3] to the wiring RWL[m]. Thus, the high-level potential is supplied to each of the gates of the transistors M3 included in the memory cell MC[2,1] to the memory cell MC[2,n] arranged in the second row in the memory cell array MCA, so that the transistors M3 included in the memory cell MC[2,1] to the memory cell MC[2,n] are turned on. The low-level potentials are supplied to the gates of the transistors M3 included in the memory cells MC arranged in the first row and the third row to the m-th row in the memory cell array MCA, so that the transistors M3 included in the memory cells MC arranged in the first row and the third row to the m-th row are turned off.

That is, the circuit FECD supplies the potential $V_M$ to the wiring FCA[2], supplies the potential $V_{OB}$ to the wiring FCB[2], supplies the potentials $V_{OA}$ to the wiring FCA[1] and the wiring FCA[3] to the wiring FCA[m], and supplies the potentials $V_{OB}$ to the wiring FCB[1] and the wiring FCB[3] to the wiring FCB[m], and the circuit RWD supplies a high-level potential to the wiring RWL[2] and supplies low-level potentials to the wiring RWL[1] and the wiring RWL[3] to the wiring RWL[m], whereby the memory cells MC arranged in the second row of the memory cell array MCA can be selected as targets for reading.

In the period from Time U26 to Time U27, a conducting state is established between the wiring VCE of the memory cell MC[2,1] to the memory cell MC[2,n] in the second row of the memory cell array MCA and the wiring RDL[1] to the wiring RDL[n], so that currents corresponding to the potentials of the gates of the transistors M2 of the memory cell MC[2,1] to the memory cell MC[2,n] flow through the wiring RDL[1] to the wiring RDL[n]. Alternatively, in accordance with the potentials of the gates of the transistors M2 of the memory cell MC[2,1] to the memory cell MC[2,n], the potentials of the wiring RDL[1] to the wiring RDL[n] change. In other words, to the wiring RDL[1] to the wiring RDL[n], data (e.g., current or voltage) corresponding to D[2,1] to D[2,n] are transmitted as data retained in the memory cell MC[2,1] to the memory cell MC[2,n].

Here, the circuit RDD or the like obtains data (e.g., current or voltage) transmitted to the wiring RDL[1] to the wiring RDL[n], whereby D[2,1] to D[2,n] retained in the memory cell MC[2,1] to the memory cell MC[2,n], respectively, can be read.

In the period from Time U28 to Time U29, an operation of reading data from the memory cells MC arranged in the third row to the m-1-th row of the memory cell array MCA is performed in a manner similar to those of the operation of reading data from the memory cells MC arranged in the first row of the memory cell array MCA performed in the period from Time U22 to Time U25 and the operation of reading data from the memory cells MC arranged in the second row of the memory cell array MCA performed in the period from Time U25 to Time U28.

In the period from Time U29 to Time U32, the circuit FECD supplies the potential $V_M$ to the wiring FCA[m] and supplies the potential $V_{OB}$ to the wiring FCB[m]. The circuit FECD supplies the potentials $V_{OA}$ to the wiring FCA[1] to the wiring FCA[m-1] and supplies the potentials $V_{OB}$ to the wiring FCB[1] to the wiring FCB[m-1]. Here, a voltage of $V_M$-$V_{OB}$ is applied between the wiring FCA[m] and the wiring FCB[m], so that voltages obtained by dividing the voltage are applied to the FTJ elements FJA and the FTJ elements FJB of the memory cell MC[m,1] to the memory cell MC[m,n] in the m-th row of the memory cell array MCA. Thus, the potentials of the gates of the transistors M2 of the memory cell MC[m,1] to the memory cell MC[m,n] are determined in accordance with the polarization directions in the FTJ element FJA and the FTJ element FJB, i.e., data written in the memory cell MC.

In the period from Time U30 to Time U31, the circuit RWD supplies a high-level potential to the wiring RWL[m]. The circuit RWD also supplies low-level potentials to the wiring RWL[1] to the wiring RWL[m−1]. Thus, the high-level potential is supplied to each of the gates of the transistors M3 included in the memory cell MC[m,1] to the memory cell MC[m,n] arranged in the m-th row in the memory cell array MCA, so that the transistors M3 included in the memory cell MC[m,1] to the memory cell MC[m,n] are turned on. The low-level potentials are supplied to the gates of the transistors M3 included in the memory cell MC[1,1] to the memory cell MC[m−1,n] arranged in the first row to the m−1-th row in the memory cell array MCA, so that the transistors M3 included in the memory cell MC[1,1] to the memory cell MC[m−1,n] are turned off.

That is, the circuit FECD supplies the potential $V_M$ to the wiring FCA[m], supplies the potential $V_{OB}$ to the wiring FCB[m], supplies the potentials $V_{OA}$ to the wiring FCA[1] to the wiring FCA[m−1], and supplies the potentials $V_{OB}$ to the wiring FCB[1] to the wiring FCB[m−1], and the circuit RWD supplies a high-level potential to the wiring RWL[m] and supplies low-level potentials to the wiring RWL[1] to the wiring RWL[m−1], whereby the memory cells MC arranged in the m-th row of the memory cell array MCA can be selected as targets for reading.

In the period from Time U30 to Time U31, a conducting state is established between the wiring VCE of the memory cell MC[m,1] to the memory cell MC[m,n] in the m-th row of the memory cell array MCA and the wiring RDL[1] to the wiring RDL[n], so that currents corresponding to the potentials of the gates of the transistors M2 of the memory cell MC[m,1] to the memory cell MC[m,n] flow through the wiring RDL[1] to the wiring RDL[n]. Alternatively, in accordance with the potentials of the gates of the transistors M2 of the memory cell MC[m,1] to the memory cell MC[m,n], the potentials of the wiring RDL[1] to the wiring RDL[n] change. In other words, to the wiring RDL[1] to the wiring RDL[n], data (e.g., current or voltage) corresponding to D[m,1] to D[m,n] are transmitted as data retained in the memory cell MC[m,1] to the memory cell MC[m,n].

By performing the operation in the period from Time U21 to Time U32, D[1,1] to D[m,n] can be respectively read from the memory cell MC[1,1] to the memory cell MC[m,n] included in the memory cell array MCA.

In the timing chart in FIG. 13, as an operation after the operation of reading data from the memory cell MC[1,1] to the memory cell MC[m,n] (the operation in the period from Time U32 to Time U33) is ended, the circuit RWD supplies low-level potentials to the wiring RWL[1] to the wiring RWL[m], for example. The circuit FECD supplies the potentials $V_{OA}$ and the potentials $V_{OB}$ to the wiring FCA[1] to the wiring FCA[m] and the wiring FCB[1] to the wiring FCB[m], respectively, for example. Ground potentials are supplied to the wiring RDL[1] to the wiring RDL[n], for example.

Reading Operation Example 2

Next, an example of an operation of reading data from the memory cell MC of the memory device 100, which is different from that in the timing chart in FIG. 13, will be described.

Figure 14:
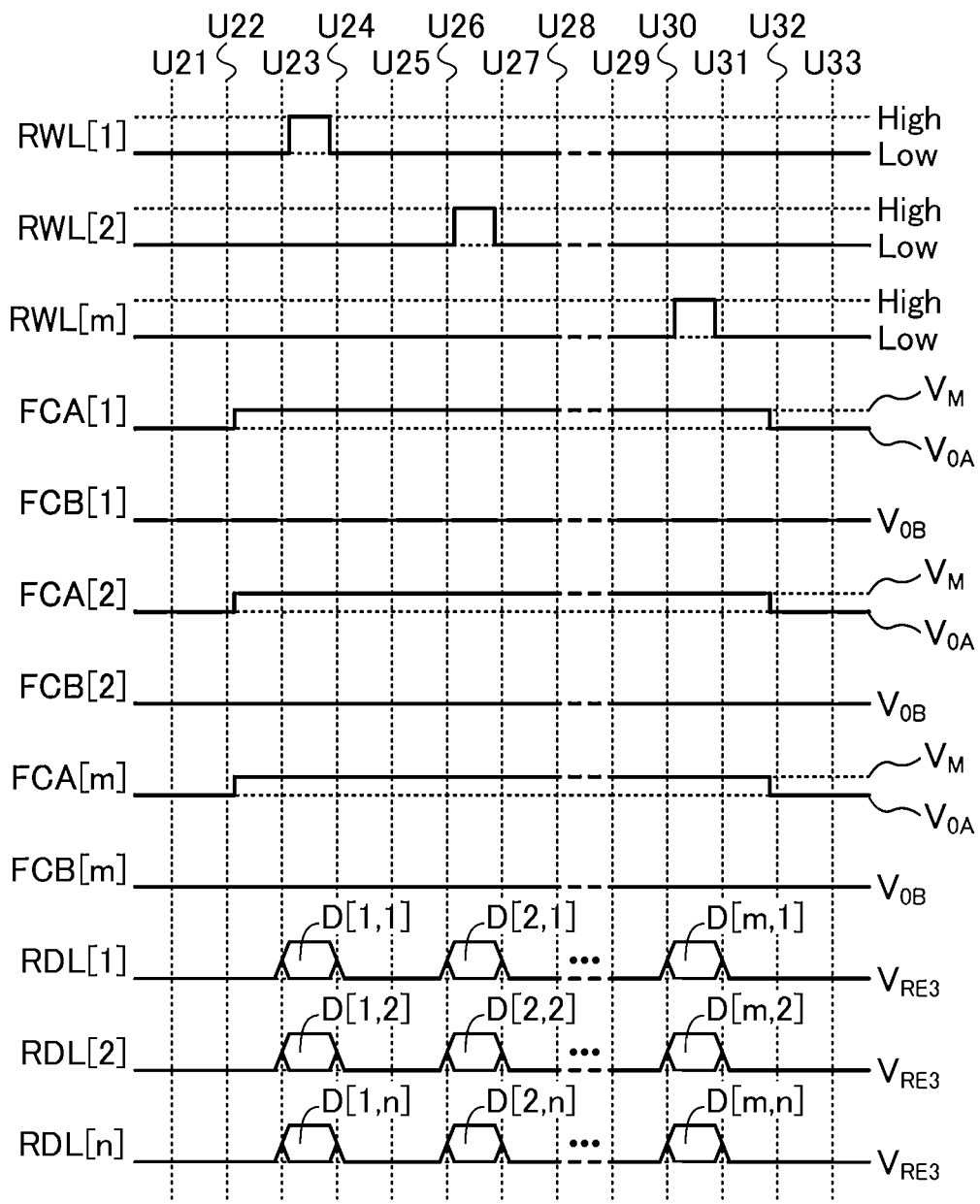
FIG. 14 is a timing chart showing an operation example of a memory device.

A timing chart shown in FIG. 14 shows a data reading operation example different from the data reading operation example in the timing chart in FIG. 13. Like the timing chart in FIG. 13, the timing chart in FIG. 14 shows changes in the potentials of the wiring RWL[1], the wiring RWL[2], the wiring RWL[m], the wiring FCA[1], the wiring FCB[1], the wiring FCA[2], the wiring FCB[2], the wiring FCA[m], the wiring FCB[m], the wiring RDL[1], the wiring RDL[2], and the wiring RDL[n] in the period from Time U21 to Time U33 and time around the period.

The reading operation in the timing chart in FIG. 14 is different from the reading operation in the timing chart in FIG. 13 in that the wiring FCA[1] to the wiring FCA[m] have the potentials $V_M$ in the period from Time U22 to Time U32.

In the period from Time U22 to Time U32 in the timing chart in FIG. 14, $V_M$ is input to the wiring FCA[1] to the wiring FCA[m] and $V_{OB}$ is input to the wiring FCB[1] to the wiring FCB[m], so that in the period from Time U22 to Time U32, the potentials of the gates of the transistors M2 of the memory cell MC[1,1] to the memory cell MC[m,n] are potentials corresponding to data retained in the memory cells MC. Here, a voltage is generated between the gate and the first terminal of the transistor M2 of each of the memory cell MC[1,1] to the memory cell MC[m,n], so that a current flows between the first terminal and the second terminal of the transistor M2 depending on the potential of the second terminal of the transistor M2.

In this operation example, the memory cell MC subjected to reading can be selected from the memory cell array MCA by inputting a high-level potential from the circuit RWD to any one of the wiring RWL[1] to the wiring RWL[m] and inputting low-level potentials to the other wirings. For example, in the timing chart in FIG. 14, by supplying a high-level potential to the wiring RWL[1] and supplying low-level potentials to the wiring RWL[2] to the wiring RWL[m] as in the period from Time U23 to Time U24, data retained in the memory cells MC arranged in the first row of the memory cell array MCA can be read. Similarly, by supplying a high-level potential to the wiring RWL[2] and supplying low-level potentials to the wiring RWL[1] and the wiring RWL[3] to the wiring RWL[m] as in the period from Time U26 to Time U27, data retained in the memory cells MC arranged in the second row of the memory cell array MCA can be read, and by supplying a high-level potential to the wiring RWL[m] and supplying low-level potentials to the wiring RWL[1] to the wiring RWL[m−1] as in the period from Time U30 to Time U31, data retained in the memory cells MC arranged in the m-th row of the memory cell array MCA can be read.

That is, in the operation example in the timing chart in FIG. 14, changes in the potentials of the wiring RWL[1] to the wiring RWL[m] can be similar to those in the operation example in the timing chart in FIG. 13.

In the operation in the timing chart in FIG. 14, when the plurality of memory cells MC included in the memory cell array MCA are subjected to reading, the potentials of the wiring FCA[1] to the wiring FCA[m] and the wiring FCB[1] to the wiring FCB[m] do not need to be changed every memory cell MC subjected to reading. That is, by employing the operation example in the timing chart in FIG. 14, the circuit FECD can have a structure without a circuit, such as a selector, which selects a wiring for transmitting a signal.

Reading Operation Example 3

Next, an example of an operation of reading data from the memory cell MC of the memory device 100, which is different from those in the timing charts in FIG. 13 and FIG. 14, will be described.

Figure 15:
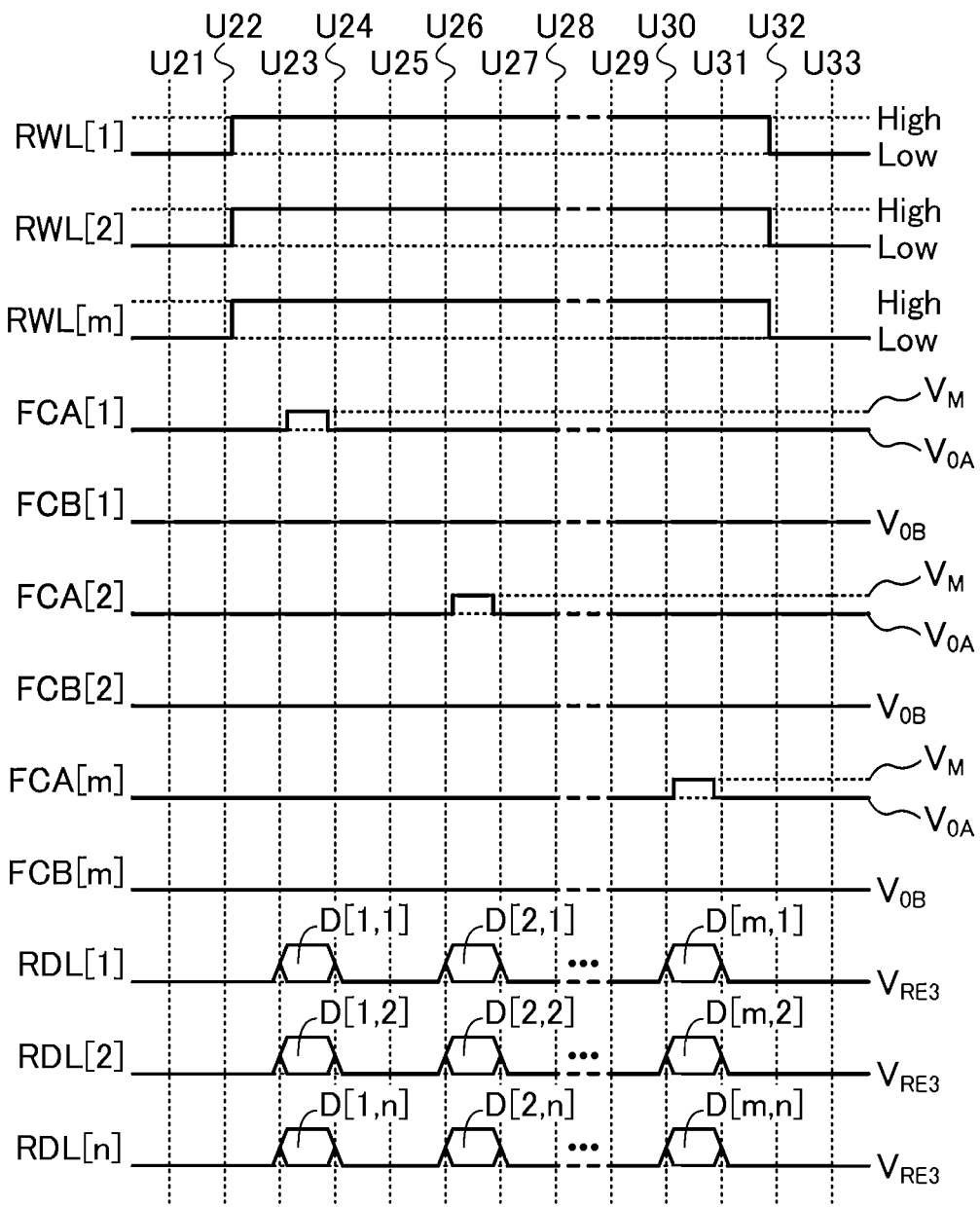
FIG. 15 is a timing chart showing an operation example of a memory device.

A timing chart shown in FIG. 15 shows a data reading operation example different from the data reading operation examples in the timing charts in FIG. 13 and FIG. 14. Like the timing charts in FIG. 13 and FIG. 14, the timing chart in FIG. 15 shows changes in the potentials of the wiring RWL[1], the wiring RWL[2], the wiring RWL[m], the wiring FCA[1], the wiring FCB[1], the wiring FCA[2], the wiring FCB[2], the wiring FCA[m], the wiring FCB[m], the wiring RDL[1], the wiring RDL[2], and the wiring RDL[n] in the period from Time U21 to Time U33 and time around the period.

The reading operation in the timing chart in FIG. 15 is different from the reading operation in the timing chart in FIG. 13 in the wiring RWL[1] to the wiring RWL[m] having high-level potentials in the period from Time U22 to Time U32 and changes in the potentials of the wiring FCA[1] to the wiring FCA[m] and the wiring FCB[1] to the wiring FCB[m] in the period from Time U22 to Time U32.

In the period from Time U22 to Time U32 in the timing chart in FIG. 15, high-level potentials are input to the wiring RWL[1] to the wiring RWL[m], so that in the period from Time U22 to Time U32, the high-level potentials are input to the gates of the transistors M3 of the memory cell MC[1,1] to the memory cell MC[m,n]. Thus, the transistors M3 of the memory cell MC[1,1] to the memory cell MC[m,n] are turned on.

In the period from Time U23 to Time U24 in the timing chart in FIG. 15, the potential $V_M$ is supplied to the wiring FCA[1] and the potential $V_{OB}$ is supplied to the wiring FCB[1]. The potentials $V_{OA}$ are supplied to the wiring FCA[2] to the wiring FCA[m] and the potentials $V_{OB}$ are supplied to the wiring FCB[2] to the wiring FCB[m]. Here, a voltage of $V_M-V_{OB}$ is applied between the wiring FCA[1] and the wiring FCB[1], so that voltages obtained by dividing the voltage are applied to the FTJ elements FJA and the FTJ elements FJB of the memory cell MC[1,1] to the memory cell MC[1,n] in the first row of the memory cell array MCA. Thus, the potentials of the gates of the transistors M2 of the memory cell MC[1,1] to the memory cell MC[1,n] are determined in accordance with the polarization directions in the FTJ element FJA and the FTJ element FJB, i.e., data written in the memory cell MC.

When the potential of the gate of the transistor M2 of each of the memory cell MC[1,1] to the memory cell MC[1,n] is determined, a voltage is generated between the gate and the first terminal of the transistor M2; thus, a current flows between the first terminal and the second terminal of the transistor M2 depending on the potential of the second terminal of the transistor M2. Note that the transistor M3 is in an on state, so that the potential VIES is input to the second terminal of the transistor M2. Therefore, currents corresponding to the potentials of the gates of the transistors M2 of the memory cell MC[1,1] to the memory cell MC[1,n] flow through the wiring RDL[1] to the wiring RDL[n]. Alternatively, in accordance with the potentials of the gates of the transistors M2 of the memory cell MC[1,1] to the memory cell MC[1,n], the potentials of the wiring RDL[1] to the wiring RDL[n] change. In other words, to the wiring RDL[1] to the wiring RDL[n], data (e.g., current or voltage) corresponding to D[1,1] to D[1,n] are transmitted as data retained in the memory cell MC[1,1] to the memory cell MC[1,n]. Accordingly, D[1,1] to D[1,n] can be read as the data retained in the memory cell MC[1,1] to the memory cell MC[1,n].

Meanwhile, the potentials $V_{OA}$ are supplied to the wiring FCA[2] to the wiring FCA[m] and the potentials $V_{OB}$ are supplied to the wiring FCB[2] to the wiring FCB[m], so that voltages obtained by dividing $V_{OA}-V_{OB}$ are applied to the FTJ elements FJA and the FTJ elements FJB of the memory cells MC in the second row to the m-th row of the memory cell array MCA. In the case where $V_{OA}-V_{OB}$ is 0 V or an approximate value of 0 V, the potentials of the gates of the transistors M2 of the memory cell MC[1,1] to the memory cell MC[1,n] can also be 0 V or an approximate value of 0. In other words, when the threshold voltage of the transistor M2 is an appropriate value, the transistor M2 is turned off; thus, a conducting state is not established between the wiring VCE and the wiring RDL[1] to the wiring RDL[m] in the memory cells MC in the second row to the m-th row of the memory cell array MCA and data (e.g., current or voltage) corresponding to the data retained in the memory cells MC do not flow through the wiring RDL[1] to the wiring RDL[m].

In this operation example, in the case where the data are read from the memory cells MC in the second row of the memory cell array MCA, as in the period from Time U26 to Time U27, the potential $V_M$ is supplied to the wiring FCA[2] and the potential $V_{OB}$ is supplied to the wiring FCB[2]. In the case where the data are read from the memory cells MC in the m-th row of the memory cell array MCA, as in the period from Time U30 to Time U31, the potential $V_M$ is supplied to the wiring FCA[m] and the potential $V_{OB}$ is supplied to the wiring FCB[m].

That is, in the operation example in the timing chart in FIG. 15, the wiring FCA[1] to the wiring FCA[m] function as selection signal lines for selecting, from the memory cell array MCA, the memory cell MC subjected to reading. Thus, in the operation example in the timing chart in FIG. 15, the potentials of the wiring RWL[1] to the wiring RWL[m] do not need to be changed every memory cell MC subjected to reading. That is, by employing the operation example in the timing chart in FIG. 15, the circuit RDD can have a structure without a circuit, such as a selector, which selects a wiring for transmitting a signal.

Note that this embodiment can be combined with any of the other embodiments in this specification as appropriate.

Embodiment 3

In this embodiment, the case where the memory device described in the above embodiment is treated as an arithmetic circuit is described.

<Arithmetic Circuit 1>

As an example, the memory device 100 in FIG. 10 to which the memory cell MC in FIG. 1A is applied is considered. In this case, the memory device 100 functioning as an arithmetic circuit can perform a product-sum operation of a plurality of pieces of first data and a plurality of pieces of second data. The plurality of pieces of first data are each "0" or "1" and the plurality of pieces of second data are each "0" or "1".

The first data are retained in, for example, the plurality of memory cells MC included in the memory cell array MCA of the memory device 100. That is, the plurality of memory cells MC included in the memory cell array MCA retain "0" or "1" as data.

In this embodiment, as a potential transmitted from the wiring WDL to the memory cell MC (the first data), $V_0$ corresponds to data "0" and $V_1$ corresponds to data "1", for example. That is, as in the period from Time T23 to Time T25 in the timing chart in FIG. 3A or FIG. 3B, in the case where the potential $V_M$ is input to the wiring FCA and the potential $V_{OB}$ is input to the wiring FCB, the potential of the gate of the transistor M2 is $V_{HLD0}$ when the memory cell MC retains the data "0" and the potential of the gate of the transistor M2 is $V_{HLD1}$ when the memory cell MC retains the data "1".

In the case where the memory device 100 is treated as an arithmetic circuit, the transistor M2 is preferably in an off state when the potential of the gate of the transistor M2 included in the memory cell MC is $V_{HLD0}$. Note that in this embodiment, the transistor M2 is in an off state when the potential of the gate of the transistor M2 included in the memory cell MC is $V_{HLD0}$.

The second data can be a value corresponding to a potential supplied to the wiring RWL, for example. The circuit RWD supplies a low-level potential to the wiring RWL when the second data is "0" and the circuit RWD supplies a high-level potential to the wiring RWL when the second data is "1", for example.

Here, an operation example of the memory cell MC that corresponds to the first data retained in the memory cell MC and the second data input to the memory cell MC is described.

When the first data retained in the memory cell MC is "0", the potential of the gate of the transistor M2 included in the memory cell MC is $V_{HLD0}$, so that the transistor M2 is in an off state. Meanwhile, when the first data retained in the memory cell MC is "1", the potential of the gate of the transistor M2 included in the memory cell MC is $V_{HLD1}$, so that the transistor M2 is in an on state and a current corresponding to the gate-source voltage of the transistor M2 flows between the first terminal and the second terminal of the transistor M2.

When the second data is "0", i.e., when a low-level potential is input from the wiring RWL to the memory cell MC, the transistor M3 included in the memory cell MC is in an off state. Meanwhile, when the second data is "1", i.e., when a high-level potential is input from the wiring RWL to the memory cell MC, the transistor M3 included in the memory cell MC is in an on state.

Accordingly, when the first data and the second data are each "1", a conducting state is established between the wiring VCE and the wiring RDL, so that a current corresponding to the gate-source voltage of the transistor M2 flows between the memory cell MC and the wiring RDL. When at least one of the first data and the second data is "0", the transistor M2 and/or the transistor M3 are in an off state, so that a current does not flow between the memory cell MC and the wiring RDL. In other words, when the product of the first data and the second data is "1", a current flows between the memory cell MC and the wiring RDL as a result. When the product of the first data and the second data is "0", a current does not flow between the memory cell MC and the wiring RDL as a result.

Here, in the case where $I_{MP}$ represents the amount of a current flowing between the memory cell MC and the wiring RDL while the first data and the second data are each "1", the amount of a current flowing between the memory cell MC and the wiring RDL changes in accordance with the values of the first data and the second data as shown in the following table.

TABLE 2

| First data | Second data | Amount of current flowing between memory cell MC and wiring RDL |
|---|---|---|
| 0 | 0 | 0 |
| 1 | 0 | 0 |
| 0 | 1 | 0 |
| 1 | 1 | $I_{MP}$ |

That is, in the case where the product of the first data and the second data is "1", a current having the current amount of $I_{MP}$ flows between the memory cell MC and the wiring RDL as the arithmetic operation result, and in the case where the product of the first data and the second data is "0", a current having the current amount of 0 flows between the memory cell MC and the wiring RDL as the arithmetic operation result (a current does not flow between the memory cell MC and the wiring RDL). As described above, the memory cell MC retains the first data and then the second data is input to the memory cell MC, whereby the memory cell MC can calculate the product of the first data and the second data.

Next, the case is considered where the plurality of pieces of second data are supplied to the wiring RWL[1] to the wiring RWL[m] at a time while the first data are retained in the plurality of memory cells MC included in the memory cell array MCA. Note that W[i,j] represents the first data retained in the memory cell MC[i,j] (i is an integer greater than or equal to 1 and less than or equal to m and j is an integer greater than or equal to 1 and less than or equal to n), and X[i] represents the second data supplied to the wiring RWL[i].

For example, when X[1] to X[m] are input from the wiring RWL[1] to the wiring RWL[m] as the second data to the memory cell MC[1,j] to the memory cell MC[m,j] in the j-th column, the memory cell MC[1,j] to the memory cell MC[m,j] perform arithmetic operations of W[1,j]×X[1] to W[m,j]×X[m], respectively. When the first data and the second data are each "1", a current having the current amount of $I_{MP}$ flows between the memory cell MC and the wiring RDL[j], so that the sum of the currents flowing through the wiring RDL[j] is the current amount selected from W[1,j]×X[1] to W[m,j]×X[m] depending on the number of memory cells MC with which the product becomes 1. For example, when the number of the memory cell MC[1,j] to the memory cell MC[m,j] with which the product of the first data and the second data becomes 1 is M (M is an integer greater than or equal to 1 and less than or equal to m), a current having the current amount of M×$I_{MP}$ flows through the wiring RDL[j].

When the circuit RDD here has a function of a current/voltage converter circuit or the like, the sum of the currents flowing through the wiring RDL[j] can be converted into a voltage value, for example. That is, the current amount of M×$I_{MP}$ which is the result of product-sum operations performed in the memory cell MC[1,j] to the memory cell MC[m,j] in the j-th column of the memory cell array MCA can be output as a voltage value.

The circuit RDD may be configured to further perform an arithmetic operation of a function using the product-sum result. For example, the circuit RDD can perform an arithmetic operation of an artificial neural network by performing an arithmetic operation of an activation function using the product-sum result. As the activation function, for example, a sigmoid function, a tanh function, a softmax function, a ReLU function, or a threshold function can be used.

The above description is made on the results of the product-sum operations of the plurality of pieces of first data and the plurality of pieces of second data in the memory cell MC[1,j] to the memory cell MC[m,j] arranged in the j-th column, but the plurality of pieces of the second data are transmitted through the wiring RWL[1] to the wiring RWL[m] extending in the row direction and thus product-sum operations can be performed in columns other than the j-th column. That is, in the case where the memory device 100 is used as a circuit that executes a product-sum operation, product-sum operations whose number is the same as that of the columns (n in FIG. 10) can be executed at a time.

<Arithmetic Circuit 2>

In the above arithmetic circuit, the arithmetic operation in the case where the first data has two levels ("0" or "1") and the second data has two levels ("0" or "1") is described as an example, but one embodiment of the present invention can perform an arithmetic operation using a multilevel value, an analog value, or the like by changing the structure of the arithmetic circuit.

Figure 16:
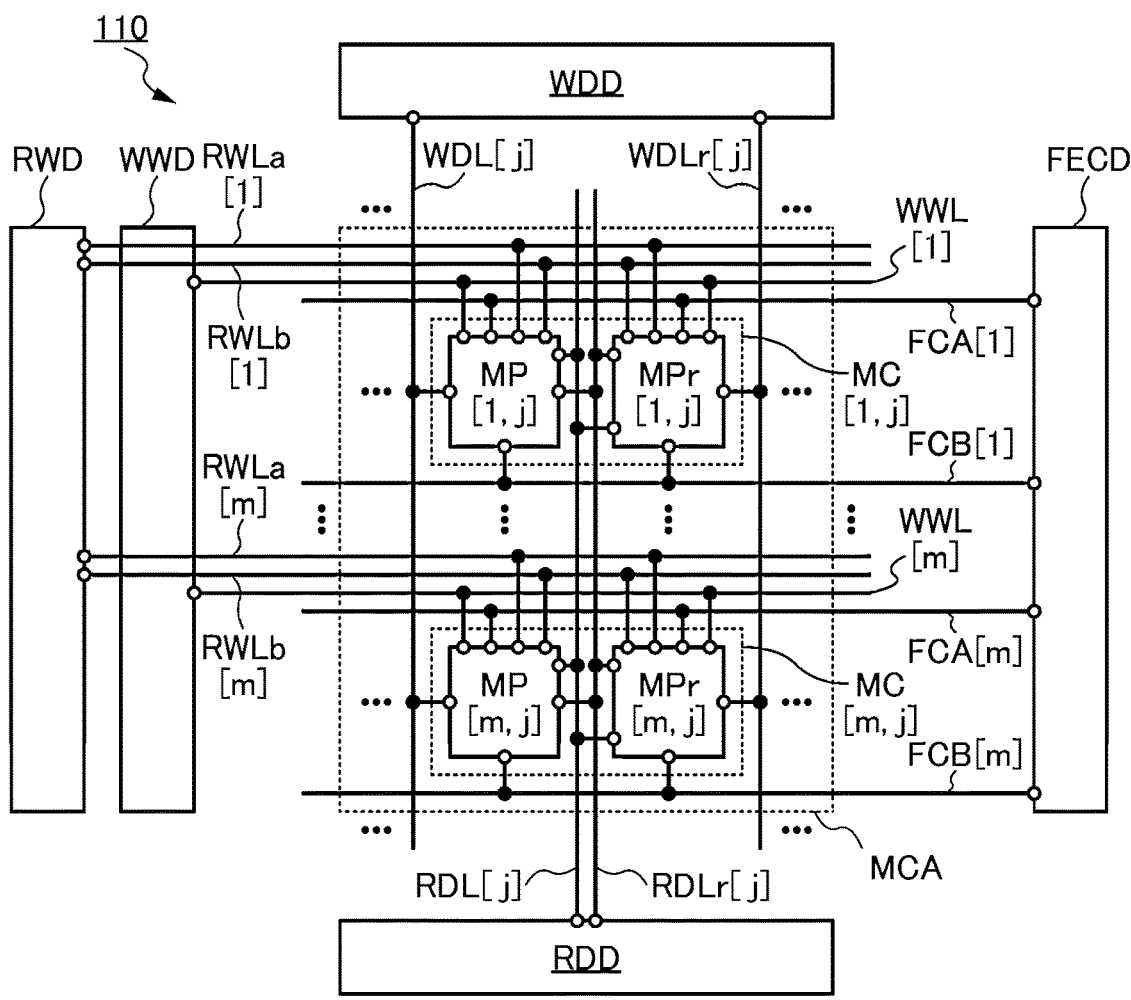
FIG. 16 is a block diagram showing a structure example of an arithmetic circuit.

FIG. 16 is a structure example of an arithmetic circuit capable of performing a product-sum operation of a plurality of pieces of first data having any of "a positive value", "0", and "a negative value" and a plurality of pieces of second data having any of "−1", "0", and "1".

The arithmetic circuit 110 includes the memory cell array MCA, the circuit WDD, the circuit RDD, the circuit WWD, the circuit RWD, and the circuit FECD.

The memory cell array MCA includes the plurality of memory cells MC. In the memory cell array MCA, the plurality of memory cells MC are arranged in a matrix of m rows and n columns (here, m and n are each an integer greater than or equal to 1). Note that in FIG. 16, the memory cell MC[1,j] and the memory cell MC[m,j] are extracted and illustrated. In FIG. 16, the memory cell MC which is positioned at an i-th column and a j-th row (here, i is an integer greater than or equal to 1 and less than or equal to m, and j is an integer greater than or equal to 1 and less than or equal to n) is represented as the memory cell MC[i,j] (not illustrated), for example.

The memory cell MC includes a circuit MP and a circuit MPr. The circuit structures of the circuit MP and the circuit MPr will be described later.

In the memory cell array MCA of the arithmetic circuit 110, the wiring WDL[1] to the wiring WDL[n], a wiring WDLr[1] to a wiring WDLr[n], the wiring RDL[1] to the wiring RDL[n], and a wiring RDLr[1] to a wiring RDLr[n] extend in the column direction. Note that [j] added to each of the wiring WDL, the wiring WDLr, the wiring RDL, and the wiring RDLr represents a wiring in the j-th column. Moreover, a wiring RWLa[1] to a wiring RWLa[m], a wiring RWLb[1] to a wiring RWLb[m], the wiring WWL[1] to the wiring WWL[m], the wiring FCA[1] to the wiring FCA[m], and the wiring FCB[1] to the wiring FCB[m] extend in the row direction. Note that [i] added to each of the wiring RWLa, the wiring RWLb, the wiring WWL, the wiring FCA, and the wiring FCB represents a wiring in the i-th row.

In the memory cell MC[1,j], the circuit MP[1,j] is electrically connected to the wiring WDL[j], the wiring RWLa[1], the wiring RWLb[1], the wiring WWL[1], the wiring FCA[1], the wiring FCB[1], the wiring RDL[j], and the wiring RDLr[j]. The circuit MPr[1,j] is electrically connected to the wiring WDLr[j], the wiring RWLa[1], the wiring RWLb[1], the wiring WWL[1], the wiring FCA[1], the wiring FCB[1], the wiring RDL[j], and the wiring RDLr[j].

In the memory cell MC[m,j], the circuit MP[m,j] is electrically connected to the wiring WDL[j], the wiring RWLa[m], the wiring RWLb[m], the wiring WWL[m], the wiring FCA[m], the wiring FCB[m], the wiring RDL[j], and the wiring RDLr[j]. The circuit MPr[m,j] is electrically connected to the wiring WDLr[j], the wiring RWLa[m], the wiring RWLb[m], the wiring WWL[m], the wiring FCA[m], the wiring FCB[m], the wiring RDL[j], and the wiring RDLr[j].

Next, the structure examples of the circuit MP and the circuit MPr included in the memory cell MC will be described.

Figure 17:
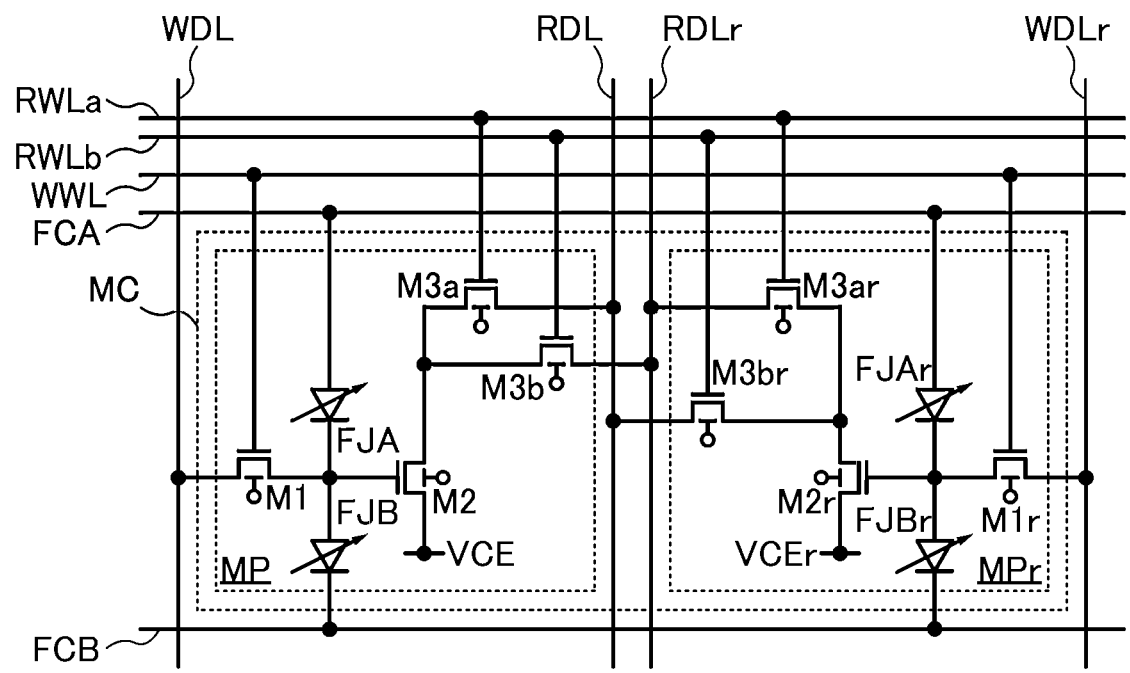
FIG. 17 is a circuit diagram showing a structure example of a circuit included in an arithmetic circuit.

FIG. 17 shows an example of a circuit structure applicable to the memory cell MC included in the memory cell array MCA of the arithmetic circuit 110 in FIG. 16.

The circuit MP illustrated in FIG. 17 has a structure changed from that of the memory cell MC in FIG. 1A described in Embodiment 1, and the transistor M3 is replaced with a transistor M3a and a transistor M3b in the structure.

A first terminal of the transistor M3a is electrically connected to the second terminal of the transistor M2, a second terminal of the transistor M3a is electrically connected to the wiring RDL, and a gate of the transistor M3a is electrically connected to the wiring RWLa. A first terminal of the transistor M3b is electrically connected to the second terminal of the transistor M2, a second terminal of the transistor M3b is electrically connected to the wiring RDLr, and a gate of the transistor M3b is electrically connected to the wiring RWLb.

In addition, the circuit MPr illustrated in FIG. 17 has a structure similar to that of the circuit MP. Thus, "r" is added to the reference numerals of the circuit elements and the like included in the circuit MPr to differentiate them from the circuit elements and the like included in the circuit MP.

In the circuit MPr, a first terminal of the transistor M1r is electrically connected to the wiring WDLr and a gate of the transistor M1r is electrically connected to the wiring WWL. An input terminal of the FTJ element FJAr is electrically connected to the wiring FCA. An output terminal of the FTJ element FJAr is electrically connected to a second terminal of the transistor M1r, an input terminal of the FTJ element FJBr, and a gate of the transistor M2r. An output terminal of the FTJ element FJBr is electrically connected to the wiring FCB. A first terminal of the transistor M2r is electrically connected to the wiring VCEr and a second terminal of the transistor M2r is electrically connected to a first terminal of the transistor M3ar and a first terminal of the transistor M3br. A second terminal of the transistor M3ar is electrically connected to the wiring RDLr and a gate of the transistor M3ar is electrically connected to the wiring RWLa. A second terminal of the transistor M3br is electrically connected to the wiring RDL and a gate of the transistor M3br is electrically connected to the wiring RWLb.

The wiring WDL and the wiring WDLr function as wirings for transmitting the first data to be written to the circuit MP and the circuit MPr of the memory cell MC, for example. Note that the first data is expressed by a pair of signals transmitted to the wiring WDL and the wiring WDLr.

The wiring RDL functions as a wiring for transmitting the result of an arithmetic operation by the circuit MP or the circuit MPr of the memory cell MC as data, for example. Like the wiring RDL, the wiring RDLr functions as a wiring for transmitting the result of an arithmetic operation by the circuit MP or the circuit MPr of the memory cell MC as data, for example.

The wiring WWL functions as a wiring for selecting the memory cell MC as a target for data writing, for example. In other words, the wiring WWL may function as a write word line.

The wiring RWLa and the wiring RWLb function as wirings for transmitting the second data, for example. Note that the second data is expressed by a pair of signals transmitted to the wiring RWLa and the wiring RWLb.

As in the memory cell MC in FIG. 1 described in Embodiment 1, the wiring FCA and the wiring FCB function as wirings supplying potentials that cause polarization in the materials that can show ferroelectricity and are included in the FTJ element FJA, the FTJ element FJB, the FTJ element FJAr, and the FTJ element FJBr in writing the first data to the circuit MP and the circuit MPr, for example. The wiring FCA and the wiring FCB also function as wirings supplying potentials that do not change polarization in the dielectrics in calculating the product of the first data and the second data in the memory cell MC, for example. The potential may be a pulse voltage.

The wiring VCE functions as a wiring that supplies a constant voltage, for example. The constant voltage can be, for example, a high-level potential, a low-level potential, a ground potential, or the like. The potential supplied by the wiring VCE may be a pulse voltage.

The wiring VCEr functions as a wiring that supplies a constant voltage, for example. The constant voltage can be, for example, a high-level potential, a low-level potential, a ground potential, or the like. The potential supplied by the wiring VCEr may be a pulse voltage. Note that in the case where the voltage supplied by the wiring VCEr is the same as the voltage supplied by the wiring VCE, a conducting state may be established between the wiring VCE and the wiring VCEr.

The circuit WDD is electrically connected to the wiring WDL[1] to the wiring WDL[n] and the wiring WDLr[1] to the wiring WDLr[n]. The circuit RWD is electrically connected to the wiring RWLa[1] to the wiring RWLa[m] and the wiring RWLb[1] to the wiring RWLb[m]. The circuit WWD is electrically connected to the wiring WWL[1] to the wiring WWL[m]. The circuit FECD is electrically connected to the wiring FCA[1] to the wiring FCA[m] and the wiring FCB[1] to the wiring FCB[m]. The circuit RDD is electrically connected to the wiring RDL[1] to the wiring RDL[n] and the wiring RDLr[1] to the wiring RDLr[1].

For the circuit WWD, the circuit WWD of the memory device 100 in FIG. 10 described in Embodiment 2 is referred to. For the circuit FECD, the circuit FECD of the memory device 100 in FIG. 10 described in Embodiment 2 is referred to.

The circuit WDD functions as a circuit that supplies the first data to the wiring WDL[j] and the wiring WDLr[j] in the j-th column, for example. The circuit WDD may be configured to be capable of supplying the first data to the wiring WDL[1] to the wiring WDL[n] and the wiring WDLr[1] to the wiring WDLr[n] at a time.

The circuit RWD functions as a circuit that supplies the second data to the wiring RWLa[i] and the wiring RWLb[i], for example. The circuit RWD may be configured to be capable of supplying the second data to the wiring RWLa[1] to the wiring RWLa[m] and the wiring RWLb[1] to the wiring RWLb[m] at a time.

Here, as the first data, potentials supplied to the circuit MP and the circuit MPr of the memory cell MC are defined as follows.

In the case where "1" is retained in the memory cell MC as the first data, the potential $V_1$ is supplied from the wiring WDL to the circuit MP and the potential $V_0$ is supplied from the wiring WDLr to the circuit MPr. In the case where "−1" is retained in the memory cell MC as the first data, the potential $V_0$ is supplied from the wiring WDL to the circuit MP and the potential $V_1$ is supplied from the wiring WDLr to the circuit MPr. In the case where "0" is retained in the memory cell MC as the first data, the potential $V_0$ is supplied from the wiring WDL to the circuit MP and the potential $V_0$ is supplied from the wiring WDLr to the circuit MPr.

That is, as in the period from Time T23 to Time T26 in the timing chart in FIG. 3A or FIG. 3B, in the case where the potential $V_M$ is input to the wiring FCA and the potential $V_{OB}$ is input to the wiring FCB, the potential of the gate of the transistor M2 is $V_{HLD1}$ and the potential of the gate of the transistor M2r is $V_{HLD0}$ when the memory cell MC retains the first data "1". Moreover, the potential of the gate of the transistor M2 is $V_{HLD0}$ and the potential of the gate of the transistor M2r is $V_{HLD1}$ when the memory cell MC retains the first data "−1". Furthermore, the potential of the gate of the transistor M2 is $V_{HLD0}$ and the potential of the gate of the transistor M2r is $V_{HLD0}$ when the memory cell MC retains the first data "0".

Note that in the arithmetic circuit 110, the transistor M2 is preferably in an off state when the potential of the gate of the transistor M2 included in the circuit MP is $V_{HLD0}$. Moreover, the transistor M2r is preferably in an off state when the potential of the gate of the transistor M2r included in the circuit MPr is $V_{HLD0}$. Note that in this embodiment, the transistor M2 is in an off state when the potential of the gate of the transistor M2 included in the circuit MP is $V_{HLD0}$ and the transistor M2r is in an off state when the potential of the gate of the transistor M2r included in the circuit MPr is $V_{HLD0}$.

In the arithmetic circuit 110, when the potential of the gate of the transistor M2 included in the circuit MP is $V_{HLD1}$ and a predetermined potential is input to the second terminal of the transistor M2, a current having the current amount of $I_{MP}$ flows between the first terminal and the second terminal of the transistor M2. Similarly, when the potential of the gate of the transistor M2r included in the circuit MPr is $V_{HLD1}$ and a predetermined potential is input to the second terminal of the transistor M2r, a current having the current amount of $I_{MP}$ flows between the first terminal and the second terminal of the transistor M2r.

Here, as the second data, potentials supplied to the wiring RWLa and the wiring RWLb are defined as follows.

In the case where "1" is input to the memory cell MC as the second data, high-level potentials are supplied from the wiring RWLa to the circuit MP and the circuit MPr and low-level potentials are supplied from the wiring RWLb to the circuit MP and the circuit MPr. In the case where "−1" is input to the memory cell MC as the second data, low-level potentials are supplied from the wiring RWLa to the circuit MP and the circuit MPr and high-level potentials are supplied from the wiring RWLb to the circuit MP and the circuit MPr. In the case where "0" is input to the memory cell MC as the second data, low-level potentials are supplied from the wiring RWLa to the circuit MP and the circuit MPr and low-level potentials are supplied from the wiring RWLb to the circuit MP and the circuit MPr.

In other words, when "1" is input to the memory cell MC as the second data, the transistor M3a is in an on state and the transistor M3b is in an off state in the circuit MP and the transistor M3ar is in an on state and the transistor M3br is in an off state in the circuit MPr, so that a conducting state is established between the circuit MP and the wiring RDL[j], a conducting state is established between the circuit MPr and the wiring RDLr[j], a non-conducting state is established between the circuit MP and the wiring RDLr[j], and a non-conducting state is established between the circuit MPr and the wiring RDL[j]. When "−1" is input to the memory cell MC as the second data, the transistor M3a is in an off state and the transistor M3b is in an on state in the circuit MP and the transistor M3ar is in an off state and the transistor M3br is in an on state in the circuit MPr, so that a non-conducting state is established between the circuit MP and the wiring RDL[j], a non-conducting state is established between the circuit MPr and the wiring RDLr[j], a conducting state is established between the circuit MP and the wiring RDLr[j], and a conducting state is established between the circuit MPr and the wiring RDL[j]. When "0" is input to the memory cell MC as the second data, the transistor M3a is in an off state and the transistor M3b is in an off state in the circuit MP and the transistor M3ar is in an off state and the transistor M3br is in an off state in the circuit MPr, so that a non-conducting state is established between the circuit MP and the wiring RDL[j], a non-conducting state is established between the circuit MPr and the wiring RDLr[j], a non-conducting state is established between the circuit MP and the wiring RDLr[j], and a non-conducting state is established between the circuit MPr and the wiring RDL[j].

When the first data retained in the memory cell MC and the second data input to the memory cell MC are defined in the above-described manner, currents flowing between the memory cell MC and the wiring RDL and between the memory cell MC and the wiring RDLr are as follows.

TABLE 3

| First data | Second data | First data × Second data | Amount of current flowing between circuit MP or circuit MPr and wiring RDL | Amount of current flowing between circuit MP or circuit MPr and wiring RDLr |
|---|---|---|---|---|
| 1 | 1 | 1 | $I_{MP}$ | 0 |
| 1 | −1 | −1 | 0 | $I_{MP}$ |
| 1 | 0 | 0 | 0 | 0 |
| −1 | 1 | −1 | 0 | $I_{MP}$ |
| −1 | −1 | 1 | $I_{MP}$ | 0 |
| −1 | 0 | 0 | 0 | 0 |
| 0 | 1 | 0 | 0 | 0 |
| 0 | −1 | 0 | 0 | 0 |
| 0 | 0 | 0 | 0 | 0 |

That is, when the product of the first data and the second data is "1", a current having the current amount of $I_{MP}$ flows between the circuit MP or the circuit MPr and the wiring RDL as the arithmetic operation result; when the product of the first data and the second data is "−1", a current having the current amount of $I_{MP}$ flows between the circuit MP or the circuit MPr and the wiring RDLr as the arithmetic operation result; and when the product of the first data and the second data is "0", currents having the current amount of 0 flow between the circuit MP or the circuit MPr and the wiring RDL and between the circuit MP or the circuit MPr and the wiring RDLr as the arithmetic operation results (currents do not flow between the circuit MP or the circuit MPr and the wiring RDL and between the circuit MP or the circuit MPr and the wiring RDLr). As described above, the memory cell MC retains the first data and then the second data is input to the memory cell MC, whereby the memory cell MC can calculate the product of the first data and the second data.

Next, the case is considered where the plurality of pieces of second data are supplied to the wiring RWLa[1] to the wiring RWLa[m] and the wiring RWLb[1] to the wiring RWLb[m] at a time while the first data are retained in the plurality of memory cells MC included in the memory cell array MCA. Note that W[i,j] represents the first data retained in the memory cell MC[i,j] (i is an integer greater than or equal to 1 and less than or equal to m and j is an integer greater than or equal to 1 and less than or equal to n), and X[i] represents the second data supplied to the wiring RWL[i].

For example, when X[1] to X[m] are input from the wiring RWLa[1] to the wiring RWLa[m] and the wiring RWLb[1] to the wiring RWLb[m] as the second data to the memory cell MC[1,j] to the memory cell MC[m,j] in the j-th column, the memory cell MC[1,j] to the memory cell MC[m,j] perform arithmetic operations of W[1,j]×X[1] to W[m,j]×X[m], respectively.

The products of the first data and the second data are "1", "−1", and "0", so that among the memory cell MC[1,j] to the memory cell MC[m,j], the number of memory cells MC with which the product of the first data and the second data becomes "1" is P, the number of memory cells MC with which the product of the first data and the second data becomes "−1" is Q, and the number of memory cells MC with which the product of the first data and the second data becomes "0" is R (P, Q, and R are integers that are greater than or equal to 0 and satisfy P+Q+R=m). At this time, the sum of the currents flowing through the wiring RDL[j] is $P \times I_{MP}$ and the sum of the currents flowing through the wiring RDLr[j] is $Q \times I_{MP}$.

Here, for example, the circuit RDD has a function of obtaining a difference between the amount $P \times I_{MP}$ of a current flowing through the wiring RDL[j] and the amount $Q \times I_{MP}$ of a current flowing through the wiring RDLr[j] and converting the difference into a voltage value, whereby the results of product-sum operations of the plurality of pieces of first data and the plurality of pieces of second data in the memory cell MC[1,j] to the memory cell MC[m,j] can be output as the voltage value.

The circuit RDD may be configured to further perform an arithmetic operation of a function using the product-sum result. For example, the circuit RDD can perform an arithmetic operation of an artificial neural network by performing an arithmetic operation of an activation function using the product-sum result. As the activation function, for example, a sigmoid function, a tanh function, a softmax function, a ReLU function, or a threshold function can be used.

The above description is made on the results of the product-sum operations of the plurality of pieces of first data and the plurality of pieces of second data in the memory cell MC[1,j] to the memory cell MC[m,j] arranged in the j-th column, but the plurality of pieces of the second data are transmitted through the wiring RWLa[1] to the wiring RWLa[m] and the wiring RWLb[1] to the wiring RWLb[m] extending in the row direction and thus product-sum operations can be performed in columns other than the j-th column. That is, in the case where the arithmetic circuit 110 executes a product-sum operation, product-sum operations whose number is the same as that of the columns (n in FIG. 16) can be executed at a time.

Although the case where the first data has three levels of "1", "0", and "−1" is described above, the first data sometimes can be processed as binary data, data having four or more levels, or an analog value by changing an operation method or changing a circuit structure, for example.

Although the case where the second data has three levels of "1", "0", and "−1" is described above, the second data can be processed as binary data, data having four or more levels, or an analog value by changing an operation method or changing a circuit structure, for example.

In the operation of the arithmetic circuit described above, for example, a pulse voltage is used as the potential corresponding to the second data supplied to each of the wiring RWLa and the wiring RWLb. Here, in the case where a pulse voltage input through either the wiring RWLa or the wiring RWLb is a high-level potential, the transistor M3a and the transistor M3ar or the transistor M3b and the transistor M3br are in an on state only for the input time of the pulse voltage.

Here, in the case where the potential of the gate of the transistor M2 of the circuit MP is $V_{HLD1}$ and the potential of the gate of the transistor M2r of the circuit MP is $V_{HLD0}$ (i.e., in the case where the first data retained in the memory cell MC is "1"), a current flows from the circuit MP to the wiring RDL or the wiring RDLr only for the input time. In the case where the potential of the gate of the transistor M2 of the circuit MP is $V_{HLD0}$ and the potential of the gate of the transistor M2r of the circuit MP is $V_{HLD1}$ (i.e., in the case where the first data retained in the memory cell MC is "−1"), a current flows from the circuit MPr to the wiring RDL or the wiring RDLr only for the input time. That is, to the wiring RDL or the wiring RDLr, a charge whose amount depends on the time of inputting the pulse voltages to the wiring RWLa and the wiring RWLb flows.

As an example, the case where "1" is retained in the memory cell MC as the first data is considered. When the second data is "1", a high-level potential and a low-level potential are respectively supplied to the wiring RWLa and the wiring RWLb for input time $T_{ut}$. Here, the amount of a charge flowing between the circuit MP of the memory cell MC and the wiring RDL is $T_{ut} \times I_{MP}$; the amount of a charge flowing between the circuit MPr of the memory cell MC and the wiring RDL is 0; the amount of a charge flowing between the circuit MP of the memory cell MC and the wiring RDLr is 0; and the amount of a charge flowing between the circuit MPr of the memory cell MC and the wiring RDLr is 0.

When the second data is "2", a high-level potential and a low-level potential are respectively supplied to the wiring RWLa and the wiring RWLb for input time $2 \times T_{ut}$. Here, the amount of a charge flowing between the circuit MP of the memory cell MC and the wiring RDL is $2 \times T_{ut} \times I_{MP}$; the amount of a charge flowing between the circuit MPr of the memory cell MC and the wiring RDL is 0; the amount of a charge flowing between the circuit MP of the memory cell MC and the wiring RDLr is 0; and the amount of a charge flowing between the circuit MPr of the memory cell MC and the wiring RDLr is 0.

When the second data is "−2", a low-level potential and a high-level potential are respectively supplied to the wiring RWLa and the wiring RWLb for input time $2 \times T_{ut}$. Here, the amount of a charge flowing between the circuit MP of the memory cell MC and the wiring RDL is 0; the amount of a charge flowing between the circuit MPr of the memory cell MC and the wiring RDL is 0; the amount of a charge flowing between the circuit MP of the memory cell MC and the wiring RDLr is $2 \times T_{ut} \times I_{MP}$; and the amount of a charge flowing between the circuit MPr of the memory cell MC and the wiring RDLr is 0.

As described above, by extending or shortening the input time of pulse voltages supplied to the wiring RWLa and the wiring RWLb, the amount of a charge flowing between the circuit MP or the circuit MPr of the memory cell MC and the wiring RDL and the amount of a charge flowing between the circuit MP or the circuit MPr of the memory cell MC and the wiring RDLr can be changed. Specifically, the amount of a charge flowing through each of the wiring RDL and the wiring RDLr is proportional to the input time of the pulse voltages, so that by determining the input time in accordance with the value of the second data, the memory cell MC can flow, to the wiring RDL or the wiring RDLr, a charge whose amount corresponds to the result of the product of the first data and the second data, which is binary data, data having four or more levels, or an analog value.

When the circuit RDD here has a structure including, for example, a circuit that converts the amount of a charge flowing through the wiring RDL and the amount of a charge flowing through the wiring RDLr into voltage values (e.g., a QV converter circuit or an integrator circuit), the circuit RDD can obtain the amount of a charge flowing through the wiring RDL and the amount of a charge flowing through the wiring RDLr as voltage values.

When the circuit RDD has a structure including, for example, a circuit that compares the voltage value corresponding to the amount of a charge flowing through the wiring RDL and the voltage value corresponding to the amount of a charge flowing through the wiring RDLr and outputs the comparison result as a voltage value, the circuit RDD can output the results of product-sum operations of the plurality of pieces of first data and the plurality of pieces of second data in the memory cell MC[1,j] to the memory cell MC[m,j] as the voltage value.

Although the above example describes the operation in which pulse voltages are supplied to the wiring RWLa and the wiring RWLb, the product-sum operation may be an operation in which a pulse voltage is supplied to at least one of the wiring VCE, the wiring VCEr, the wiring FCA, the wiring FCB, and the like. For example, at the timing when a charge is made to flow between the memory cell MC and the wiring RDL, predetermined voltages are input to the wiring VCE and the wiring VCEr as pulse voltages. As another example, at the timing when a charge is made to flow between the memory cell MC and the wiring RDL, predetermined voltages are input to the wiring FCA and the wiring FCB as pulse voltages.

Note that this embodiment can be combined with any of the other embodiments in this specification as appropriate.

Embodiment 4

This embodiment describes a memory cell that is different from the memory cell described in the above embodiment and can be applied to a semiconductor device of one embodiment of the present invention.

Structure Example

Figure 18A:
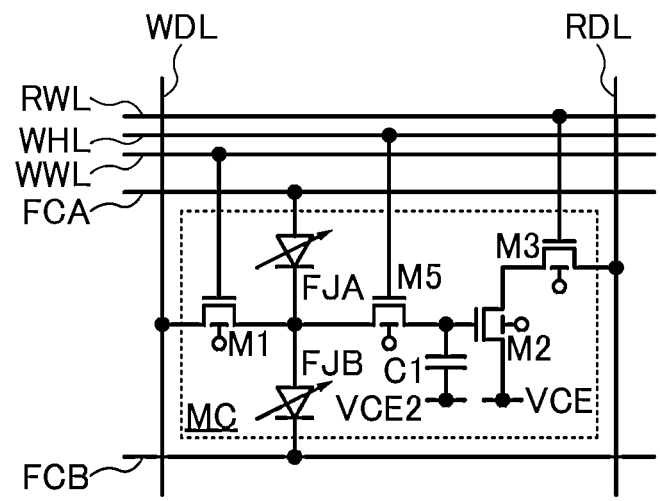
FIG. 18A and FIG. 18B are circuit diagrams each showing a structure example of a memory cell of a memory device.
Figure 18B:
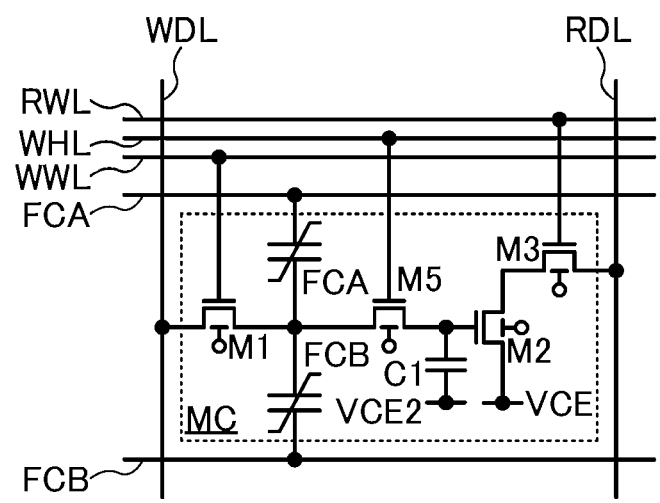

FIG. 18A and FIG. 18B each show a circuit structure example of the memory cell MC that can be included in a memory device that is a semiconductor device of one embodiment of the present invention. Note that the memory cell MC illustrated in each of FIG. 18A and FIG. 18B has a circuit structure in which data is not broken in an operation of reading the data and the data can be refreshed.

The structure of the memory cell MC in FIG. 18A is the structure of the memory cell MC in FIG. 1A to which a transistor M5 and a capacitor C1 are added, for example. Moreover, the memory cell MC in FIG. 18A is different from the memory cell MC in FIG. 1A in that the second terminal of the transistor M1, the output terminal of the FTJ element FJA, and the input terminal of the FTJ element FJB are electrically connected to the gate of the transistor M2 through a space between a first terminal and a second terminal of the transistor M5.

For example, in the memory cell MC in FIG. 18A, the first terminal of the transistor M5 is electrically connected to the second terminal of the transistor M1, the output terminal of the FTJ element FJA, and the input terminal of the FTJ element FJB. The second terminal of the transistor M5 is electrically connected to a first terminal of the capacitor C1 and the gate of the transistor M2 and a second terminal of the capacitor C1 is electrically connected to a wiring VCE2. A gate of the transistor M5 is electrically connected to a wiring WHL.

The structure of the memory cell MC in FIG. 18B is the structure of the memory cell MC in FIG. 4A to which the transistor M5 and the capacitor C1 are added, for example. Moreover, the memory cell MC in FIG. 18B is different from the memory cell MC in FIG. 4A in that the second terminal of the transistor M1, an output terminal of the ferroelectric capacitor FEA, and an input terminal of the ferroelectric capacitor FEB are electrically connected to the gate of the transistor M2 through a space between the first terminal and the second terminal of the transistor M5.

For example, in the memory cell MC in FIG. 18B, the first terminal of the transistor M5 is electrically connected to the second terminal of the transistor M1, the output terminal of the ferroelectric capacitor FEA, and the input terminal of the ferroelectric capacitor FEB. The second terminal of the transistor M5 is electrically connected to the first terminal of the capacitor C1 and the gate of the transistor M2 and the second terminal of the capacitor C1 is electrically connected to the wiring VCE2. The gate of the transistor M5 is electrically connected to the wiring WHL.

As the transistor M5 in FIG. 18A and FIG. 18B, it is possible to use a transistor that can be used as any of the transistor M1 to the transistor M3 included in the memory cell MC in FIG. 1A, for example.

The wiring VCE2 functions as a wiring that supplies a constant voltage, for example. The constant voltage can be, for example, a high-level potential, a low-level potential, a ground potential, or the like. The wiring VCE2 may be a wiring that is the same as the wiring VCE, for example. That is, a voltage supplied by the wiring VCE2 may be the same as a voltage supplied by the wiring VCE.

The wiring WHL functions as a wiring for transmitting a control signal for switching the conducting state and the non-conducting state of the transistor M5, for example. By supplying a high-level potential to the wiring WHL, the transistor M5 is brought into a conducting state and data transmitted to the memory cell MC can be written to the first terminal of the capacitor C1, for example. After that, by supplying a low-level potential to the wiring WHL, the transistor M5 is brought into a non-conducting state and the data can be retained in the first terminal of the capacitor C1.

Note that in the memory cell MC in FIG. 18A, for the parts where the content overlaps with that of the memory cell MC in FIG. 1A, the description of the memory cell MC in FIG. 1A in Embodiment 1 is referred to. In the memory cell MC in FIG. 18B, for the parts where the content overlaps with that of the memory cell MC in FIG. 4A, the description of the memory cell MC in FIG. 4A in Embodiment 1 is referred to.

Operation Examples

Next, examples of a data writing operation and a data reading operation in the memory cell MC in FIG. 18A will be described.

<<Data Writing Operation Example>>

Figure 19:
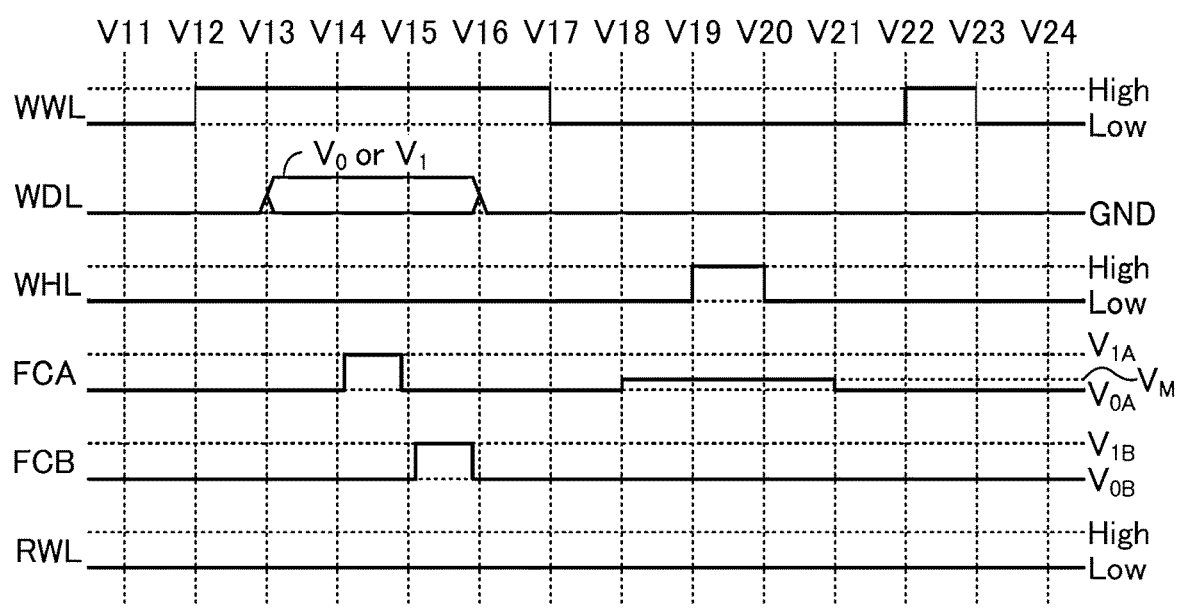
FIG. 19 is a timing chart showing an operation example of a memory cell of a memory device.

FIG. 19 is a timing chart showing an example of a data writing operation in the memory cell MC in FIG. 18A. The timing chart in FIG. 19 shows changes in the potentials of the wiring WWL, the wiring WDL, the wiring WHL, the wiring FCA, the wiring FCB, and the wiring RWL in the period from Time V11 to Time V24 and time around the period.

Note that the operation example in the period from Time V11 to Time V18 in the timing chart in FIG. 19 is similar to the operation example in the period from Time T11 to Time T18 in the timing chart in FIG. 2. Thus, the operation example of the memory cell MC in FIG. 1A in the period from Time T11 to Time T18 in the timing chart in FIG. 2 is referred to for the operation example of the memory cell MC in FIG. 18A in the period from Time V11 to Time V18.

Note that in the period from Time V11 to Time V19 in the timing chart in FIG. 19, a low-level potential (denoted by Low in FIG. 19) is supplied to the wiring WHL. Thus, in the period from Time V11 to Time V19, the low-level potential is input to the gate of the transistor M5, so that the transistor M5 is turned off.

In this operation example, the potential of the wiring RDL does not change and thus is not shown in the timing chart in FIG. 19. The potential of the wiring RDL in the period from Time V11 to Time V24 is not particularly limited.

Although a potential supplied by the wiring VCE can be a high-level potential, a low-level potential, a ground potential, or the like as described above, the low-level potential $V_{SS}$ is used in this operation example. In addition, although a potential supplied by the wiring VCE2 can be a high-level potential, a low-level potential, a ground potential, or the like as described above, the low-level potential $V_{SS}$ is used in this operation example.

[From Time V18 to Time V19]

In the period from Time V18 to Time V19, the potential $V_M$ is supplied to the wiring FCA and the potential $V_{OB}$ is supplied to the wiring FCB. Note that $V_M$ is a potential higher than $V_{OA}$ and $V_{OB}$ and lower than $V_{1A}$, like $V_M$ described with reference to the timing chart in FIG. 3A. When the potential of the wiring FCB is $V_{OB}$, $V_M$ is a potential that does not cause a change in polarization (does not cause a change in the polarization direction) in the FTJ element FJA and the FTJ element FJB.

The potential $V_M$ may be a voltage lower than or equal to the threshold voltage $V_{th}$ of the transistor M5 or a voltage obtained by adding approximately 1 V to a voltage lower than or equal to $V_{th}$, for example. By defining the potential $V_M$ as described above, the amount of a current flowing between the first terminal and the second terminal of the transistor M5 can be increased in some cases.

Here, a voltage of $V_M - V_{OB}$ is applied between the wiring FCA and the wiring FCB, so that voltages obtained by dividing the voltage are applied to the FTJ element FJA and the FTJ element FJB. For example, the following case is considered: the voltage $V_M - V_{OB}$ is applied between the wiring FCA and the wiring FCB and the divided voltages are applied to the FTJ element FJA and the FTJ element FJB at a ratio of a:b (a and b are positive real numbers). When a voltage between the input terminal and the output terminal of the FTJ element FJA is $V_{FJA}$, $V_{FJA} = (V_M - V_{OB}) \times a/(a+b)$ is satisfied, and when a voltage between the input terminal and the output terminal of the FTJ element FJB is $V_{FJB}$, $V_{FJB} = (V_M - V_{OB}) \times b/(a+b)$ is satisfied. Note that $V_{FJA}$ and $V_{FJB}$ satisfy the relation of $V_M - V_{OB} = V_{FJA} + V_{FJB}$.

In the FTJ element FJA, when the polarization direction is a direction from the input terminal (the wiring FCA) to the output terminal (a positive direction), $V_{FJA}$ is high, and when the polarization direction is a direction from the output terminal to the input terminal (the wiring FCA) (a negative direction), $V_{FJA}$ is low. Similarly, in the FTJ element FJB, when the polarization direction is a direction from the output terminal (the wiring FCB) to the input terminal (a negative direction), $V_{FJB}$ is low, and when the polarization direction is a direction from the input terminal to the output terminal (the wiring FCB) (a positive direction), $V_{FJB}$ is high.

Here, when the potential written to the memory cell MC is $V_0$ in the period from Time V13 to Time V16 in the timing chart in FIG. 19, for example, the polarization direction in the FTJ element FJA is a direction from the input terminal (the wiring FCA) to the output terminal (a positive direction) so that $V_{FJA}$ is high and the polarization direction in the FTJ element FJB is a direction from the output terminal (the wiring FCB) to the input terminal (a negative direction) so that $V_{FJB}$ is low. In other words, the ratio a:b of the divided voltages applied to the FTJ element FJA and the FTJ element FJB is a>b. Here, the potential of the first terminal of the transistor M5 (the output terminal of the FTJ element FJA and the input terminal of the FTJ element FJB) is $V_{HLD0}$.

When the potential written to the memory cell MC is $V_1$ in the period from Time V13 to Time V16 in the timing chart in FIG. 19, for example, the polarization direction in the FTJ element FJA is a direction from the output terminal to the input terminal (the wiring FCA) (a negative direction) so that $V_{FJA}$ is low and the polarization direction in the FTJ element FJB is a direction from the input terminal to the output terminal (the wiring FCB) (a positive direction) so that $V_{FJB}$ is high. In other words, the ratio a:b of the divided voltages applied to the FTJ element FJA and the FTJ element FJB is b>a. Here, the potential of the first terminal of the transistor M5 (the output terminal of the FTJ element FJA and the input terminal of the FTJ element FJB) is $V_{HLD1}$.

The voltage $V_{FJB}$ between the input terminal and the output terminal of the FTJ element FJB is higher in the case where the potential written to the memory cell MC is $V_1$ than in the case where the potential is $V_0$. Thus, when the potential $V_{OB}$ supplied by the wiring FCB is used as a reference, the potential of the first terminal of the transistor M5 (the output terminal of the FTJ element FJA and the input terminal of the FTJ element FJB) is higher in the case where the potential written to the memory cell MC is $V_1$ than in the case where the potential is $V_0$. That is, $V_{HLD1} > V_{HLD0}$ is satisfied.

[From Time V19 to Time V20]

In the period from Time V19 to Time V20, the potential supplied by the wiring WHL changes from a low-level potential to a high-level potential (denoted by High in FIG. 19). Thus, the high-level potential is input to the gate of the transistor M5, so that the transistor M5 is turned on.

When the transistor M5 is turned on, a conducting state is established between the first terminal of the transistor M5 (the output terminal of the FTJ element FJA and the input terminal of the FTJ element FJB), and the gate of the transistor M2 and the first terminal of the capacitor C1. In the period from Time V19 to Time V20, $V_M$ is supplied from the wiring FCA and $V_{OB}$ is supplied from the wiring FCB, so that the potentials of the gate of the transistor M2 and the first terminal of the capacitor C1 are each $V_{HLD0}$ or $V_{HLD1}$.

[From Time V20 to Time V21]

In the period from Time V20 to Time V21, the potential supplied by the wiring WHL changes from a high-level potential to a low-level potential. Thus, the low-level potential is input to the gate of the transistor M5, so that the transistor M5 is turned off.

When the transistor M5 is turned off, a non-conducting state is established between the first terminal of the transistor M5 (the output terminal of the FTJ element FJA and the input terminal of the FTJ element FJB), and the gate of the transistor M2 and the first terminal of the capacitor C1. Accordingly, the potential $V_{HLD0}$ or $V_{HLD1}$ of the gate of the transistor M2 is retained by the capacitor C1.

[From Time V21 to Time V22]

In the period from Time V21 to Time V22, the potential $V_{OA}$ is supplied to the wiring FCA and the potential $V_{OB}$ is supplied to the wiring FCB. That is, the potentials supplied by the wiring FCA and the wiring FCB after Time V21 are similar to the potentials supplied by the wiring FCA and the wiring FCB before Time V18.

[From Time V22 to Time V23]

In the period from Time V22 to Time V23, the potential supplied by the wiring WWL changes from a low-level potential to a high-level potential. Thus, the high-level potential is input to the gate of the transistor M1, so that the transistor M1 is turned on. That is, a conducting state is established between the wiring WDL and the first terminal of the transistor M5 (the output terminal of the FTJ element FJA and the input terminal of the FTJ element FJB). Thus, the ground potential supplied by the wiring WDL is supplied to the first terminal of the transistor M5 (the output terminal of the FTJ element FJA and the input terminal of the FTJ element FJB). Accordingly, the potential of the gate of the transistor M2 (the output terminal of the FTJ element FJA and the input terminal of the FTJ element FJB) becomes the ground potential.

Note that in the operation example of the memory cell MC in FIG. 18, the operation in the period from Time V22 to Time V23 is not essential and may be omitted.

[From Time V23 to Time V24]

In the period from Time V23 to Time V24, the potential supplied by the wiring WWL changes from a high-level potential to a low-level potential. Thus, the high-level potential is input to the gate of the transistor M1, so that the transistor M1 is turned off. That is, a non-conducting state is established between the wiring WDL and the first terminal of the transistor M5 (the output terminal of the FTJ element FJA and the input terminal of the FTJ element FJB).

Through the above-described operation in the period from Time V23 to Time V24, data can be written to the memory cell MC in FIG. 18.

<<Data Reading Operation Example>>

Figure 20A:
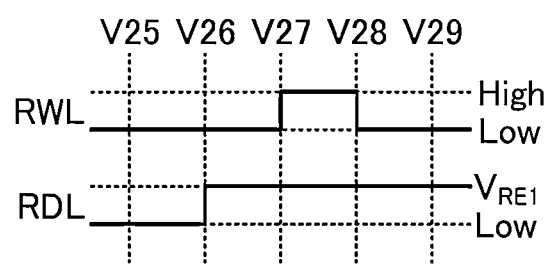
FIG. 20A and FIG. 20B are timing charts each showing an operation example of a memory cell of a memory device.

FIG. 20A is a timing chart showing an example of a data reading operation in the memory cell MC in FIG. 18A. The timing chart in FIG. 20A shows changes in the potentials of the wiring RWL and the wiring RDL in the period from Time V25 to Time V29 and time around the period.

Note that as an operation before Time V25 shown in the timing chart in FIG. 20A, the operation example in the timing chart in FIG. 19 is performed. That is, in the memory cell MC in FIG. 18A, the potentials of the gate of the transistor M2 and the first terminal of the capacitor C1 are each $V_{HLD0}$ or $V_{HLD1}$ due to the operation example in the timing chart in FIG. 19.

In this operation example, the potentials of the wiring WWL, the wiring WDL, the wiring WHL, the wiring FCA, and the wiring FCB do not change and thus are not shown in the timing chart in FIG. 20A. The potentials of the wiring WWL, the wiring WDL, the wiring WHL, the wiring FCA, and the wiring FCB in the period from Time V25 to Time V29 are not particularly limited. In this operation example, a low-level potential is supplied to the wiring WWL, a ground potential is supplied to the wiring WDL, a low-level potential is supplied to the wiring WHL, the potential $V_{OA}$ is supplied to the wiring FCA, and the potential $V_{OB}$ is supplied to the wiring FCB, for example.

A low-level potential is supplied to the wiring WWL, so that the transistor M1 is in an off state. A low-level potential is supplied to the wiring WHL, so that the transistor M5 is in an off state.

[From Time V25 to Time V26]

In the period from Time V25 to Time V26, the potential of the wiring RWL is a low-level potential (denoted by Low in FIG. 20A). Thus, the low-level potential is input to the gate of the transistor M3, so that the transistor M3 is in an off state. The potential of the wiring RDL is a low-level potential.

[From Time V26 to Time V27]

In the period from Time V26 to Time V27, the potential $V_{RE1}$, which is a constant voltage, is supplied as the potential of the wiring RDL. Note that $V_{RE1}$ is a constant voltage for reading, which is higher than $V_{SS}$.

[From Time V27 to Time V28]

In the period from Time V27 to Time V28, the potential supplied by the wiring RWL changes from a low-level potential to a high-level potential (denoted by High in FIG. 20A). Thus, the high-level potential is input to the gate of the transistor M3, so that the transistor M3 is turned on.

The potential of the gate of the transistor M2 is $V_{HLD0}$ or $V_{HLD1}$ and the potential of the first terminal of the transistor M2 is $V_{SS}$. Moreover, the transistor M3 is in an on state, so that the constant potential $V_{RE1}$ higher than $V_{SS}$ is input from the wiring RDL to the second terminal of the transistor M2, for example. Here, when the gate-source voltage $V_{HLD0}$–$V_{SS}$ (or $V_{HLD1}$–$V_{SS}$) of the transistor M2 is higher than the threshold voltage $V_{th}$ of the transistor M2, a current corresponding to the gate-source voltage $V_{HLD0}$–$V_{SS}$ (or $V_{HLD1}$–$V_{SS}$) flows through the transistor M2.

In other words, by turning on the transistor M3, the amount of a current flowing through the wiring RDL is determined in accordance with the potential of the gate of the transistor M2. Specifically, $V_{HLD1}>V_{HLD0}$ is satisfied, so that the current flowing from the transistor M2 to the wiring RDL is higher in the case where the potential supplied from the wiring WDL to the memory cell MC is $V_1$ than in the case where the potential is $V_0$.

Here, by inputting the current flowing through the wiring RDL to a reading circuit (e.g., a current/voltage converter circuit) or the like, data retained in the memory cell MC can be read.

[From Time V28 to Time V29]

In the period from Time V28 to Time V29, the potential of the wiring RWL changes from a high-level potential to a low-level potential. Thus, the low-level potential is input to the gate of the transistor M3, so that the transistor M3 is turned off.

Through the above-described operation example in the period from Time V28 to Time V29, data written to the memory cell MC in FIG. 18A can be read. When the data is read from the memory cell MC in FIG. 18A, the polarization directions do not change in the FTJ element FJA and the FTJ element FJB; thus, the above-described data reading operation example is not destructive reading. That is, while the data written to the memory cell MC is retained, the data can be read from the memory cell MC.

In the reading operation example in the timing chart in FIG. 20A, although the potential supplied by the wiring VCE is the low-level potential $V_{SS}$, the potential supplied by the wiring VCE may be a high-level potential. A timing chart in FIG. 20B shows an operation example in the case where the potential supplied by the wiring VCE is a high-level potential in the reading operation example in the timing chart in FIG. 20A.

The reading operation example in the timing chart in FIG. 20B will be described below. Note that descriptions of the reading operation in the timing chart in FIG. 20B are omitted for the parts where the content overlaps with that of the reading operation in the timing chart in FIG. 20A. In this operation example, a high-level potential supplied by the wiring VCE is $V_{DD}$.

Figure 20B:
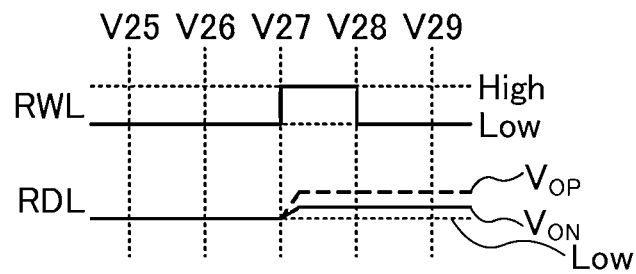

After Time V27 in the timing chart in FIG. 20B, changes in the potential of the wiring RDL are indicated by a solid line and a broken line. The potential change indicated by the solid line corresponds to the case where $V_0$ is input from the wiring WDL to the memory cell MC in the writing operation in the timing chart in FIG. 19, and the potential change indicated by the broken line corresponds to the case where $V_1$ is input from the wiring WDL to the memory cell MC in the writing operation in the timing chart in FIG. 19.

In the period from Time V25 to Time V27 in the timing chart in FIG. 20B, the wiring RDL is precharged to the low-level potential $V_{SS}$. After the wiring RDL is precharged, the wiring RDL is brought into a floating state.

In the period from Time V27 to Time V28, the potential of the wiring RWL changes from a low-level potential to a high-level potential. Thus, the high-level potential is input to the gate of the transistor M3, so that the transistor M3 is turned on.

At this time, the potential of the gate of the transistor M2 is $V_{HLD0}$ or $V_{HLD1}$ and the potential of the first terminal of the transistor M2 is $V_{DD}$. Moreover, the transistor M3 is in an on state, so that the potential used for precharging of the wiring RDL is input to the second terminal of the transistor M2. Here, when the gate-source voltage $V_{HLD0}$–$V_{SS}$ (or $V_{HLD1}$–$V_{SS}$) of the transistor M2 is higher than the threshold voltage $V_{th}$ of the transistor M2, the potential of the wiring RDL increases from $V_{SS}$ to a predetermined potential. For example, when the potential of the gate of the transistor M2 is $V_{HLD0}$, the potential of the wiring RDL ideally increases from $V_{SS}$ to $V_{HLD0}$–$V_{th}$ (denoted by VON in FIG. 20B). In addition, for example, when the potential of the gate of the transistor M2 is $V_{HLD1}$, the potential of the wiring RDL ideally increases from $V_{SS}$ to $V_{HLD1}$–$V_{th}$ (denoted by $V_{OP}$ in FIG. 20B).

As described above, even in the case where the potential supplied by the wiring VCE is a high-level potential, by setting the potential used for precharging of the wiring RDL to an optimal value, the data retained in the memory cell MC can be read as in the reading operation example in the timing chart in FIG. 20A.

Although the description is made on the example of the operation of reading the data retained in the memory cell MC by obtaining the current flowing through the wiring RDL or the potential of the wiring RDL in the period from Time V27 to Time V28 in each of the timing charts in FIG. 20A and FIG. 20B, the reading operation in the memory cell MC is not limited to the operation example described above.

For example, in the operation example in the timing chart in FIG. 20A, the data retained in the memory cell MC can be read by setting the potential supplied by the wiring VCE to $V_{DD}$, supplying to the wiring RDL a constant voltage for reading lower than $V_{DD}$ after Time V25, and obtaining the amount of a current flowing through the wiring RDL as in the operation in the timing chart in FIG. 20A.

The operations in the timing charts in FIG. 19, FIG. 20A, and FIG. 20B described in this embodiment are examples, and thus the operations can be changed according to circumstances or depending on the case. For example, although in the timing chart in FIG. 19, a high-level potential is supplied to the wiring WWL in the period from Time V12 to Time V17 and $V_0$ or $V_1$ is supplied to the wiring WDL in the period from Time V13 to Time V16, a high-level potential may be supplied to the wiring WWL in the period where $V_0$ or $V_1$ is supplied to the wiring WDL. The period where the potential $V_{1A}$ is supplied to the wiring FCA and the potential $V_{0B}$ is supplied to the wiring FCB and the period where the potential $V_{0A}$ is supplied to the wiring FCA and the potential $V_{1B}$ is supplied to the wiring FCB are provided at any timing in the period where a high-level potential is supplied to the wiring WWL and $V_0$ or $V_1$ is supplied to the wiring WDL. The period where the potential $V_{0A}$ is supplied to the wiring FCA and the potential $V_{1B}$ is supplied to the wiring FCB may precede the period where the potential $V_{1A}$ is supplied to the wiring FCA and the potential $V_{0B}$ is supplied to the wiring FCB. Moreover, in the timing chart in FIG. 19, although $V_M$ is supplied to the wiring FCA in the period from Time V18 to Time V21 and a high-level potential is supplied to the wiring WHL in the period from Time V19 to Time V20, for example, $V_M$ may be supplied to the wiring FCA in the period where a high-level potential is supplied to the wiring WHL.

Furthermore, in the timing chart in FIG. 19, although $V_M$ is supplied to the wiring FCA and $V_{0B}$ is supplied to the wiring FCB in the period from Time V18 to Time V21, $V_{0A}$ may be supplied to the wiring FCA and $V_M$ may be supplied to the wiring FCB at this time, for example.

<<Data Refresh Operation Example>>

In the case where the potential $V_{HLD0}$ or $V_{HLD1}$ retained in the first terminal of the capacitor C1 of each of the memory cells MC in FIG. 18A and FIG. 18B changes over time, the potential of the first terminal of the capacitor C1 of each of the memory cells MC in FIG. 18A and FIG. 18B can be reset to $V_{HLD0}$ or $V_{HLD1}$ by performing a predetermined operation. That is, the memory cells MC in FIG. 18A and FIG. 18B have a function of refreshing the retained data.

In the case of refreshing the potential retained in the first terminal of the capacitor C1 of the memory cell MC, the operation in the period from Time V18 to Time V24 in the timing chart in FIG. 19 is performed. The polarization directions in the materials that can show ferroelectricity of the FTJ element FJA and the FTJ element FJB are determined, so that by supplying the potential $V_M$ from the wiring FCA to the input terminal of the FTJ element FJA and supplying $V_{0B}$ from the wiring FCB to the output terminal of the FTJ element FJB, the potential of the first terminal of the transistor M5 (the output terminal of the FTJ element FJA and the input terminal of the FTJ element FJB) can be set to $V_{HLD0}$ or $V_{HLD1}$. Then, by turning on the transistor M5, the potentials of the first terminal of the capacitor C1 and the gate of the transistor M2 in the memory cell MC can be refreshed to be $V_{HLD0}$ or $V_{HLD1}$.

Note that this embodiment can be combined with any of the other embodiments in this specification as appropriate.

Embodiment 5

This embodiment describes a memory cell that is different from the memory cell described in the above embodiment and can be applied to a semiconductor device of one embodiment of the present invention.

Structure Example

Figure 21:
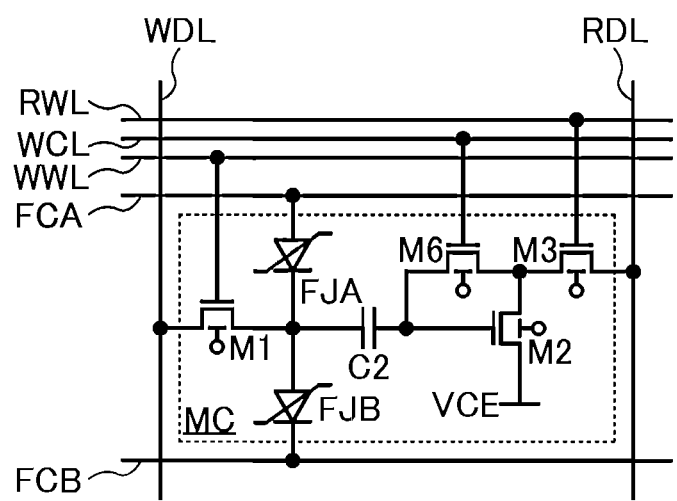
FIG. 21 is a circuit diagram showing a structure example of a memory cell of a memory device.

FIG. 21 shows a circuit structure example of the memory cell MC that can be included in a memory device that is a semiconductor device of one embodiment of the present invention. Note that like the memory cells MC in FIG. 18A and FIG. 18B, the memory cell MC illustrated in FIG. 21 has a circuit structure in which data is not broken in an operation of reading the data and the data can be refreshed.

The structure of the memory cell MC in FIG. 21 is the structure of the memory cell MC in FIG. 1A to which a transistor M6 and a capacitor C2 are added, for example. Moreover, the memory cell MC in FIG. 21 is different from the memory cell MC in FIG. 1A in that the second terminal of the transistor M1, the output terminal of the FTJ element FJA, and the input terminal of the FTJ element FJB are electrically connected to the gate of the transistor M2 through a space between a first terminal and a second terminal of the capacitor C2.

For example, in the memory cell MC in FIG. 21, the first terminal of the capacitor C2 is electrically connected to the second terminal of the transistor M1, the output terminal of the FTJ element FJA, and the input terminal of the FTJ element FJB. The second terminal of the capacitor C2 is electrically connected to a first terminal of the transistor M6 and the gate of the transistor M2. A second terminal of the transistor M6 is electrically connected to the second terminal of the transistor M2 and the first terminal of the transistor M3. A gate of the transistor M6 is electrically connected to a wiring WCL.

As the transistor M6, it is possible to use a transistor that can be used as any of the transistor M1 to the transistor M3 included in the memory cell MC in FIG. 1A, for example.

The wiring WCL functions as a wiring for transmitting a control signal for switching the conducting state and the non-conducting state of the transistor M6, for example. By supplying a high-level potential to the wiring WCL, the transistor M6 is brought into a conducting state, and by supplying a low-level potential to the wiring WCL, the transistor M6 is brought into a non-conducting state.

Note that in the memory cell MC in FIG. 21, for the parts where the content overlaps with that of the memory cell MC in FIG. 1A, the description of the memory cell MC in FIG. 1A in Embodiment 1 is referred to.

Operation Example

Next, an example of an operation of correcting the threshold voltage of the transistor M2 in the memory cell MC in FIG. 21 will be described.

Figure 22:
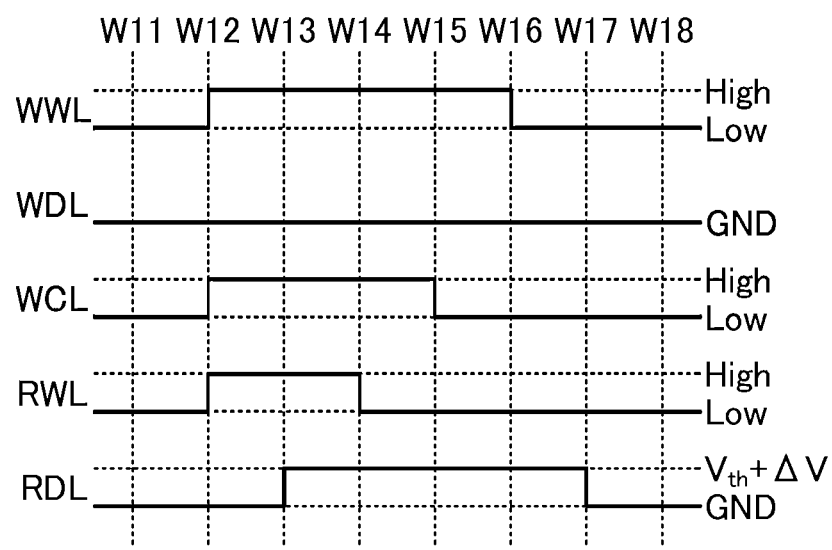
FIG. 22 is a timing chart showing an operation example of a memory cell of a memory device.

FIG. 22 is a timing chart showing the example of the operation of correcting the threshold voltage of the transistor M2 in the memory cell MC in FIG. 21. The timing chart in FIG. 22 shows changes in the potentials of the wiring WWL, the wiring WDL, the wiring WCL, the wiring RWL, and the wiring RDL in the period from Time W11 to Time W18 and time around the period.

In this operation example, the potentials of the wiring FCA and the wiring FCB do not change and thus are not shown in the timing chart in FIG. 22. Note that in this operation example, the potential $V_{0A}$ is supplied to the wiring FCA and the potential $V_{0B}$ is supplied to the wiring FCB.

Although a potential supplied by the wiring VCE can be a high-level potential, a low-level potential, a ground potential, or the like as described above, the low-level potential $V_{SS}$ is used in this operation example.

[From Time W11 to Time W12]

In the period from Time W11 to Time W12, the potentials of the wiring WWL, the wiring WCL, and the wiring RWL are low-level potentials (denoted by Low in FIG. 22). Thus, the low-level potentials are input to the gates of the transistor M1, the transistor M6, and the transistor M3 and the transistor M1, the transistor M6, and the transistor M3 are in an off state.

In the period from Time W11 to Time W12, ground potentials (denoted by GND in FIG. 22) are input to the wiring WDL and the wiring RDL, for example.

[From Time W12 to Time W13]

In the period from Time W12 to Time W13, the potentials supplied by the wiring WWL, the wiring WCL, and the wiring RWL change from low-level potentials to high-level potentials (denoted by High in FIG. 22). Thus, the high-level potentials are input to the gates of the transistor M1, the transistor M6, and the transistor M3, so that the transistor M1, the transistor M6, and the transistor M3 are turned on.

When the transistor M1 is turned on, a conducting state is established between the wiring WDL and the first terminal of the capacitor C2 (the output terminal of the FTJ element FJA and the input terminal of the FTJ element FJB). Therefore, the ground potential is input from the wiring WDL, so that the potential of the first terminal of the capacitor C2 (the output terminal of the FTJ element FJA and the input terminal of the FTJ element FJB) becomes the ground potential.

When the transistor M3 and the transistor M6 are turned on, a conducting state is established between the wiring RDL and the second terminal of the capacitor C2 (the gate of the transistor M2). Therefore, the ground potential is input from the wiring RDL, so that the potential of the second terminal of the capacitor C2 (the gate of the transistor M2) becomes the ground potential.

[From Time W13 to Time W14]

In the period from Time W13 to Time W14, the potential supplied by the wiring RDL changes from the ground potential to a potential higher than the threshold voltage $V_{th}$ of the transistor M2. The potential is $V_{th}+\Delta V$, for example.

Here, the transistor M3 is in an on state, so that $V_{th}+\Delta V$ is input from the wiring RDL to the second terminal of the transistor M2. Moreover, the transistor M6 is also in an on state, so that $V_{th}+\Delta V$ is input from the wiring RDL to each of the gate of the transistor M2 and the second terminal of the capacitor C2.

[From Time W14 to Time W15]

In the period from Time W14 to Time W15, the potential supplied by the wiring RWL changes from a high-level potential to a low-level potential. Thus, the low-level potential is input to the gate of the transistor M3, so that the transistor M3 is turned off.

Here, the transistor M6 is in an on state, so that a conducting state is established between the gate of the transistor M2 and the second terminal of the transistor M2. In addition, the potentials of the gate of the transistor M2 and the second terminal of the transistor M2 are each $V_{th}+\Delta V$ and the potential of the first terminal of the transistor M1 is the low-level potential $V_{SS}$, so that the transistor M2 is in an on state. Therefore, the potentials of the gate of the transistor M2 and the second terminal of the transistor M2 decrease until the transistor M2 is turned off. Specifically, when the gate-source voltage of the transistor M2 decreases to a threshold voltage, the transistor M2 is turned off; thus, the potential of the gate of the transistor M2 here is $V_{SS}+V_{th}$.

[From Time W15 to Time W16]

In the period from Time W15 to Time W16, the potential supplied by the wiring WCL changes from a high-level potential to a low-level potential. Thus, the low-level potential is input to the gate of the transistor M6, so that the transistor M6 is turned off.

A ground potential from the wiring WDL is supplied to the first terminal of the capacitor C2. Therefore, $V_{SS}+V_{th}$, which is the potential of the gate of the transistor M2, is retained in the second terminal of the capacitor C2.

By the above-described operation, the threshold voltage of the transistor M2 can be corrected. Accordingly, a variation in the threshold voltages of the transistors M2 included in the plurality of arranged memory cells MC can be reduced. Owing to the reduction in variation in the threshold voltages of the transistors M2, the amounts of currents read from the plurality of memory cells MC retaining the same data can be substantially the same.

[From Time W16 to Time W17]

In the period from Time W16 to Time W17, the potential supplied by the wiring WWL changes from a high-level potential to a low-level potential. Thus, the low-level potential is input to the gate of the transistor M1, so that the transistor M1 is turned off.

[From Time W17 to Time W18]

In the period from Time W17 to Time W18, the potential supplied by the wiring RDL changes from $V_{th}+\Delta V$ to a ground potential.

After that, in the memory cell MC in FIG. 21, for example, data is written in a manner similar to that in the operation example in the timing chart in FIG. 2 and the data is read in a manner similar to that in the operation example in the timing chart in FIG. 3A as in the memory cell MC in FIG. 1, so that a current flowing between the first terminal and the second terminal of the transistor M2 having the corrected threshold voltage can be processed as data for reading.

For example, when the operation in the period from Time T23 to Time T26 in the timing chart in FIG. 3A is performed in the memory cell MC having the structure in FIG. 21, the potential $V_M$ is input to the wiring FCA and the potential $V_{OB}$ is input to the wiring FCB, whereby the potentials of the output terminal of the FTJ element FJA and the input terminal of the FTJ element FJB each become $V_{HLD0}$ or $V_{HLD1}$. At this time, the potential of the gate of the transistor M2 becomes $V_{HLD0}-V_{SS}+V_{th}$ or $V_{HLD1}-V_{SS}+V_{th}$ due to capacitive coupling of the capacitor C2. Thus, the gate-source voltage of the transistor M2 becomes $V_{HLD0}+V_{th}$ or $V_{HLD1}+V_{th}$. Therefore, in the case where the transistor M2 operates in a saturation region, the amount of a current flowing between the first terminal and the second terminal of the transistor M2 does not depend on the threshold voltage of the transistor M2; thus, the influence of the variation in the threshold voltages of the transistors M2 on the data read from the memory cell MC can be reduced.

Note that this embodiment can be combined with any of the other embodiments in this specification as appropriate.

Embodiment 6

This embodiment describes structure examples of the semiconductor device described in the above embodiment and structure examples of transistors that can be used in the semiconductor device described in the above embodiment.

Structure Example 1 of Semiconductor Device

Figure 23:
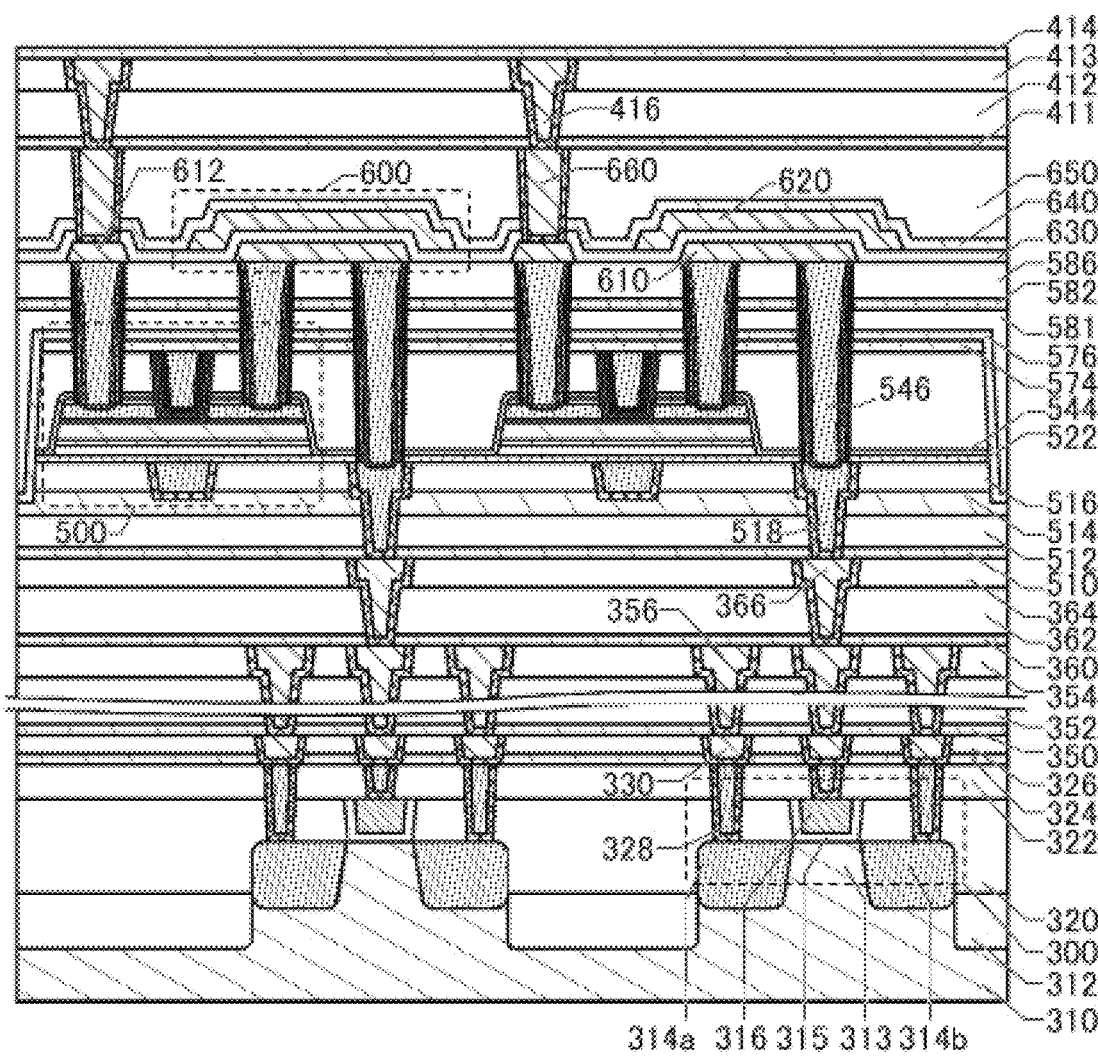
FIG. 23 is a schematic cross-sectional view showing a structure example of a semiconductor device.
Figure 24A:
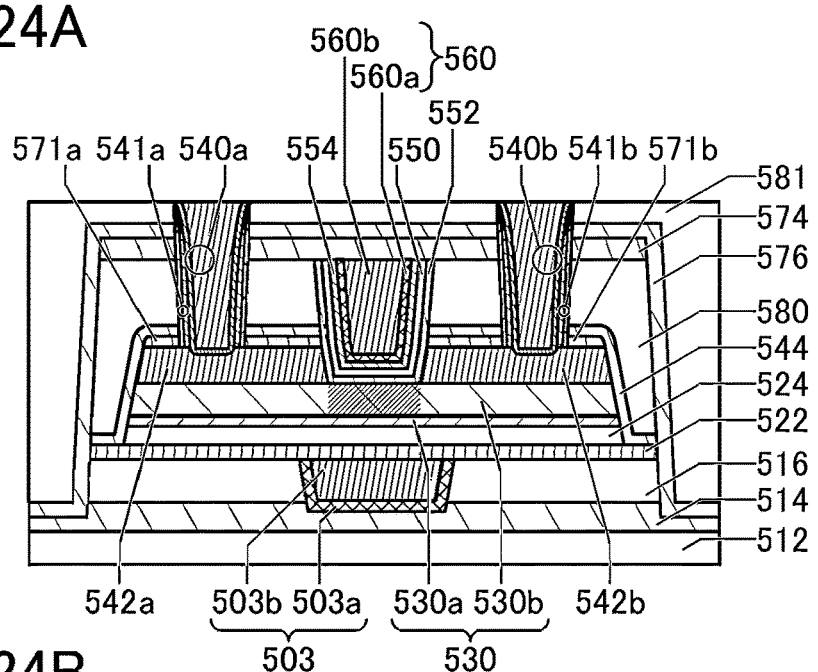
FIG. 24A to FIG. 24C are schematic cross-sectional views showing a structure example of a transistor.
Figure 24B:
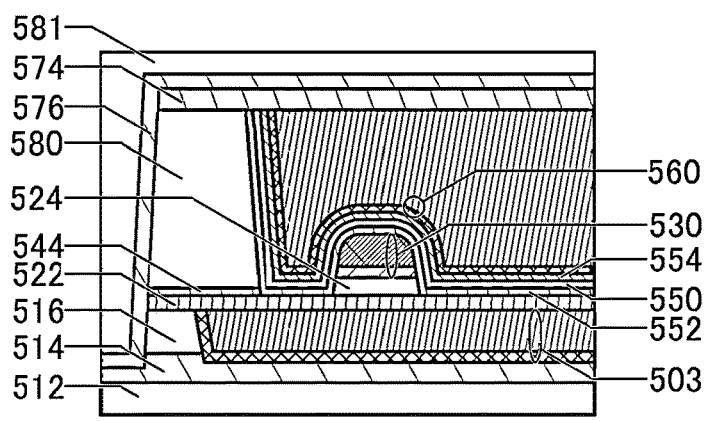
Figure 24C:
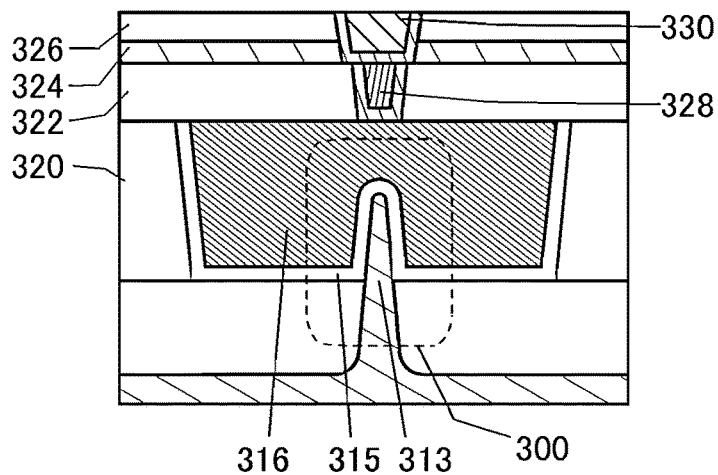

FIG. 23 illustrates a semiconductor device including a memory cell having a capacitor, and the semiconductor device includes a transistor 300, a transistor 500, and a capacitor 600. FIG. 24A is a cross-sectional view of the transistor 500 in the channel length direction, FIG. 24B is a cross-sectional view of the transistor 500 in the channel width direction, and FIG. 24C is a cross-sectional view of the transistor 300 in the channel width direction.

The transistor 500 is a transistor containing a metal oxide in a channel formation region (an OS transistor). The transistor 500 has features that the off-state current is low and that the field-effect mobility hardly changes even at high temperatures. The transistor 500 is used as the transistor M1 or the like included in a semiconductor device, for example, the memory cell MC described in the above embodiment, whereby a semiconductor device whose operating capability does not deteriorate even at a high temperature can be obtained. In particular, the transistor 500 is used, to utilize its feature of low off-state current, as the transistor M1, for example, whereby the potential written to a capacitor of the memory cell MC can be retained for a long time.

The transistor 500 is provided above the transistor 300, and the capacitor 600 is provided above the transistor 300 and the transistor 500, for example. Note that the capacitor 600 can be a capacitor that retains a potential corresponding to data written to the memory cell, for example. Note that depending on a circuit structure, the capacitor 600 illustrated in FIG. 23 is not necessarily provided.

The transistor 300 is provided on a substrate 310 and includes an element isolation layer 312, a conductor 316, an insulator 315, a semiconductor region 313 that is part of the substrate 310, and a low-resistance region 314a and a low-resistance region 314b functioning as a source region and a drain region. Note that the transistor 300 can be used as, for example, the transistor M2 or the like described in the above embodiment. Note that FIG. 23 illustrates a structure in which a gate of the transistor 300 is electrically connected to one of a source and a drain of the transistor 500 through a pair of electrodes of the capacitor 600. However, depending on the structure of the semiconductor device of one embodiment of the present invention, it is possible to employ a structure in which one of a source and a drain of the transistor 300 is electrically connected to one of the source and the drain of the transistor 500 through the pair of electrodes of the capacitor 600, a structure in which one of the source and the drain of the transistor 300 is electrically connected to a gate of the transistor 500 through the pair of electrodes of the capacitor 600, or a structure in which each terminal of the transistor 300 is not electrically connected to each terminal of the transistor 500 or each terminal of the capacitor 600.

A semiconductor substrate (e.g., a single crystal substrate or a silicon substrate) is preferably used as the substrate 310.

In the transistor 300, the top surface and the side surface in the channel width direction of the semiconductor region 313 are covered with the conductor 316 with the insulator 315 therebetween, as illustrated in FIG. 24C. Such a Fin-type transistor 300 can have an increased effective channel width, and thus the transistor 300 can have improved on-state characteristics. In addition, since contribution of an electric field of a gate electrode can be increased, the off-state characteristics of the transistor 300 can be improved.

Note that the transistor 300 may be either a p-channel transistor or an n-channel transistor.

A region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), GaN (gallium nitride), or the like. A structure may be employed in which silicon whose effective mass is controlled by applying stress to the crystal lattice and changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The element isolation layer 312 is provided to separate a plurality of transistors on the substrate 310 from each other. The element isolation layer can be formed by, for example, a LOCOS (Local Oxidation of Silicon) method, an STI (Shallow Trench Isolation) method, a mesa isolation method, or the like.

Figure 25:
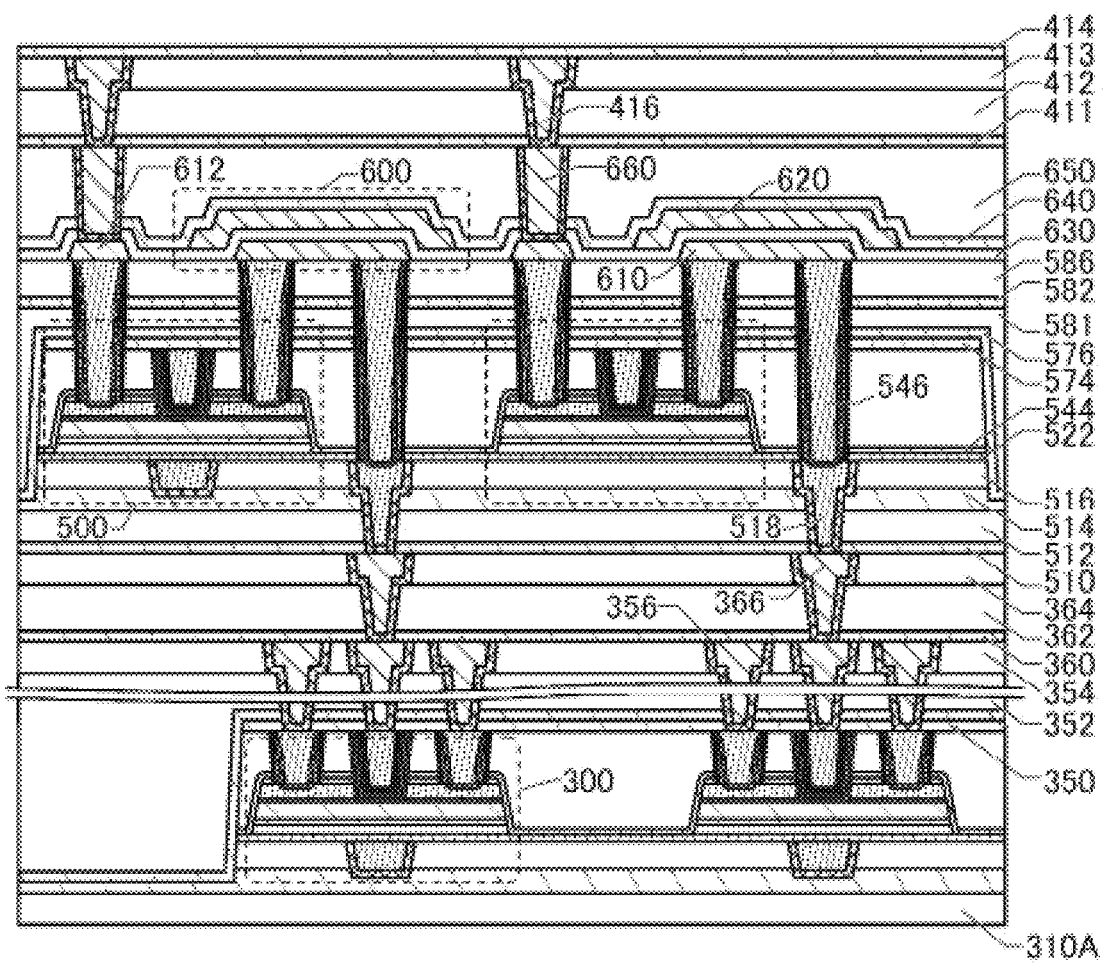
FIG. 25 is a schematic cross-sectional view showing a structure example of a semiconductor device.

Note that the transistor 300 illustrated in FIG. 23 is only an example and the structure is not limited thereto; an appropriate transistor can be used in accordance with a circuit structure, a driving method, or the like. For example, the transistor 300 may have a planar structure instead of a FIN-type structure illustrated in FIG. 24C. For example, when a semiconductor device is configured as a single-polarity circuit using only OS transistors, the transistor 300 can have a structure similar to that of the transistor 500 using an oxide semiconductor, as illustrated in FIG. 25. Note that the details of the transistor 500 will be described later. In this specification and the like, the term "single-polarity circuit" refers to a circuit in which all transistors are only either n-channel transistors or p-channel transistors.

Note that in FIG. 25, the transistor 300 is provided over a substrate 310A; in this case, a semiconductor substrate may be used as the substrate 310A as in the case of the substrate 310 in the semiconductor device in FIG. 23. As the substrate 310A, for example, an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used. Examples of the glass substrate include barium borosilicate glass, aluminoborosilicate glass, and soda lime glass. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Other examples include polyamide, polyimide, aramid, an epoxy resin, an inorganic vapor deposition film, and paper.

Over the transistor 300 illustrated in FIG. 23, an insulator 320, an insulator 322, an insulator 324, and an insulator 326 are sequentially stacked from the substrate 310 side.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride is used, for example.

Note that in this specification, silicon oxynitride refers to a material that contains oxygen at a higher proportion than nitrogen in its composition, and silicon nitride oxide refers to a material that contains nitrogen at a higher proportion than oxygen in its composition. Furthermore, in this specification, aluminum oxynitride refers to a material that contains oxygen at a higher proportion than nitrogen in its composition, and aluminum nitride oxide refers to a material that contains nitrogen at a higher proportion than oxygen in its composition.

The insulator 322 may have a function of a planarization film for planarizing a level difference caused by the transistor 300 or the like covered with the insulator 320. For example, a top surface of the insulator 322 may be planarized by planarization treatment using a chemical mechanical polishing (CMP) method or the like to improve planarity.

As the insulator 324, it is preferable to use a film having a barrier property that prevents diffusion of hydrogen, impurities, or the like from the substrate 310, the transistor 300, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The relative permittivity of the insulator 326 is, for example, preferably 0.7 times or less, further preferably 0.6 times or less the dielectric constant of the insulator 324. When a material with a low permittivity is used for an interlayer film, parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors having a function of a plug or a wiring are collectively denoted by the same reference numeral in some cases. Moreover, in this specification and the like, a wiring and a plug connected to the wiring may be a single component. That is, in some cases, part of a conductor functions as a wiring or part of a conductor functions as a plug.

As a material of each of plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 23, an insulator 350, an insulator 352, and an insulator 354 are provided to be stacked in this order above the insulator 326 and the conductor 330. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against impurities such as hydrogen and water. The insulator 352 and the insulator 354 are preferably formed using an insulator having a relatively low dielectric constant to reduce the parasitic capacitance generated between wirings, like the insulator 326. Furthermore, the conductor 356 preferably contains a conductor having a barrier property against impurities such as hydrogen and water. In particular, the conductor having a barrier property against hydrogen is formed in an opening portion of the insulator 350 having a barrier property against hydrogen. With this structure, the transistor 300 and the transistor 500 can be separated by the barrier layer, so that diffusion of hydrogen from the transistor 300 into the transistor 500 can be inhibited.

Note that for the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is kept. In that case, a structure is preferable in which a tantalum nitride layer having a barrier property against hydrogen is in contact with the insulator 350 having a barrier property against hydrogen.

An insulator 360, an insulator 362, and an insulator 364 are sequentially stacked over the insulator 354 and the conductor 356.

Like the insulator 324 or the like, the insulator 360 is preferably formed using an insulator having a barrier property against impurities such as water and hydrogen. Thus, the insulator 360 can be formed using any of the materials usable for the insulator 324 or the like, for example.

The insulator 362 and the insulator 364 have functions of an interlayer insulating film and a planarization film. Like the insulator 324, the insulator 362 and the insulator 364 are preferably formed using an insulator having a barrier property against impurities such as water and hydrogen. Thus, the insulator 362 and/or the insulator 364 can be formed using any of the materials usable for the insulator 324.

An opening portion is provided in regions of the insulator 360, the insulator 362, and the insulator 364 that overlap with the conductor 356, and the conductor 366 is embedded to fill the opening portion. The conductor 366 is also formed over the insulator 362. The conductor 366 has a function of a plug or a wiring connected to the transistor 300, for example. Note that the conductor 366 can be provided using a material similar to those for the conductor 328 and the conductor 330.

An insulator 510, an insulator 512, an insulator 514, and an insulator 516 are stacked sequentially over the insulator 364 and the conductor 366. A substance with a barrier property against oxygen or hydrogen is preferably used for any of the insulator 510, the insulator 512, the insulator 514, and the insulator 516.

For example, as the insulator 510 and the insulator 514, it is preferable to use a film having a barrier property that prevents diffusion of hydrogen, impurities, or the like from the substrate 310, a region where the transistor 300 is provided, or the like into the region where the transistor 500 is provided. Therefore, a material similar to that for the insulator 324 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen used for the insulator 510 and the insulator 514, a metal oxide such as aluminum oxide, hafnium oxide, or tantalum oxide is preferably used, for example.

In particular, aluminum oxide has an excellent blocking effect that prevents passage of oxygen and impurities such as hydrogen and moisture that would cause a change in the electrical characteristics of the transistor. Accordingly, aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

For the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (e.g., a conductor 503 illustrated in FIG. 24A and FIG. 24B), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, a region of the conductor 518 that is in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; hence, the diffusion of hydrogen from the transistor 300 into the transistor 500 can be inhibited.

The transistor 500 is provided above the insulator 516. As illustrated in FIG. 24A and FIG. 24B, the transistor 500 includes the insulator 516 over the insulator 514, a conductor 503 (a conductor 503a and a conductor 503b) provided to be embedded in the insulator 514 or the insulator 516, an insulator 522 over the insulator 516 and the conductor 503, an insulator 524 over the insulator 522, an oxide 530a over the insulator 524, an oxide 530b over the oxide 530a, a conductor 542a over the oxide 530b, an insulator 571a over the conductor 542a, a conductor 542b over the oxide 530b, an insulator 571b over the conductor 542b, an insulator 552 over the oxide 530b, an insulator 550 over the insulator 552, an insulator 554 over the insulator 550, a conductor 560 (a conductor 560a and a conductor 560b) over the insulator 554 and overlapping with part of the oxide 530b, and an insulator 544 placed over the insulator 522, the insulator 524, the oxide 530a, the oxide 530b, the conductor 542a, the conductor 542b, the insulator 571a, and insulator 571b. Here, as illustrated in FIG. 24A and FIG. 24B, the insulator 552 is in contact with the top surface of the insulator 522, the side surface of the insulator 524, the side surface of the oxide 530a, the side surface and the top surface of the oxide 530b, the side surface of the conductor 542, the side surface of the insulator 571, the side surface of the insulator 544, the side surface of the insulator 580, and the bottom surface of the insulator 550. The top surface of the conductor 560 is placed to be substantially level with the uppermost portion of the insulator 554, the uppermost portion of the insulator 550, the uppermost portion of the insulator 552, and the top surface of the insulator 580. An insulator 574 is in contact with part of at least one of the top surface of the conductor 560, the upper portion of the insulator 552, the upper portion of the insulator 550, the upper portion of the insulator 554, and the top surface of the insulator 580.

An opening reaching the oxide 530b is provided in the insulator 580 and the insulator 544. The insulator 552, the insulator 550, the insulator 554, and the conductor 560 are positioned in the opening. The conductor 560, the insulator 552, the insulator 550, and the insulator 554 are provided between the conductor 542a and the conductor 542b and between the insulator 571a and the insulator 571b in the channel length direction of the transistor 500. The insulator 554 includes a region in contact with the side surface of the conductor 560 and a region in contact with the bottom surface of the conductor 560.

The oxide 530 preferably includes the oxide 530a placed over the insulator 524 and the oxide 530b placed over the oxide 530a. Including the oxide 530a under the oxide 530b makes it possible to inhibit diffusion of impurities into the oxide 530b from the components formed below the oxide 530a.

Although a structure in which two layers, the oxide 530a and the oxide 530b, are stacked as the oxide 530 in the transistor 500 is described, the present invention is not limited thereto. For example, the transistor 500 can have a structure including a single layer of the oxide 530b or a stacked-layer structure of three or more layers. Alternatively, the transistor 500 can have a structure including the oxide 530a and the oxide 530b each having a stacked-layer structure.

The conductor 560 functions as a first gate (also referred to as a top gate) electrode, and the conductor 503 functions as a second gate (also referred to as a back gate) electrode. The insulator 552, the insulator 550, and the insulator 554 function as a first gate insulator, and the insulator 522 and the insulator 524 function as a second gate insulator. Note that the gate insulator is also referred to as a gate insulating layer or a gate insulating film in some cases. The conductor 542a functions as one of a source and a drain, and the conductor 542b functions as the other of the source and the drain. At least part of a region of the oxide 530 overlapping with the conductor 560 functions as a channel formation region.

Figure 26A:
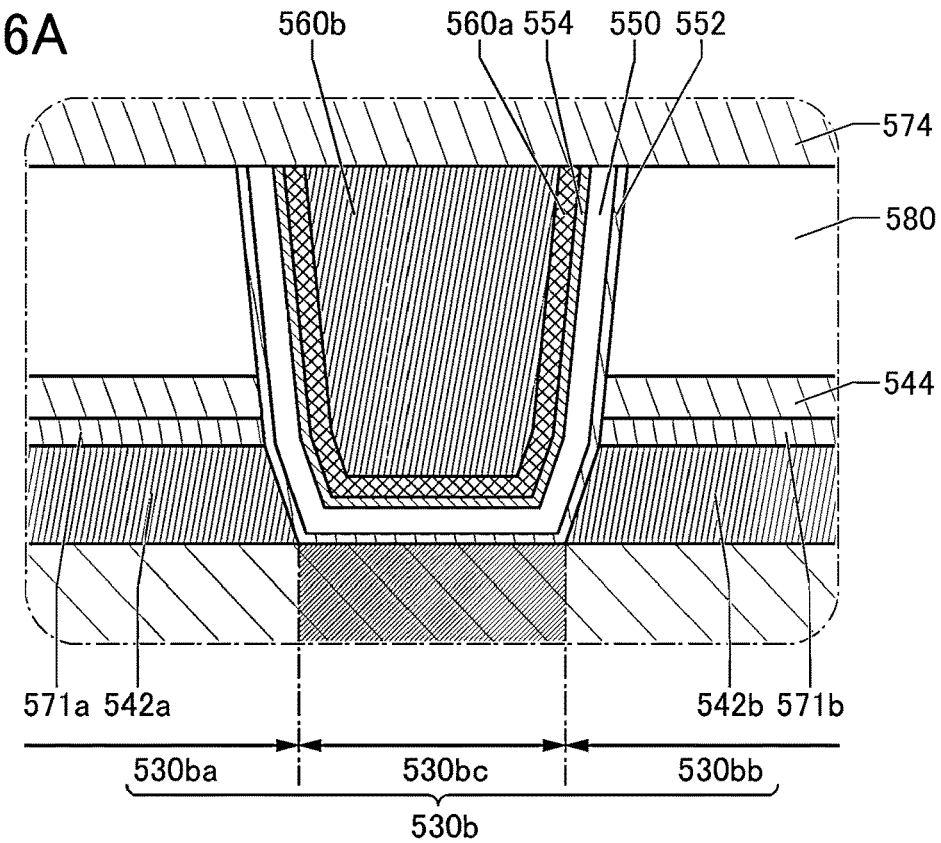
FIG. 26A and FIG. 26B are schematic cross-sectional views each showing a structure example of a transistor.

FIG. 26A is an enlarged view of the vicinity of the channel formation region in FIG. 24A. Supply of oxygen to the oxide 530b forms the channel formation region in a region between the conductor 542a and the conductor 542b. As illustrated in FIG. 26A, the oxide 530b includes a region 530bc functioning as the channel formation region of the transistor 500 and a region 530ba and a region 530bb that are provided to sandwich the region 530bc and function as a source region and a drain region. At least part of the region 530bc overlaps with the conductor 560. In other words, the region 530bc is provided between the conductor 542a and the conductor 542b. The region 530ba is provided to overlap with the conductor 542a, and the region 530bb is provided to overlap with the conductor 542b.

The region 530bc functioning as the channel formation region contains fewer oxygen vacancies (an oxygen vacancy in a metal oxide is sometimes referred to as $V_O$ in this specification and the like) or a lower impurity concentration than the regions 530ba and 530bb to have higher resistance and a lower carrier concentration. Thus, the region 530bc can be regarded as being i-type (intrinsic) or substantially i-type.

A transistor using a metal oxide is likely to change its electrical characteristics when impurities or oxygen vacancies ($V_O$) exist in a region of the metal oxide where a channel is formed, which might degrade the reliability. In some cases, hydrogen in the vicinity of an oxygen vacancy ($V_O$) forms a defect that is an oxygen vacancy ($V_O$) into which hydrogen enters (hereinafter sometimes referred to as $V_OH$), which generates an electron serving as a carrier. Therefore, when the region of the oxide semiconductor where a channel is formed includes oxygen vacancies, the transistor tends to have normally-on characteristics (characteristics with which, even when no voltage is applied to the gate electrode, the channel exists and current flows through the transistor). Thus, impurities, oxygen vacancies, and $V_OH$ are preferably reduced as much as possible in the region of the oxide semiconductor where a channel is formed.

The region 530ba and the region 530bb functioning as the source region and the drain region are each a low-resistance region with an increased carrier concentration because it includes a large amount of oxygen vacancies ($V_O$) or has a high concentration of an impurity such as hydrogen, nitrogen, or a metal element. In other words, the region 530ba and the region 530bb are each an n-type region having a higher carrier concentration and a lower resistance than those of the region 530bc.

The carrier concentration in the region 530bc functioning as the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. Note that the lower limit of the carrier concentration in the region 530bc functioning as the channel formation region is not particularly limited and can be, for example, $1 \times 10^{-9}$ cm$^{-3}$.

Between the region 530bc and the region 530ba or the region 530bb, a region having a carrier concentration that is lower than or substantially equal to the carrier concentrations in the region 530ba and the region 530bb and higher than or substantially equal to the carrier concentration in the region 530bc may be formed. That is, the region functions as a junction region between the region 530bc and the region 530ba or the region 530bb. The hydrogen concentration in the junction region is lower than or substantially equal to the hydrogen concentrations in the region 530ba and the region 530bb and higher than or substantially equal to the hydrogen concentration in the region 530bc in some cases. The amount of oxygen vacancies in the junction region is smaller than or substantially equal to the amounts of oxygen vacancies in the region 530ba and the region 530bb and larger than or substantially equal to the amount of oxygen vacancies in the region 530bc in some cases.

Although FIG. 26A illustrates an example in which the region 530ba, the region 530bb, and the region 530bc are formed in the oxide 530b, the present invention is not limited thereto. For example, the above regions may be formed not only in the oxide 530b but also in the oxide 530a.

In the oxide 530, the boundaries between the regions are difficult to detect clearly in some cases. The concentration of a metal element and an impurity element such as hydrogen or nitrogen, which is detected in each region, may be gradually changed not only between the regions but also in each region. That is, the region closer to the channel formation region preferably has a lower concentration of a metal element and an impurity element such as hydrogen or nitrogen.

In the transistor 500, a metal oxide functioning as a semiconductor (such a metal oxide is hereinafter also referred to as an oxide semiconductor) is preferably used for the oxide 530 (the oxide 530a and the oxide 530b) including the channel formation region.

The metal oxide functioning as a semiconductor preferably has a band gap of 2 eV or more, further preferably 2.5 eV or more. With use of a metal oxide having such a large bandgap, the off-state current of the transistor can be reduced.

As the oxide 530, it is preferable to use, for example, a metal oxide such as an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). Alternatively, an In—Ga oxide, an In—Zn oxide, or an indium oxide may be used as the oxide 530.

The atomic ratio of In to the element M in the metal oxide used as the oxide 530b is preferably greater than the atomic ratio of In to the element M in the metal oxide used as the oxide 530a.

The oxide 530a is placed under the oxide 530b, whereby impurities and oxygen can be inhibited from diffusing into the oxide 530b from components formed below the oxide 530a.

When the oxide 530a and the oxide 530b contain a common element (as the main component) besides oxygen, the density of defect states at an interface between the oxide 530a and the oxide 530b can be made low. Since the density of defect states at the interface between the oxide 530a and the oxide 530b can be made low, the influence of interface scattering on carrier conduction is small, and a high on-state current can be obtained.

The oxide 530b preferably exhibits crystallinity. It is particularly preferable to use a CAAC-OS (c-axis aligned crystalline oxide semiconductor) as the oxide 530b.

The CAAC-OS is a metal oxide having a dense structure with high crystallinity and small amounts of impurities and defects (e.g., oxygen vacancies ($V_O$)). In particular, after the formation of a metal oxide, heat treatment is performed at a temperature at which the metal oxide does not become a polycrystal (e.g., 400° C. to 600° C., inclusive), whereby a CAAC-OS having a dense structure with higher crystallinity can be obtained. When the density of the CAAC-OS is increased in such a manner, diffusion of impurities or oxygen in the CAAC-OS can be further reduced.

On the other hand, a clear crystal grain boundary cannot be observed in the CAAC-OS; thus, it can be said that a reduction in electron mobility due to the crystal grain boundary is less likely to occur. Thus, a metal oxide including a CAAC-OS is physically stable. Therefore, the metal oxide including a CAAC-OS is resistant to heat and has high reliability.

If impurities and oxygen vacancies exist in a region of an oxide semiconductor where a channel is formed, a transistor using the oxide semiconductor might have variable electrical characteristics and poor reliability. In some cases, hydrogen in the vicinity of an oxygen vacancy forms a defect that is the oxygen vacancy into which hydrogen enters (hereinafter sometimes referred to as $V_OH$), which generates an electron serving as a carrier. Therefore, when the region of the oxide semiconductor where a channel is formed includes oxygen vacancies, the transistor tends to have normally-on characteristics (characteristics with which, even when no voltage is applied to the gate electrode, the channel exists and current flows through the transistor). Thus, impurities, oxygen vacancies, and $V_OH$ are preferably reduced as much as possible in the region of the oxide semiconductor where a channel is formed. In other words, it is preferable that the region of the oxide semiconductor where a channel is formed have a reduced carrier concentration and be of an i-type (intrinsic) or substantially i-type.

As a countermeasure to the above, an insulator containing oxygen that is released by heating (hereinafter, sometimes referred to as excess oxygen) is provided in the vicinity of the oxide semiconductor and heat treatment is performed, so that oxygen can be supplied from the insulator to the oxide semiconductor to reduce oxygen vacancies and $V_OH$. However, supply of an excess amount of oxygen to the source region or the drain region might cause a decrease in the on-state current or field-effect mobility of the transistor 500. Furthermore, a variation of the amount of oxygen supplied to the source region or the drain region in the substrate plane leads to a variation in characteristics of the semiconductor device including the transistor.

Therefore, the region 530bc functioning as the channel formation region in the oxide semiconductor is preferably an i-type or substantially i-type region with reduced carrier concentration, whereas the region 530ba and the region 530bb functioning as the source region and the drain region are preferably n-type regions with high carrier concentrations. That is, it is preferable that oxygen vacancies and $V_OH$ in the region 530bc of the oxide semiconductor be reduced and the region 530ba and the region 530bb not be supplied with an excess amount of oxygen.

Thus, in this embodiment, microwave treatment is performed in an oxygen-containing atmosphere in a state where the conductor 542a and the conductor 542b are provided over the oxide 530b so that oxygen vacancies and $V_OH$ in the region 530bc can be reduced. Here, the microwave treatment refers to, for example, treatment using an apparatus including a power source that generates high-density plasma with use of a microwave.

The microwave treatment in an oxygen-containing atmosphere converts an oxygen gas into plasma using a high-frequency wave such as a microwave or RF and activates the oxygen plasma. At this time, the region 530bc can also be irradiated with the high-frequency wave such as the microwave or RF. By the effect of the plasma, the microwave, or the like, $V_OH$ in the region 530bc can be cut; thus, hydrogen H can be removed from the region 530bc and an oxygen vacancy $V_O$ can be filled with oxygen. That is, the reaction "$V_OH \rightarrow H + V_O$" occurs in the region 530bc, so that the hydrogen concentration in the region 530bc can be reduced. As a result, oxygen vacancies and $V_OH$ in the region 530bc can be reduced to lower the carrier concentration.

In the microwave treatment in an oxygen-containing atmosphere, the high-frequency wave such as the microwave or RF, the oxygen plasma, or the like is blocked by the conductor 542a and the conductor 542b and does not affect the region 530ba nor the region 530bb. In addition, the effect of the oxygen plasma can be reduced by the insulator 571 and the insulator 580 that are provided to cover the oxide 530b and the conductor 542. Hence, a reduction in $V_OH$ and supply of an excess amount of oxygen do not occur in the region 530ba or the region 530bb in the microwave treatment, preventing a decrease in carrier concentration.

In particular, microwave treatment is preferably performed in an oxygen-containing atmosphere after deposition of an insulating film to be the insulator 552 or after deposition of an insulating film to be the insulator 550. By performing the microwave treatment in an oxygen-containing atmosphere through the insulator 552 or the insulator 550 in such a manner, oxygen can be efficiently supplied into the region 530bc. In addition, the insulator 552 is provided to be in contact with the side surface of the conductor 542 and the surface of the region 530bc, thereby preventing oxygen more than necessary from being supplied to the region 530bc and preventing the side surface of the conductor 542 from being oxidized. Furthermore, the side surface of the conductor 542 can be prevented from being oxidized when an insulating film to be the insulator 550 is formed.

The oxygen supplied into the region 530bc has any of a variety of forms such as an oxygen atom, an oxygen molecule, an oxygen radical (an O radical, an atom or a molecule having an unpaired electron, or an ion). Note that the oxygen supplied into the region 530bc preferably has any one or more of the above forms, particularly preferably an oxygen radical. Furthermore, the film quality of the insulator 552 and the insulator 550 can be improved, leading to higher reliability of the transistor 500.

In the above manner, oxygen vacancies and $V_OH$ can be selectively removed from the region 530bc of the oxide semiconductor, whereby the region 530bc can be an i-type or substantially i-type region. Furthermore, supply of an excess amount of oxygen to the region 530ba and the region 530bb functioning as the source region and the drain region can be inhibited and the conductivity can be maintained. As a result, a change in the electrical characteristics of the transistor 500 can be inhibited, and thus a variation in the electrical characteristics of the transistors 500 in the substrate plane can be inhibited.

With the above structure, a semiconductor device with a small variation in transistor characteristics can be provided. A semiconductor device with favorable reliability can also be provided. A semiconductor device having favorable electrical characteristics can be provided.

As illustrated in FIG. 24B, a curved surface may be provided between a side surface of the oxide 530b and a top surface of the oxide 530b in a cross-sectional view in the channel width direction of the transistor 500. In other words, an end portion of the side surface and an end portion of the top surface may be curved (hereinafter referred to as rounded).

The radius of curvature of the curved surface is preferably greater than 0 nm and less than the thickness of the oxide 530b in a region overlapping with the conductor 542, or less than half of the length of a region that does not have the curved surface. Specifically, the radius of curvature of the curved surface is greater than 0 nm and less than or equal to 20 nm, preferably greater than or equal to 1 nm and less than or equal to 15 nm, and further preferably greater than or equal to 2 nm and less than or equal to 10 nm. Such a shape can improve the coverage of the oxide 530b with the insulator 552, the insulator 550, the insulator 554, and the conductor 560.

The oxide 530 preferably has a stacked-layer structure of a plurality of oxide layers with different chemical compositions. Specifically, the atomic ratio of the element M to a metal element that is a main component of the metal oxide used as the oxide 530a is preferably greater than the atomic ratio of the element M to a metal element that is a main component of the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a.

The oxide 530b is preferably an oxide having crystallinity, such as a CAAC-OS. An oxide having crystallinity, such as a CAAC-OS, has a dense structure with small amounts of impurities and defects (e.g., oxygen vacancies) and high crystallinity. This can inhibit extraction of oxygen from the oxide 530b by the source electrode or the drain electrode. This can reduce extraction of oxygen from the oxide 530b even when heat treatment is performed; hence, the transistor 500 is stable against high temperatures in the manufacturing process (what is called thermal budget).

Here, the conduction band minimum gradually changes at a junction portion of the oxide 530a and the oxide 530b. In other words, the conduction band minimum at the junction portion of the oxide 530a and the oxide 530b continuously changes or is continuously connected. This can be obtained by decreasing the density of defect states in a mixed layer formed at the interface between the oxide 530a and the oxide 530b.

Specifically, when the oxide 530a and the oxide 530b include the same element as a main component in addition to oxygen, a mixed layer with a low density of defect states can be formed. For example, in the case where the oxide 530b is an In-M-Zn oxide, an In-M-Zn oxide, an M-Zn oxide, an oxide of the element M, an In—Zn oxide, indium oxide, or the like may be used as the oxide 530a.

Specifically, as the oxide 530a, a metal oxide with a composition of In:M:Zn=1:3:4 [atomic ratio] or in the neighborhood thereof, or a composition of In:M:Zn=1:1:0.5 [atomic ratio] or in the neighborhood thereof is used. As the oxide 530b, a metal oxide with a composition of In:M:Zn=1:1:1 [atomic ratio] or in the neighborhood thereof, or a composition of In:M:Zn=4:2:3 [atomic ratio] or in the neighborhood thereof can be used. Note that a composition in the neighborhood includes the range of ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

As illustrated in FIG. 24A or the like, the insulator 552 formed using aluminum oxide or the like is provided in contact with the top and side surfaces of the oxide 530, whereby indium contained in the oxide 530 is unevenly distributed, in some cases, at the interface between the oxide 530 and the insulator 552 and in its vicinity. Accordingly, the vicinity of the surface of the oxide 530 comes to have an atomic ratio close to that of an indium oxide or that of an In—Zn oxide. Such an increase in the atomic ratio of indium in the vicinity of the surface of the oxide 530, especially the vicinity of a surface of the oxide 530b, can increase the field-effect mobility of the transistor 500.

When the oxide 530a and the oxide 530b have the above-described structure, the density of defect states at the interface between the oxide 530a and the oxide 530b can be made low. Thus, the influence of interface scattering on carrier conduction is small, and the transistor 500 can have a high on-state current and excellent frequency characteristics.

At least one of the insulator 512, the insulator 514, the insulator 544, the insulator 571, the insulator 574, the insulator 576, and the insulator 581 preferably functions as a barrier insulating film, which inhibits diffusion of impurities such as water and hydrogen from the substrate side or above the transistor 500 into the transistor 500. Thus, for at least one of the insulator 512, the insulator 514, the insulator 544, the insulator 571, the insulator 574, the insulator 576, and the insulator 581, an insulating material which has a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (through which the impurities are less likely to pass) is preferably used. Alternatively, it is preferable to use an insulating material having a function of inhibiting diffusion of oxygen (e.g., at least one of oxygen atoms, oxygen molecules, and the like) (an insulating material through which the oxygen is less likely to pass).

Note that in this specification, a barrier insulating film refers to an insulating film having a barrier property. A barrier property in this specification means a function of inhibiting diffusion of a targeted substance (also referred to as having low permeability). In addition, a barrier property in this specification means a function of capturing and fixing (also referred to as gettering) a targeted substance.

An insulator having a function of inhibiting diffusion of impurities, such as water and hydrogen, and oxygen is preferably used for the insulator 512, the insulator 514, the insulator 544, the insulator 571, the insulator 574, the insulator 576, and the insulator 581; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 512, the insulator 544, and the insulator 576. For example, aluminum oxide or magnesium oxide, which has a function of capturing or fixing hydrogen, is preferably used for the insulator 514, the insulator 571, the insulator 574, and the insulator 581. In this case, impurities such as water and hydrogen can be inhibited from diffusing to the transistor 500 side from the substrate side through the insulator 512 and the insulator 514. Impurities such as water and hydrogen can be inhibited from diffusing to the transistor 500 side from an interlayer insulating film and the like which are provided outside the insulator 581. Alternatively, oxygen contained in the insulator 524 and the like can be inhibited from diffusing to the substrate side through the insulator 512 and the insulator 514. Alternatively, oxygen contained in the insulator 580 and the like can be inhibited from diffusing to above the transistor 500 through the insulator 574 and the like. In this manner, it is preferable that the transistor 500 be surrounded by the insulator 512, the insulator 514, the insulator 571, the insulator 544, the insulator 574, the insulator 576, and the insulator 581, which have a function of inhibiting diffusion of oxygen and impurities such as water and hydrogen.

Here, an oxide having an amorphous structure is preferably used for the insulator 512, the insulator 514, the insulator 544, the insulator 571, the insulator 574, the insulator 576, and the insulator 581. For example, a metal oxide such as $AlO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 500 or provided around the transistor 500, hydrogen contained in the transistor 500 or hydrogen present around the transistor 500 can be captured or fixed. In particular, hydrogen contained in the channel formation region of the transistor 500 is preferably captured or fixed. The metal oxide having an amorphous structure is used as the component of the transistor 500 or provided around the transistor 500, whereby the transistor 500 and a semiconductor device which have favorable characteristics and high reliability can be manufactured.

Although the insulator 512, the insulator 514, the insulator 544, the insulator 571, the insulator 574, the insulator 576, and the insulator 581 preferably have an amorphous structure, they may partly include a region having a polycrystalline structure. Alternatively, the insulator 512, the insulator 514, the insulator 544, the insulator 571, the insulator 574, the insulator 576, and the insulator 581 may have a multilayer structure in which a layer having an amorphous structure and a layer having a polycrystalline structure are stacked. For example, a stacked-layer structure in which a layer having a polycrystalline structure is formed over a layer having an amorphous structure may be employed.

The insulator 512, the insulator 514, the insulator 544, the insulator 571, the insulator 574, the insulator 576, and the insulator 581 are deposited by a sputtering method, for example. Since a sputtering method does not need to use a molecule containing hydrogen as a deposition gas, the hydrogen concentrations in the insulator 512, the insulator 514, the insulator 544, the insulator 571, the insulator 574, the insulator 576, and the insulator 581 can be reduced. Note that the deposition method is not limited to a sputtering method, and a chemical vapor deposition (CVD) method, a molecular beam epitaxy (MBE) method, a pulsed laser deposition (PLD) method, an atomic layer deposition (ALD) method, or the like can be used as appropriate.

The resistivities of the insulator 512, the insulator 544, and the insulator 576 are preferably low in some cases. For example, by setting the resistivities of the insulator 512, the insulator 544, and the insulator 576 to approximately $1\times10^{13}$ Ωcm, the insulator 512, the insulator 544, and the insulator 576 can sometimes reduce charge up of the conductor 503, the conductor 542, the conductor 560, or the like in treatment using plasma or the like in the manufacturing process of a semiconductor device. The resistivities of the insulator 512, the insulator 544, and the insulator 576 are preferably higher than or equal to $1\times10^{10}$ Ωcm and lower than or equal to $1\times10^{15}$ Ωcm.

The insulator 516, the insulator 574, the insulator 580, and the insulator 581 preferably have a lower permittivity than the insulator 514. When a material with a low permittivity is used for an interlayer film, parasitic capacitance generated between wirings can be reduced. For the insulator 516, the insulator 580, and the insulator 581, silicon oxide, silicon oxynitride, silicon oxide to which fluorine is added, silicon oxide to which carbon is added, silicon oxide to which carbon and nitrogen are added, porous silicon oxide, or the like is used as appropriate, for example.

The insulator 581 preferably functions as an interlayer film, a planarization film, or the like.

The conductor 503 is placed to overlap with the oxide 530 and the conductor 560. Here, the conductor 503 is preferably provided to be embedded in an opening formed in the insulator 516. Part of the conductor 503 is embedded in the insulator 514 in some cases.

The conductor 503 includes the conductor 503a and the conductor 503b. The conductor 503a is provided in contact with a bottom surface and a sidewall of the opening. The conductor 503b is provided to be embedded in a recessed portion formed in the conductor 503a. Here, the top surface of the conductor 503b is substantially level with the top surfaces of the conductor 503a and the insulator 516.

Here, for the conductor 503a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material that has a function of inhibiting diffusion of oxygen (e.g., at least one of an oxygen atom, an oxygen molecule, and the like).

When the conductor 503a is formed using a conductive material having a function of inhibiting diffusion of hydrogen, impurities such as hydrogen contained in the conductor 503b can be prevented from diffusing into the oxide 530 through the insulator 524 and the like. When the conductor 503a is formed using a conductive material having a function of inhibiting diffusion of oxygen, the conductivity of the conductor 503b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, a single layer or a stacked layer of the above conductive material is used as the conductor 503a. For example, titanium nitride is used for the conductor 503a.

In addition, a conductive material containing tungsten, copper, or aluminum as its main component is preferably used for the conductor 503b. For example, tungsten is used for the conductor 503b.

In addition, the conductor 503 sometimes functions as a second gate electrode. In that case, the threshold voltage ($V_{th}$) of the transistor 500 can be controlled by changing a potential applied to the conductor 503 not in synchronization with but independently of a potential applied to the conductor 560. In particular, $V_{th}$ of the transistor 500 can be made higher and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The electric resistivity of the conductor 503 is designed in consideration of the potential applied to the conductor 503, and the thickness of the conductor 503 is determined in accordance with the electric resistivity. The thickness of the insulator 516 is substantially equal to that of the conductor 503. The conductor 503 and the insulator 516 are preferably as thin as possible in the allowable range of the design of the conductor 503. When the thickness of the insulator 516 is reduced, the absolute amount of impurities such as hydrogen contained in the insulator 516 can be reduced, reducing the amount of the impurities to be diffused into the oxide 530.

Seen from the above, the conductor 503 is preferably provided to be larger than a region of the oxide 530 that does not overlap with the conductor 542a or the conductor 542b. As illustrated in FIG. 24B, it is particularly preferable that the conductor 503 extend to a region outside end portions of the oxide 530a and the oxide 530b in the channel width direction. That is, the conductor 503 and the conductor 560 preferably overlap each other with the insulators therebetween on the outer side of a side surface of the oxide 530 in the channel width direction. With this structure, the channel formation region of the oxide 530 can be electrically surrounded by the electric field of the conductor 560 functioning as a first gate electrode and the electric field of the conductor 503 functioning as the second gate electrode. In this specification, a transistor structure in which a channel formation region is electrically surrounded by electric fields of the first gate and the second gate is referred to as a surrounded channel (S-channel) structure.

In this specification and the like, a transistor having the S-channel structure refers to a transistor having a structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

Furthermore, as illustrated in FIG. 24B, the conductor 503 extends to have a function of a wiring as well. However, without limitation to this structure, a structure in which a conductor functioning as a wiring is provided below the conductor 503 may be employed. In addition, the conductor 503 is not necessarily provided in each transistor. For example, the conductor 503 may be shared by a plurality of transistors.

Note that although the transistor 500 having a structure in which the conductor 503a and the conductor 503b are stacked to be the conductor 503 is illustrated, the present invention is not limited thereto. For example, the conductor 503 may be provided as a single layer or to have a stacked-layer structure of three or more layers.

The insulator 522 and the insulator 524 function as a gate insulator.

It is preferable that the insulator 522 have a function of inhibiting diffusion of hydrogen (e.g., at least one of a hydrogen atom, a hydrogen molecule, and the like). In addition, it is preferable that the insulator 522 have a function of inhibiting diffusion of oxygen (e.g., at least one of an oxygen atom, an oxygen molecule, and the like). For example, the insulator 522 preferably has a function of inhibiting diffusion of one or both of hydrogen and oxygen more than the insulator 524.

As the insulator 522, an insulator containing an oxide of one or both of aluminum and hafnium, which is an insulating material, is preferably used. For the insulator, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 to the substrate side and diffusion of impurities such as hydrogen from the periphery of the transistor 500 into the oxide 530. Thus, providing the insulator 522 can inhibit diffusion of impurities such as hydrogen into the transistor 500 and inhibit generation of oxygen vacancies in the oxide 530. Furthermore, the conductor 503 can be inhibited from reacting with oxygen contained in the insulator 524 or the oxide 530.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, the insulator may be subjected to nitriding treatment. A stack of silicon oxide, silicon oxynitride, or silicon nitride over these insulators may be used for the insulator 522.

For example, a single layer or stacked layers of an insulator(s) containing what is called a high-k material such as aluminum oxide, hafnium oxide, tantalum oxide, or zirconium oxide may be used for the insulator 522. As miniaturization and high integration of transistors progress, a problem such as a leakage current may arise because of a thinner gate insulator. When a high-k material is used for an insulator functioning as the gate insulator, a gate potential at the time when the transistor operates can be reduced while the physical thickness is maintained. Furthermore, a substance with a high permittivity such as lead zirconate titanate (PZT), strontium titanate ($SrTiO_3$), or $(Ba,Sr)TiO_3$ (BST) may be used for the insulator 522.

Silicon oxide or silicon oxynitride, for example, can be used as appropriate for the insulator 524 that is in contact with the oxide 530.

In a manufacturing process of the transistor 500, heat treatment is preferably performed with the surface of the oxide 530 exposed. For example, the heat treatment is performed at a temperature higher than or equal to 100° C. and lower than or equal to 600° C., preferably higher than or equal to 350° C. and lower than or equal to 550° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under reduced pressure. Alternatively, heat treatment may be performed in an atmosphere containing an oxidizing gas at ppm or more, 1% or more, or 10% or more in order to compensate for released oxygen after heat treatment in a nitrogen gas or inert gas atmosphere. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "$V_O$+O→null". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_O H$.

Note that the insulator 522 and the insulator 524 may each have a stacked-layer structure of two or more layers. In such cases, without limitation to a stacked-layer structure formed of the same material, a stacked-layer structure formed of different materials may be employed. The insulator 524 may be formed into an island shape so as to overlap with the oxide 530a. In this case, the insulator 544 is in contact with a side surface of the insulator 524 and a top surface of the insulator 522.

The conductor 542a and the conductor 542b are provided in contact with a top surface of the oxide 530b. Each of the conductor 542a and the conductor 542b functions as a source electrode or a drain electrode of the transistor 500.

For the conductor 542 (the conductor 542a and the conductor 542b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are each a conductive material that is not easily oxidized or a material that maintains the conductivity even after absorbing oxygen.

Note that hydrogen contained in the oxide 530b or the like diffuses into the conductor 542a or the conductor 542b in some cases. In particular, when a nitride containing tantalum is used for the conductor 542a and the conductor 542b, hydrogen contained in the oxide 530b or the like is likely to diffuse into the conductor 542a or the conductor 542b, and the diffused hydrogen is bonded to nitrogen contained in the conductor 542a or the conductor 542b in some cases. That is, hydrogen contained in the oxide 530b or the like is absorbed by the conductor 542a or the conductor 542b in some cases.

No curved surface is preferably formed between a side surface of the conductor 542 and a top surface of the conductor 542. When no curved surface is formed in the conductor 542, the conductor 542 can have a large cross-sectional area in the channel width direction. Accordingly, the conductivity of the conductor 542 is increased, so that the on-state current of the transistor 500 can be increased.

The insulator 571a is provided in contact with the top surface of the conductor 542a, and the insulator 571b is provided in contact with the top surface of the conductor 542b. The insulator 571 preferably functions as at least a barrier insulating film against oxygen. Thus, the insulator 571 preferably has a function of inhibiting oxygen diffusion. For example, the insulator 571 preferably has a function of inhibiting diffusion of oxygen more than the insulator 580. For example, a nitride containing silicon such as silicon nitride may be used for the insulator 571. The insulator 571 preferably has a function of capturing impurities such as hydrogen. In that case, for the insulator 571, a metal oxide having an amorphous structure, for example, an insulator such as aluminum oxide or magnesium oxide, may be used. It is particularly preferable to use aluminum oxide having an amorphous structure or amorphous aluminum oxide for the insulator 571 because hydrogen can be captured or fixed more effectively in some cases. Accordingly, the transistor 500 and a semiconductor device which have favorable characteristics and high reliability can be manufactured.

The insulator 544 is provided to cover the insulator 524, the oxide 530a, the oxide 530b, the conductor 542, and the insulator 571. The insulator 544 preferably has a function of capturing and fixing hydrogen. In that case, the insulator 544 preferably includes silicon nitride, or a metal oxide having an amorphous structure, for example, an insulator such as aluminum oxide or magnesium oxide. Alternatively, for example, a stacked-layer film of aluminum oxide and silicon nitride over the aluminum oxide may be used as the insulator 544.

When the above insulator 571 and the insulator 544 are provided, the conductor 542 can be surrounded by the insulators having a barrier property against oxygen. That is, oxygen contained in the insulator 524 and the insulator 580 can be prevented from diffusing into the conductor 542. As a result, the conductor 542 can be inhibited from being directly oxidized by oxygen contained in the insulator 524 and the insulator 580, so that an increase in resistivity and a reduction in on-state current can be inhibited.

The insulator 552 functions as part of the gate insulator. As the insulator 552, a barrier insulating film against oxygen is preferably used. As the insulator 552, an insulator that can be used as the insulator 574 described above may be used. An insulator containing an oxide of one or both of aluminum and hafnium may be used as the insulator 552. As the insulator, aluminum oxide, hafnium oxide, an oxide containing aluminum and hafnium (hafnium aluminate), an oxide containing hafnium and silicon (hafnium silicate), or the like can be used. In this embodiment, aluminum oxide is used for the insulator 552. In this case, the insulator 552 is an insulator containing at least oxygen and aluminum.

As illustrated in FIG. 24B, the insulator 552 is provided in contact with the top surface and the side surface of the oxide 530b, the side surface of the oxide 530a, the side surface of the insulator 524, and the top surface of the insulator 522. That is, the regions of the oxide 530a, the oxide 530b, and the insulator 524 that overlap with the conductor 560 are covered with the insulator 552 in the cross section in the channel width direction. With this structure, the insulator 552 having a barrier property against oxygen can prevent release of oxygen from the oxide 530a and the oxide 530b at the time of heat treatment or the like. This can inhibit formation of oxygen vacancies ($V_O$) in the oxide 530a and the oxide 530b. Therefore, oxygen vacancies ($V_O$) and $V_O H$ formed in the region 530bc can be reduced. Thus, the transistor 500 can have good electrical characteristics and higher reliability.

Even when an excess amount of oxygen is contained in the insulator 580, the insulator 550 and the like, oxygen can be inhibited from being excessively supplied to the oxide 530a and the oxide 530b. Thus, the region 530ba and the region 530bb are prevented from being excessively oxidized by oxygen through the region 530bc; a reduction in on-state current or field-effect mobility of the transistor 500 can be inhibited.

As illustrated in FIG. 24A, the insulator 552 is provided in contact with the side surfaces of the conductor 542, the insulator 544, the insulator 571, and the insulator 580. This can inhibit formation of an oxide film on the side surface of the conductor 542 by oxidization of the side surface. Accordingly, a reduction in on-state current or field-effect mobility of the transistor 500 can be inhibited.

Furthermore, the insulator 552 needs to be provided in an opening formed in the insulator 580, and the like, together with the insulator 554, the insulator 550, and the conductor 560. The thickness of the insulator 552 is preferably thin for miniaturization of the transistor 500. The thickness of the insulator 552 is preferably greater than or equal to 0.1 nm, greater than or equal to 0.5 nm, or greater than or equal to 1.0 nm, and less than or equal to 1.0 nm, less than or equal to 3.0 nm, or less than or equal to 5.0 nm. Note that any of the above minimum values and maximum values can be combined with each other. In that case, at least part of the insulator 552 preferably includes a region having the above-described thickness. The thickness of the insulator 552 is preferably smaller than that of the insulator 550. In that case, at least part of the insulator 552 preferably includes a region having a thickness smaller than that of the insulator 550.

To form the insulator 552 having a small thickness like the above-described thickness, an ALD method is preferably used for deposition. An ALD method is a method in which deposition is performed in such a manner that a first source gas (also referred to as a precursor or a metal precursor) and a second source gas (also referred to as a reactant or a nonmetallic precursor) are alternately introduced into a chamber for reaction, and then the introduction of these source gases is repeated. Examples of an ALD method include a thermal ALD method, in which a precursor and a reactant react with each other only by a thermal energy, and a PEALD (Plasma Enhanced ALD) method, in which a reactant excited by plasma is used. The use of plasma in a PEALD method is sometimes preferable because deposition at a lower temperature is possible.

An ALD method, which enables an atomic layer to be deposited one by one using self-limiting characteristics by atoms, has advantages such as deposition of an extremely thin film, deposition on a component with a high aspect ratio, deposition of a film with a small number of defects such as pinholes, deposition with excellent coverage, and low-temperature deposition. Therefore, the insulator 552 can be formed on the side surface of the opening formed in the insulator 580 and the like to have a small thickness like the above-described thickness and to have favorable coverage.

Note that some of precursors usable in an ALD method contain carbon or the like. Thus, in some cases, a film provided by an ALD method contains impurities such as carbon in a larger amount than a film provided by another deposition method. Note that impurities can be quantified by secondary ion mass spectrometry (SIMS) or X-ray photoelectron spectroscopy (XPS).

The insulator 550 functions as part of the gate insulator. The insulator 550 is preferably in contact with a top surface of the insulator 552. The insulator 550 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride are preferable because they are thermally stable. The insulator 550 in this case is an insulator containing at least oxygen and silicon.

As in the insulator 524, the concentration of impurities such as water and hydrogen in the insulator 550 is preferably reduced. The thickness of the insulator 550 is preferably greater than or equal to 1 nm or greater than or equal to 0.5 nm and less than or equal to 15 nm or less than or equal to 20 nm. Note that any of the above minimum values and maximum values can be combined with each other. In this case, it is acceptable that at least part of the insulator 550 has a region with a thickness like the above-described thickness.

Although FIG. 24A, FIG. 24B, or the like illustrates a single-layer structure of the insulator 550, the present invention is not limited to this structure, and a stacked-layer structure of two or more layers may be employed. For example, as illustrated in FIG. 26B, the insulator 550 may have a stacked-layer structure including two layers of an insulator 550a and an insulator 550b over the insulator 550a.

Figure 26B:
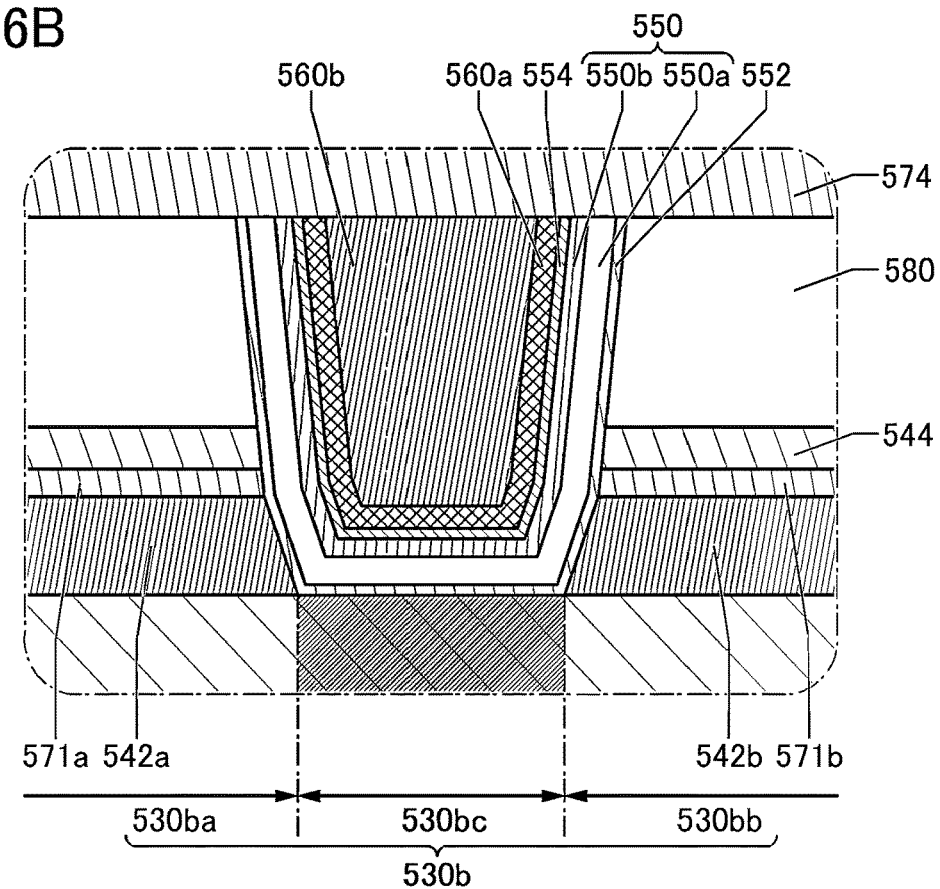

In the case where the insulator 550 has a stacked-layer structure of two layers as illustrated in FIG. 26B, it is preferable that the insulator 550a in a lower layer be formed using an insulator that is likely to transmit oxygen and the insulator 550b in an upper layer be formed using an insulator having a function of inhibiting oxygen diffusion. With such a structure, oxygen contained in the insulator 550a can be inhibited from diffusing into the conductor 560. That is, a reduction in the amount of oxygen supplied to the oxide 530 can be inhibited. In addition, oxidation of the conductor 560 due to oxygen contained in the insulator 550a can be inhibited. For example, it is preferable that the insulator 550a be provided using any of the above-described materials that can be used for the insulator 550 and the insulator 550b be provided using an insulator containing an oxide of one or both of aluminum and hafnium. As the insulator, aluminum oxide, hafnium oxide, an oxide containing aluminum and hafnium (hafnium aluminate), an oxide containing hafnium and silicon (hafnium silicate), or the like can be used. In this embodiment, hafnium oxide is used as the insulator 550b. In this case, the insulator 550b is an insulator containing at least oxygen and hafnium. The thickness of the insulator 550b is preferably greater than or equal to 0.5 nm or greater than or equal to 1.0 nm, and less than or equal to 3.0 nm or less than or equal to 5.0 nm. Note that any of the above minimum values and maximum values can be combined with each other. In that case, at least part of the insulator 550b may include a region having a thickness like the above-described thickness.

In the case where silicon oxide, silicon oxynitride, or the like is used for the insulator 550a, the insulator 550b may be formed using an insulating material that is a high-k material having a high dielectric constant. The gate insulator having a stacked-layer structure of the insulator 550a and the insulator 550b can be thermally stable and can have a high dielectric constant. Thus, a gate potential that is applied during operation of the transistor can be reduced while the physical thickness of the gate insulator is maintained. In addition, the equivalent oxide thickness (EOT) of the insulator functioning as the gate insulator can be reduced. Therefore, the withstand voltage of the insulator 550 can be increased.

The insulator 554 functions as part of a gate insulator. As the insulator 554, a barrier insulating film against hydrogen is preferably used. This can prevent diffusion of impurities such as hydrogen contained in the conductor 560 into the insulator 550 and the oxide 530b. As the insulator 554, an insulator that can be used as the insulator 576 described above may be used. For example, silicon nitride deposited by a PEALD method may be used as the insulator 554. In this case, the insulator 554 is an insulator containing at least nitrogen and silicon.

Furthermore, the insulator 554 may have a barrier property against oxygen. Thus, diffusion of oxygen contained in the insulator 550 into the conductor 560 can be inhibited.

Furthermore, the insulator 554 needs to be provided in an opening formed in the insulator 580 and the like, together with the insulator 552, the insulator 550, and the conductor 560. The thickness of the insulator 554 is preferably thin for miniaturization of the transistor 500. The thickness of the insulator 554 is preferably greater than or equal to 0.1 nm, greater than or equal to 0.5 nm, or greater than or equal to 1.0 nm, and less than or equal to 3.0 nm or less than or equal to 5.0 nm. Note that any of the above minimum values and maximum values can be combined with each other. In that case, at least part of the insulator 554 preferably includes a region having the above-described thickness. The thickness of the insulator 554 is preferably smaller than that of the insulator 550. In that case, at least part of the insulator 554 may include a region having a thickness that is smaller than that of the insulator 550.

The conductor 560 functions as the first gate electrode of the transistor 500. The conductor 560 preferably includes the conductor 560*a* and the conductor 560*b* placed over the conductor 560*a*. For example, the conductor 560*a* is preferably placed to cover a bottom surface and a side surface of the conductor 560*b*. As illustrated in FIGS. 24A and 24B, the top portion of the conductor 560 is substantially level with the top portion of the insulator 550. Note that the conductor 560 is illustrated to have a two-layer structure of the conductor 560*a* and the conductor 560*b* in FIG. 24A and FIG. 24B, but the conductor 560 can have, besides the two-layer structure, a single-layer structure or a stacked-layer structure of three or more layers.

For the conductor 560*a*, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material that has a function of inhibiting diffusion of oxygen (e.g., at least one of an oxygen atom, an oxygen molecule, and the like).

When the conductor 560*a* has a function of inhibiting diffusion of oxygen, it is possible to inhibit a reduction in conductivity of the conductor 560*b* due to oxidation caused by oxygen contained in the insulator 550. As the conductive material having a function of inhibiting diffusion of oxygen, for example, titanium, titanium nitride, tantalum, tantalum nitride, ruthenium, or ruthenium oxide is preferably used.

Furthermore, the conductor 560 also functions as a wiring and thus a conductor having high conductivity is preferably used as the conductor 560. For example, a conductive material containing tungsten, copper, or aluminum as its main component can be used for the conductor 560*b*. Moreover, the conductor 560*b* can have a stacked-layer structure. Specifically, for example, the conductor 560*b* can have a stacked-layer structure of the above conductive material and titanium or titanium nitride.

In the transistor 500, the conductor 560 is formed in a self-aligned manner to fill the opening formed in the insulator 580 and the like. The formation of the conductor 560 in this manner allows the conductor 560 to be placed properly in a region between the conductor 542*a* and the conductor 542*b* without alignment.

As illustrated in FIG. 24B, in the channel width direction of the transistor 500, with reference to a bottom surface of the insulator 522, the level of the bottom surface of the conductor 560 in a region where the conductor 560 and the oxide 530*b* do not overlap is preferably lower than the level of a bottom surface of the oxide 530*b*. When the conductor 560 functioning as the gate electrode covers the side surface and the top surface of the channel formation region of the oxide 530*b* with the insulator 550 and the like therebetween, the electric field of the conductor 560 can easily act on the entire channel formation region of the oxide 530*b*. Thus, the on-state current of the transistor 500 can be increased and the frequency characteristics of the transistor 500 can be improved. The difference between the level of the bottom surface of the conductor 560 in the region where the oxides 530*a* and 530*b* do not overlap with the conductor 560 and the level of the bottom surface of the oxide 530*b*, with the level of the bottom surface of the insulator 522 as a reference, is preferably greater than or equal to 0 nm, greater than or equal to 3 nm, or greater than or equal to 5 nm, and less than or equal to 20 nm, less than or equal to 50 nm, or less than or equal to 100 nm. Note that any of the above minimum values and maximum values can be combined with each other.

The insulator 580 is provided over the insulator 544, and the opening is formed in a region where the insulator 550 and the conductor 560 are to be provided. In addition, the top surface of the insulator 580 may be planarized.

The insulator 580 functioning as an interlayer film preferably has a low permittivity. When a material with a low permittivity is used for an interlayer film, parasitic capacitance generated between wirings can be reduced. The insulator 580 is preferably provided using a material similar to that for the insulator 516, for example. In particular, silicon oxide and silicon oxynitride, which have thermal stability, are preferable. Materials such as silicon oxide, silicon oxynitride, and porous silicon oxide are particularly preferable because a region containing oxygen to be released by heating can be easily formed.

As for the insulator 580, the concentration of impurities such as water and hydrogen in the insulator 580 is preferably reduced. Oxide containing silicon such as silicon oxide, silicon oxynitride, or the like is used as appropriate for the insulator 580, for example.

The insulator 574 preferably functions as barrier insulating films that inhibit impurities such as water and hydrogen from diffusing into the insulator 580 from above and preferably have a function of capturing impurities such as hydrogen. The insulator 574 preferably functions as a barrier insulating film that inhibits passage of oxygen. For each of the insulator 574, a metal oxide having an amorphous structure, for example, an insulator such as aluminum oxide can be used. In this case, the insulator 574 is an insulator containing at least oxygen and aluminum. The insulator 574, which has a function of capturing impurities such as hydrogen, is provided in contact with the insulator 580 in a region sandwiched between the insulator 512 and the insulator 581, whereby impurities such as hydrogen contained in the insulator 580 and the like can be captured and the amount of hydrogen in the region can be constant. It is preferable to use, in particular, aluminum oxide having an amorphous structure for the insulator 574, for hydrogen can be captured or fixed more effectively in some cases. Accordingly, the transistor 500 and a semiconductor device which have favorable characteristics and high reliability can be manufactured.

The insulator 576 functions as a barrier insulating film that inhibits impurities such as water and hydrogen from diffusing into the insulator 580 from above. The insulator 576 is provided over the insulator 574. The insulator 576 is preferably formed using a nitride containing silicon such as silicon nitride or silicon nitride oxide. For example, silicon nitride deposited by a sputtering method is used for the insulator 576. When the insulator 576 is deposited by a sputtering method, a high-density silicon nitride film can be formed. To obtain the insulator 576, silicon nitride deposited by a PEALD method or a CVD method may be stacked over silicon nitride deposited by a sputtering method.

One of a first terminal and a second terminal of the transistor 500 is electrically connected to a conductor 540*a* serving as a plug, and the other of the first terminal and the second terminal of the transistor 500 is electrically connected to a conductor 540*b*. Note that in this specification and the like, the conductor 540a and the conductor 540b are collectively referred to as the conductor 540.

The conductor 540a is provided in a region overlapping with the conductor 542a, for example. Specifically, an opening portion is provided in the insulator 571a, the insulator 544, the insulator 580, the insulator 574, the insulator 576, and the insulator 581 illustrated in FIG. 24A and in the insulator 582 and the insulator 586 illustrated in FIG. 23 in the region overlapping with the conductor 542a, and the conductor 540a is provided inside the opening portion. The conductor 540b is provided in a region overlapping with the conductor 542b, for example. Specifically, an opening portion is provided in the insulator 571b, the insulator 544, the insulator 580, the insulator 574, the insulator 576, and the insulator 581 illustrated in FIG. 24A and in the insulator 582 and the insulator 586 illustrated in FIG. 23 in the region overlapping with the conductor 542b, and the conductor 540b is provided inside the opening portion. Note that the insulator 582 and the insulator 586 are described later.

As illustrated in FIG. 24A, an insulator 541a having an impurity barrier property may be provided between the conductor 540a and a side surface of the opening portion in the region overlapping with the conductor 542a. In a similar manner, an insulator 541b having an impurity barrier property may be provided between the conductor 540b and a side surface of the opening portion in the region overlapping with the conductor 542b. Note that in this specification and the like, the insulator 541a and the insulator 541b are collectively referred to as the insulator 541.

For the conductor 540a and the conductor 540b, a conductive material containing tungsten, copper, or aluminum as its main component is preferably used. The conductor 540a and the conductor 540b may each have a stacked-layer structure.

In the case where the conductor 540 has a stacked-layer structure, a conductive material having a function of inhibiting passage of impurities such as water and hydrogen is preferably used for a first conductor placed in the vicinity of the insulator 574, the insulator 576, the insulator 581, the insulator 580, the insulator 544, and the insulator 571. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Moreover, impurities such as water and hydrogen contained in a layer above the insulator 576 can be inhibited from entering the oxide 530 through the conductor 540a and the conductor 540b.

For the insulator 541a and the insulator 541b, for example, a barrier insulating film that can be used for the insulator 544 or the like may be used. For the insulator 541a and the insulator 541b, for example, an insulator such as silicon nitride, aluminum oxide, or silicon nitride oxide may be used. Since the insulator 541a and the insulator 541b are provided in contact with the insulator 574, the insulator 576, and the insulator 571, impurities such as water and hydrogen contained in the insulator 580 or the like can be inhibited from entering the oxide 530 through the conductor 540a and the conductor 540b. In particular, silicon nitride is suitable because of its high blocking property against hydrogen. Furthermore, oxygen contained in the insulator 580 can be prevented from being absorbed by the conductor 540a and the conductor 540b.

When the insulator 541a and the insulator 541b each have a stacked-layer structure illustrated in FIG. 24A, a first insulator in contact with an inner wall of the opening formed in the insulator 580 and the like and a second insulator on the inner side of the first insulator are preferably formed using a combination of a barrier insulating film against oxygen and a barrier insulating film against hydrogen.

For example, aluminum oxide deposited by an ALD method may be used as the first insulator and silicon nitride deposited by a PEALD method may be used as the second insulator. With this structure, oxidation of the conductor 540 can be inhibited, and hydrogen can be prevented from entering the conductor 540.

Although the first insulator of the insulator 541 and the second insulator of the insulator 541 are stacked in the transistor 500, the present invention is not limited thereto. For example, the insulator 541 may have a single-layer structure or a stacked-layer structure of three or more layers. Although the first conductor of the conductor 540 and the second conductor of the conductor 540 are stacked in the transistor 500, the present invention is not limited thereto. For example, the conductor 540 may have a single-layer structure or a stacked-layer structure of three or more layers.

As illustrated in FIG. 23, a conductor 610 and a conductor 612, and the like, serving as wirings may be provided in contact with top portions of the conductor 540a and the conductor 540b. For the conductor 610 and the conductor 612, a conductive material containing tungsten, copper, or aluminum as its main component is preferably used. Furthermore, the conductor may have a stacked-layer structure. Specifically, the conductor may be a stack of titanium or titanium nitride and the conductive material, for example. Note that the conductor may be formed to be embedded in an opening provided in an insulator.

The structure of the transistor included in the semiconductor device of one embodiment of the present invention is not limited to the structures of the transistors 500 illustrated in FIG. 23, FIG. 24A, FIG. 24B, and FIG. 25. The structure of the transistor included in the semiconductor device of one embodiment of the present invention may be changed in accordance with circumstances.

Figure 27:
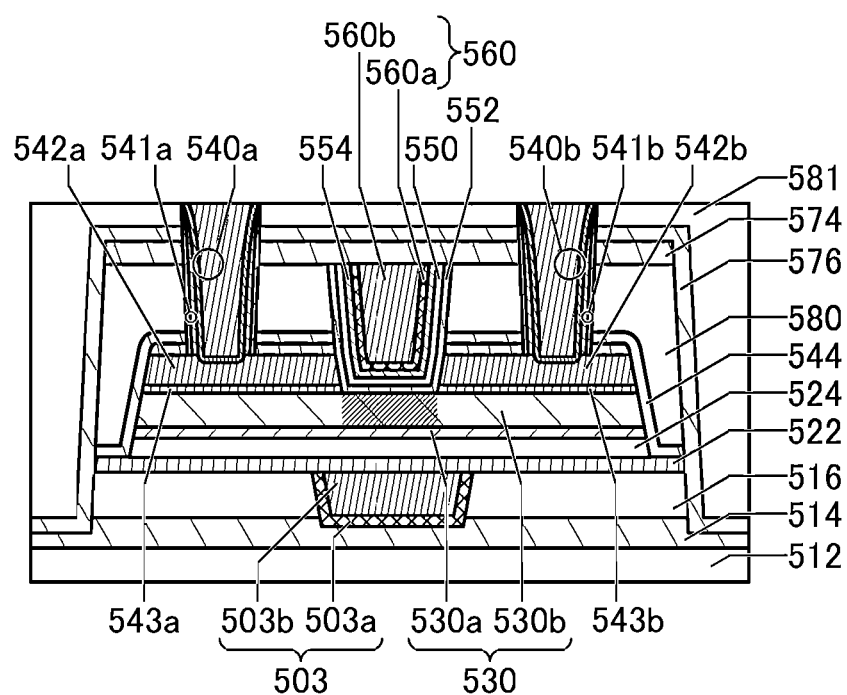
FIG. 27 is a schematic cross-sectional view showing a structure example of a transistor.

For example, the transistor 500 illustrated in FIG. 23, FIG. 24A, FIG. 24B, and FIG. 25 may have a structure illustrated in FIG. 27. The transistor in FIG. 27 is different from the transistor 500 illustrated in FIG. 23, FIG. 24A, FIG. 24B, and FIG. 25 in that an oxide 543a and an oxide 543b are provided. Note that in this specification and the like, the oxide 543a and the oxide 543b are collectively referred to as an oxide 543. The cross section in the channel-width direction of the transistor in FIG. 27 can have a structure similar to the cross section of the transistor 500 illustrated in FIG. 24B.

The oxide 543a is provided between the oxide 530b and the conductor 542a, and the oxide 543b is provided between the oxide 530b and the conductor 542b. The oxide 543a is preferably in contact with the top surface of the oxide 530b and the bottom surface of the conductor 542a. The oxide 543b is preferably in contact with the top surface of the oxide 530b and the bottom surface of the conductor 542b.

The oxide 543 preferably has a function of inhibiting passage of oxygen. The oxide 543 having a function of inhibiting passage of oxygen is preferably placed between the oxide 530b and the conductor 542 functioning as the source electrode or the drain electrode, in which case the electric resistance between the conductor 542 and the oxide 530b can be reduced. Such a structure can improve the electrical characteristics, the field-effect mobility, and the reliability of the transistor 500 in some cases.

A metal oxide containing the element M may be used as the oxide 543. In particular, aluminum, gallium, yttrium, or tin is preferably used as the element M. The concentration of the element M in the oxide 543 is preferably higher than that in the oxide 530*b*. Furthermore, gallium oxide may be used for the oxide 543. A metal oxide such as an In-M-Zn oxide may be used as the oxide 543. Specifically, the atomic ratio of the element M to In in the metal oxide used as the oxide is preferably greater than the atomic ratio of the element M to In in the metal oxide used as the oxide 530*b*. The thickness of the oxide 543 is preferably greater than or equal to 0.5 nm or greater than or equal to 1 nm, and less than or equal to 2 nm, less than or equal to 3 nm, or less than or equal to 5 nm. Note that any of the above minimum values and maximum values can be combined with each other. The oxide 543 preferably has crystallinity. In the case where the oxide 543 has crystallinity, release of oxygen from the oxide 530 can be favorably inhibited. When the oxide 543 has a hexagonal crystal structure, for example, release of oxygen from the oxide 530 can sometimes be inhibited.

An insulator 582 is provided over the insulator 581, and an insulator 586 is provided over the insulator 582.

A substance having a barrier property against oxygen and hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used for the insulator 586, for example.

Next, the capacitor 600 and a peripheral wiring or plug included the semiconductor device illustrated in FIG. 23 and FIG. 25 are described. The capacitor 600 and the wiring and/or the plug are provided above the transistor 500 illustrated in FIG. 23 and FIG. 25.

The capacitor 600 includes, for example, a conductor 610, a conductor 620, and an insulator 630.

The conductor 610 is provided over one of the conductor 540*a* and the conductor 540*b*, the conductor 546, and the insulator 586. The conductor 610 has a function of one of the pair of electrodes of the capacitor 600.

A conductor 612 is provided over the other of the conductor 540*a* and the conductor 540*b* and the insulator 586. The conductor 612 has a function of a plug, a wiring, a terminal, or the like that electrically connects the transistor 500 to the circuit element, wiring, or the like that is provided above the transistor 500.

Note that the conductor 612 and the conductor 610 can be formed at the same time.

As the conductor 612 and the conductor 610, it is possible to use a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 are each illustrated to have a single-layer structure in FIG. 23; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The insulator 630 is provided over the insulator 586 and the conductor 610. The insulator 630 serves as a dielectric sandwiched between the pair of electrodes of the capacitor 600.

For the insulator 630, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or zirconium oxide can be used. Alternatively, the insulator 630 can be provided to have a single-layer structure or a stacked-layer structure using the above-described materials.

Alternatively, for the insulator 630, a stacked-layer structure using a material with high dielectric strength such as silicon oxynitride and a high permittivity (high-k) material may be used, for example. In the capacitor 600 having such a structure, a sufficient capacitance can be ensured owing to the high permittivity (high-k) insulator, and the dielectric strength can be increased owing to the insulator with high dielectric strength, so that the electrostatic breakdown of the capacitor 600 can be inhibited.

Examples of the insulator of a high permittivity (high-k) material (high dielectric constant material) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Alternatively, for example, a single layer or stacked layers of an insulator containing a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST) may be used as the insulator 630. For the insulator 630, a compound containing hafnium and zirconium may be used, for example. As miniaturization and high integration of semiconductor devices progress, a problem such as a leakage current from a transistor, a capacitor, and the like might arise because of a thinner gate insulator and a thinner dielectric used in the capacitor. When a high-k material is used as a gate insulator and an insulator functioning as a dielectric used for a capacitor, a gate potential during operation of the transistor can be lowered and capacitance of the capacitor can be ensured while the physical thickness is maintained.

The conductor 620 is provided to overlap with the conductor 610 with the insulator 630 therebetween. The conductor 610 has a function of one of the pair of electrodes of the capacitor 600, and the conductor 620 has a function of the other of the pair of electrodes of the capacitor 600.

For the conductor 620, a conductive material such as a metal material, an alloy material, or a metal oxide material can be used. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, may be used. For example, the conductor 620 can be formed using a material that can be used for the conductor 610. Furthermore, the conductor 620 may have a single-layer structure or a stacked structure of two or more layers.

An insulator 640 is provided over the conductor 620 and the insulator 630. As the insulator 640, a film having a barrier property that prevents diffusion of hydrogen, impurities, or the like into the region where the transistor 500 is formed is preferably used. Therefore, a material similar to that for the insulator 324 can be used.

An insulator 650 is provided over the insulator 640. The insulator 650 can be provided using a material similar to that for the insulator 320. The insulator 650 may function as a planarization film that covers an uneven shape thereunder. Thus, the insulator 650 can be formed using any of the materials usable for the insulator 324, for example.

Although the capacitor 600 illustrated in FIG. 23 and FIG. 25 is a planar capacitor, the shape of the capacitor is not limited thereto. For example, the capacitor 600 may be a cylindrical capacitor.

A wiring layer may be provided above the capacitor 600. For example, in FIG. 23, the insulator 411, the insulator 412, the insulator 413, and the insulator 414 are provided in this order above the insulator 650. In addition, a conductor 416 serving as a plug or a wiring is provided in the insulator 411, the insulator 412, and the insulator 413. The conductor 416 can be provided, for example, in a region overlapping with a conductor 660 to be described below.

In addition, an opening portion is provided in regions of the insulator 630, the insulator 640, and the insulator 650 that overlap with the conductor 612, and a conductor 660 is provided to fill the opening portion. The conductor 660 serves as a plug or a wiring that is electrically connected to the conductor 416 included in the above-described wiring layer.

For example, like the insulator 324 or the like, the insulator 411 and the insulator 414 are each preferably formed using an insulator having a barrier property against impurities such as water and hydrogen. Thus, the insulator 411 and the insulator 414 can be each formed using any of the materials usable for the insulator 324 or the like, for example.

Like the insulator 326, the insulator 412 and the insulator 413 are each preferably formed using, for example, an insulator having a relatively low dielectric constant to reduce the parasitic capacitance generated between wirings.

The conductor 612 and the conductor 416 can be provided using materials similar to those for the conductor 328 and the conductor 330.

Structure Example 2 of Semiconductor Device

Next, a structure example in which the above-described semiconductor device includes FTJ elements is described.

Figure 28:
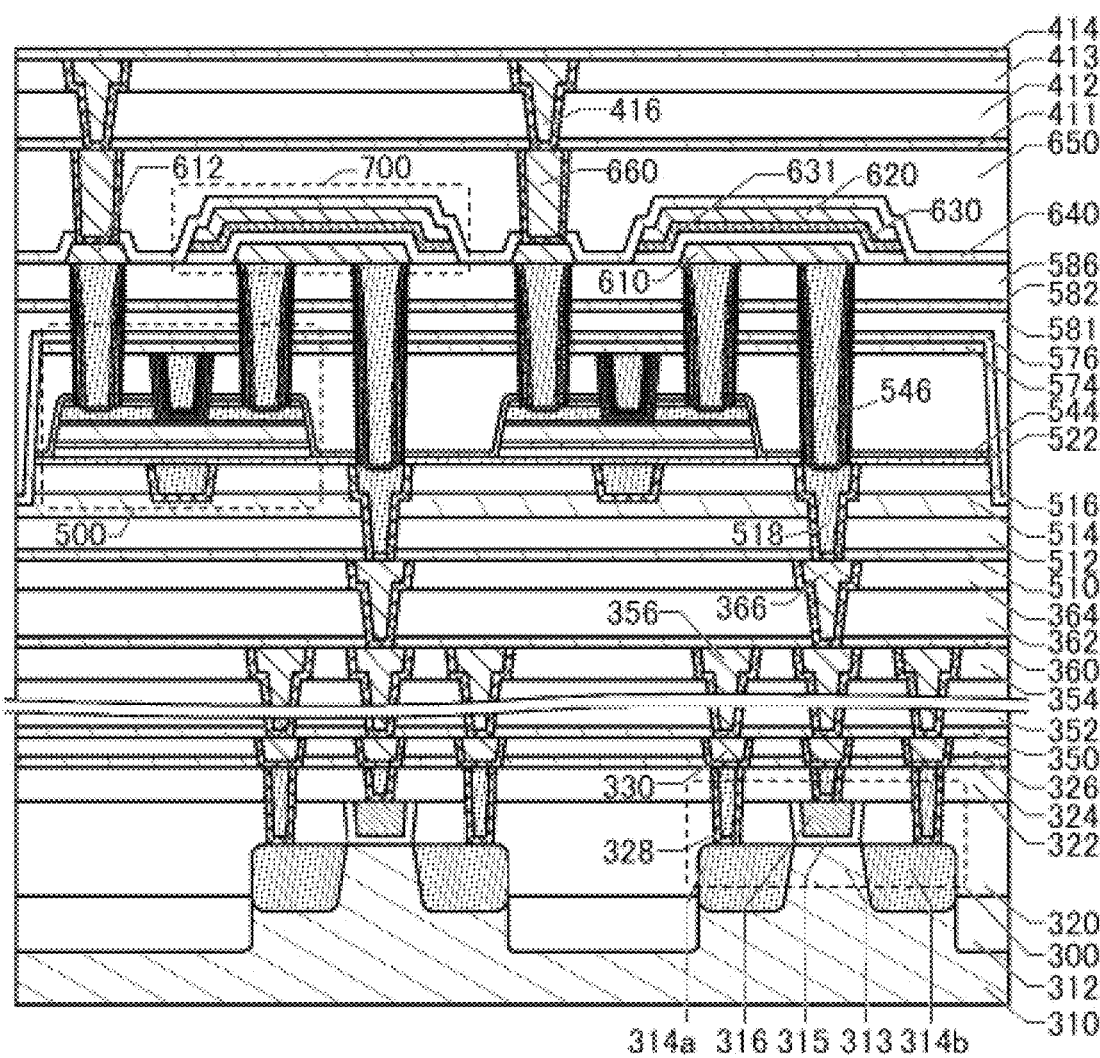
FIG. 28 is a schematic cross-sectional view showing a structure example of a semiconductor device.

FIG. 28 shows an example in which the capacitor 600 positioned over the top surfaces of the insulator 582 and the conductors 546 is replaced with an FTJ element 700 in the semiconductor device illustrated in FIG. 23.

Specifically, the FTJ element 700 includes a conductor 610 functioning as a lower electrode, a conductor 620 functioning as an upper electrode, an insulator 630, and an insulator 631, for example. In particular, a material that can show ferroelectricity can be used as the insulator 631.

Examples of the material that can show ferroelectricity include zirconium oxide, hafnium zirconium oxide (HfZrO$_X$), a material in which an element J1 (the element J1 here is zirconium (Zr), silicon (Si), aluminum (Al), gadolinium (Gd), yttrium (Y), lanthanum (La), strontium (Sr), or the like) is added to hafnium oxide, and a material in which an element J2 (the element J2 here is hafnium (Hf), silicon (Si), aluminum (Al), gadolinium (Gd), yttrium (Y), lanthanum (La), strontium (Sr), or the like) is added to hafnium oxide. As the material that can show ferroelectricity, a piezoelectric ceramic having a perovskite structure such as lead titanate (PbTiO$_X$), barium strontium titanate (BST), strontium titanate, lead zirconate titanate (PZT), strontium bismuth tantalate (SBT), bismuth ferrite (BFO), or barium titanate may be used. As the material that can show ferroelectricity, a mixture or a compound of materials selected from the above-listed materials can be used, for example. Alternatively, the material that can show ferroelectricity can have a stacked-layer structure including a plurality of materials selected from the above-listed materials. Since hafnium oxide, zirconium oxide, hafnium zirconium oxides, and a material in which the element J1 is added to hafnium oxide may change its crystal structure (characteristics) according to structures of upper and lower films, a process, and the like as well as deposition conditions, a material that exhibits ferroelectricity is referred to not only as a ferroelectric but also as a material that can show ferroelectricity in this specification and the like.

A material containing hafnium oxide or a material containing hafnium oxide and zirconium oxide is particularly preferable as the material that can show ferroelectricity because such a material can show ferroelectricity even when processed into a thin film with a thickness of several nanometers. Here, the thickness of the insulator 631 can be less than or equal to 100 nm, preferably less than or equal to 50 nm, further preferably less than or equal to 20 nm, still further preferably less than or equal to 10 nm. With use of a thinned ferroelectric layer, a semiconductor device can be formed by combining a ferroelectric capacitor with the miniaturized transistor 500.

Materials of the conductor 610 and the conductor 612 in FIG. 28 can be similar to those of the conductor 610 and the conductor 612 in FIG. 23. In addition, the conductor 610 and the conductor 612 in FIG. 28 can be formed in a manner similar to that of the conductor 610 and the conductor 612 in FIG. 23.

In FIG. 28, the insulator 630 is provided on the top surfaces of the conductor 610 and some regions of the insulator 586. The insulator 631 is provided on the top surface of the insulator 630 and the conductor 620 is provided on the top surface of the insulator 631.

The insulator 630 functions as a tunnel insulating film of the FTJ element 700. As the insulator 630, silicon oxide, silicon nitride, or a stack of silicon oxide and silicon nitride can be used, for example.

In FIG. 28, the insulator 640 is provided on the top surfaces of regions including end portions of the insulator 630, regions including end portions of the insulator 631, the conductor 620, and some regions of the insulator 586.

Any of the materials that can be used for the insulator 640 in FIG. 23 can be used for the insulator 640, for example.

As in FIG. 28, by employing the structure of the FTJ element 700, an FTJ element can be provided in the semiconductor device illustrated in FIG. 23.

Note that the FTJ element 700 illustrated in FIG. 28 can be the FTJ element FJB described in the above embodiment, for example. By changing the stacking order of the insulator 630 functioning as a tunnel insulating film and the insulator 631 including a material that can show ferroelectricity, the FTJ element 700 can be changed into the FTJ element FJA.

Figure 29:
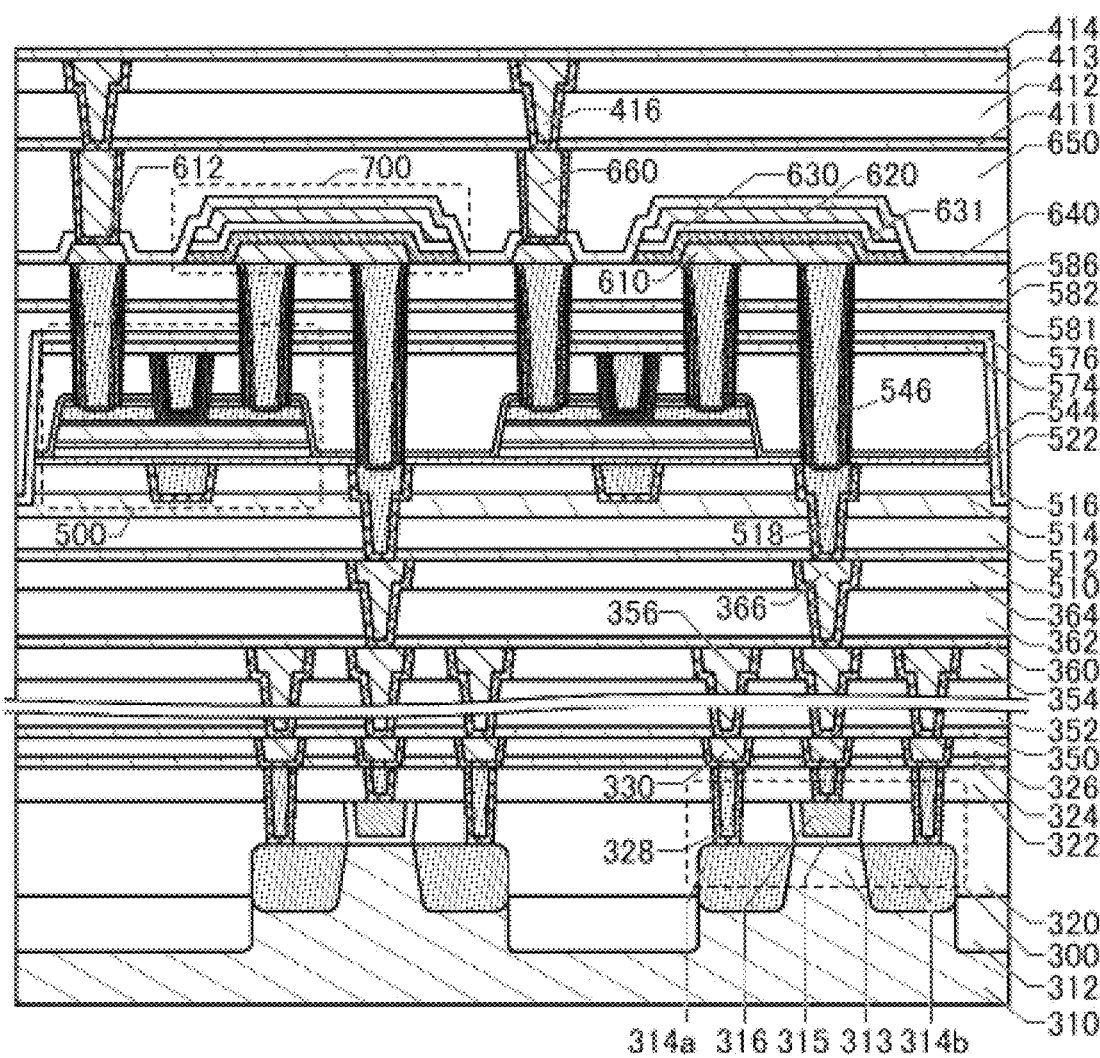
FIG. 29 is a schematic cross-sectional view showing a structure example of a transistor.

As an example, FIG. 29 shows a structure in which the stacking order of the insulator 630 functioning as a tunnel insulating film and the insulator 631 including a material that can show ferroelectricity, which are illustrated in FIG. 28, is reversed. The FTJ element 700 illustrated in FIG. 29 can be the FTJ element FJA described in the above embodiment, for example.

Next, description is made on a structure example of a semiconductor device including a ferroelectric capacitor, which is different from FIG. 28.

Figure 30:
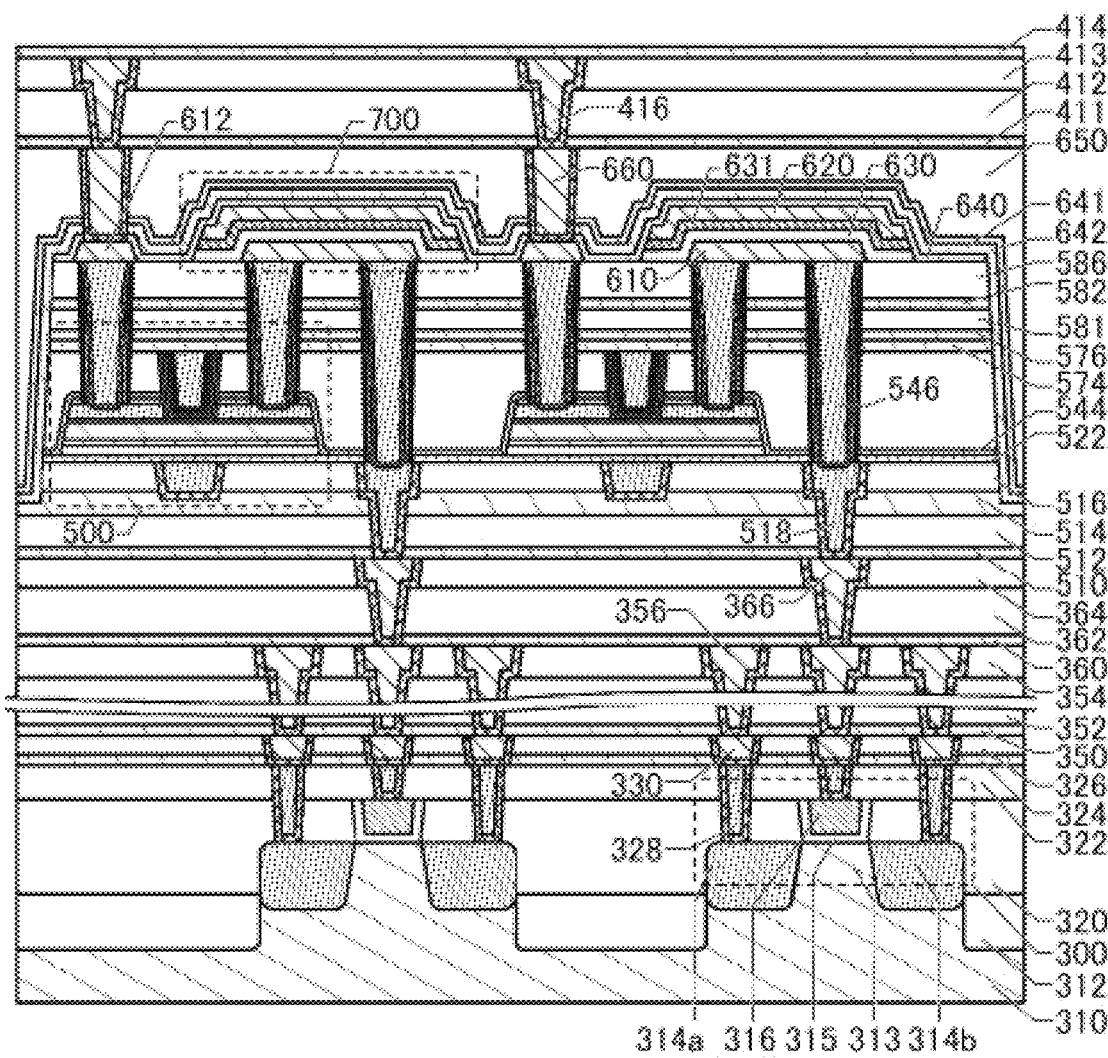
FIG. 30 is a schematic cross-sectional view showing a structure example of a semiconductor device.

A semiconductor device illustrated in FIG. 30 is a modification example of the semiconductor device in FIG. 28, and has a structure in which the transistors 500 and the FTJ elements 700 are surrounded by the insulator 571, the insulator 544, the insulator 574, the insulator 576, the insulator 581, an insulator 641, an insulator 642, and the like.

Although in the semiconductor devices in FIG. 23 and FIG. 28, the substrate 310 to the insulator 574 are sequentially provided and then opening portions reaching the insulator 514 are provided, in the semiconductor device in FIG. 30, the substrate 310 to the insulator 640 are sequentially provided and then opening portions reaching the insulator 514 are provided.

In the semiconductor device in FIG. 30, the insulator 641, the insulator 642, and the insulator 650 are sequentially provided on bottom portions of the opening portions and the top surface of the insulator 640.

Each of the insulator 641 and the insulator 642 preferably functions as a barrier insulating film that inhibits diffusion of impurities such as water and hydrogen into the transistor 500 and the FTJ element 700 from a portion above the transistor 500 and the FTJ element 700.

As a method for depositing the insulator 641, a sputtering method can be used, for example. Silicon nitride deposited by a sputtering method can be used as the insulator 641, for example. Since a sputtering method does not need to use a molecule containing hydrogen as a deposition gas, the hydrogen concentration in the insulator 641 can be reduced. As described above, the hydrogen concentration in the insulator 641 in contact with the conductor 610, the conductor 612, and the insulator 586 is reduced, so that diffusion of hydrogen from the insulator 641 into the conductor 610, the conductor 612, and the insulator 586 can be suppressed.

For example, the insulator 642 is preferably deposited by an ALD method, specifically, a PEALD method. For example, silicon nitride deposited by a PEALD method can be used as the insulator 642. Accordingly, the insulator 642 can be deposited to have good coverage; thus, even when unevenness of a base causes a pin hole, disconnected part on a step, or the like in the insulator 641, covering the pin hole or disconnected part on a step with the insulator 642 can suppress diffusion of hydrogen into the conductor 610, the conductor 612, and the insulator 586.

By employing the structure illustrated in FIG. 30, impurities such as water and hydrogen can be prevented from diffusing to the transistor 500 and the FTJ element 700 side through the insulator 512, the insulator 514, the insulator 641, the insulator 642, and the like. Furthermore, oxygen contained in the insulator 580 and the like can be prevented from diffusing to the outside through the insulator 574, the insulator 641, the insulator 642, and the like.

When a semiconductor device using a transistor including an oxide semiconductor has the structure described in this embodiment, a change in electrical characteristics of the transistor can be inhibited and the reliability can be improved.

In a semiconductor device using a transistor including an oxide semiconductor, when a circuit element is stacked, miniaturized, or highly integrated, for example, the area of a circuit included in the semiconductor device can be reduced. In particular, the use of a ferroelectric capacitor as the capacitor included in the semiconductor device can increase the capacitance value of the capacitor; thus, the capacitor can be miniaturized. Therefore, the area of a circuit including the capacitor can be reduced. Furthermore, by stacking a transistor and a capacitor as described in this embodiment, the circuit size can be increased while an increase in the circuit area in the semiconductor device is suppressed.

Note that this embodiment can be combined with any of the other embodiments in this specification as appropriate.

Embodiment 7

Described in this embodiment is a metal oxide (hereinafter also referred to as an oxide semiconductor) that can be used in an OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, classification of the crystal structures of an oxide semiconductor will be described using FIG. 31A. FIG. 31A is a diagram showing the classification of crystal structures of an oxide semiconductor, typically IGZO (a metal oxide containing In, Ga, and Zn).

As shown in FIG. 31A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (Cloud-Aligned Composite) (excluding single crystal and poly crystal). Note that the term "Crystalline" excludes single crystal, poly crystal, and completely amorphous. The term "Crystal" includes single crystal and poly crystal.

Note that the structures shown in the thick frame in FIG. 31A are in an intermediate state between "Amorphous" and "Crystal," and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 31B shows an XRD spectrum, which is obtained by GIXD (Grazing-Incidence XRD) measurement, of a CAAC-IGZO film classified into "Crystalline" (the horizontal axis represents 2θ [deg.] and the vertical axis represents intensity in arbitrary unit (a.u.)). Note that a GIXD method is also referred to as a thin film method or a Seemann-Bohlin method. The XRD spectrum that is shown in FIG. 31B and obtained by GIXD measurement is hereinafter simply referred to as an XRD spectrum. The CAAC-IGZO film shown in FIG. 31B has a composition in the neighborhood of In:Ga:Zn=4:2:3 [atomic ratio]. In addition, the thickness of the CAAC-IGZO film shown in FIG. 31B is 500 nm.

As shown in FIG. 31B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. Note that as shown in FIG. 31B, the peak at 2θ of around 31° is asymmetric with respect to the axis of an angle at which peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 31C shows a diffraction pattern of the CAAC-IGZO film. FIG. 31C shows a diffraction pattern observed by NBED in which an electron beam is incident in a direction parallel to the substrate. Note that the CAAC-IGZO film shown in FIG. 31C has a composition in the vicinity of In:Ga:Zn=4:2:3 [atomic ratio]. In the nanobeam electron diffraction method, electron diffraction is performed with a probe diameter of 1 nm.

As shown in FIG. 31C, a plurality of spots indicating c-axis alignment are observed in the diffraction pattern of the CAAC-IGZO film.

<<Structure of Oxide Semiconductor>>

Note that oxide semiconductors might be classified in a manner different from that in FIG. 31A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Entry of impurities, formation of defects, or the like might decrease the crystallinity of an oxide semiconductor, which means that the CAAC-OS can be referred to as an oxide semiconductor having small amounts of impurities, defects (e.g., oxygen vacancies), and the like. Hence, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for an OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., greater than or equal to 1 nm and less than or equal to 30 nm).

[A-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, according to EDX mapping obtained by energy dispersive X-ray spectroscopy (EDX), the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (u), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$ and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

A charge trapped by the trap states in the oxide semiconductor takes a long time to disappear and might behave like a fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained using SIMS, is set lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained using SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

Note that this embodiment can be combined with any of the other embodiments in this specification as appropriate.

Embodiment 8

In this embodiment, examples of a semiconductor wafer where the memory device or the like described in the above embodiment is formed and electronic components incorporating the memory device will be described.

<Semiconductor Wafer>

First, an example of a semiconductor wafer where a memory device or the like is formed is described with reference to FIG. 32A.

Figure 32A:
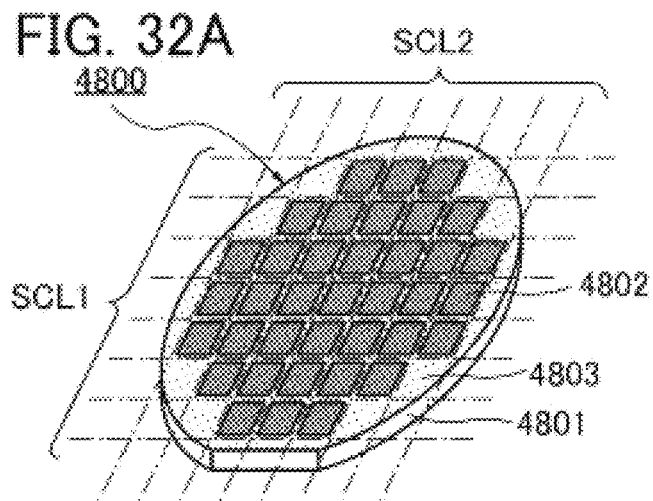
FIG. 32A is a perspective view showing an example of a semiconductor wafer.

A semiconductor wafer 4800 illustrated in FIG. 32A includes a wafer 4801 and a plurality of circuit portions 4802 provided on the top surface of the wafer 4801. A portion without the circuit portions 4802 on the top surface of the wafer 4801 is a spacing 4803 that is a region for dicing.

The semiconductor wafer 4800 can be formed by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

Next, a dicing step is performed. The dicing is performed along scribe lines SCL1 and scribe lines SCL2 (referred to as dicing lines or cutting lines in some cases) indicated by dashed-dotted lines. To perform the dicing step easily, the spacing 4803 is preferably arranged such that a plurality of scribe lines SCL1 are parallel to each other, a plurality of scribe lines SCL2 are parallel to each other, and the scribe lines SCL1 and the scribe lines SCL2 intersect each other perpendicularly.

Figure 32B:
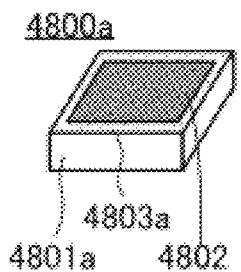
FIG. 32B is a perspective view showing an example of a chip.

With the dicing step, a chip 4800a as illustrated in FIG. 32B can be cut out from the semiconductor wafer 4800. The chip 4800a includes a wafer 4801a, the circuit portion 4802, and a spacing 4803a. Note that it is preferable to make the spacing 4803a as small as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 32A. The element substrate may be a rectangular semiconductor wafer, for example. The shape of the element substrate can be changed as appropriate, depending on a manufacturing process of an element and an apparatus for manufacturing the element.

<Electronic Component>

Figure 32C:
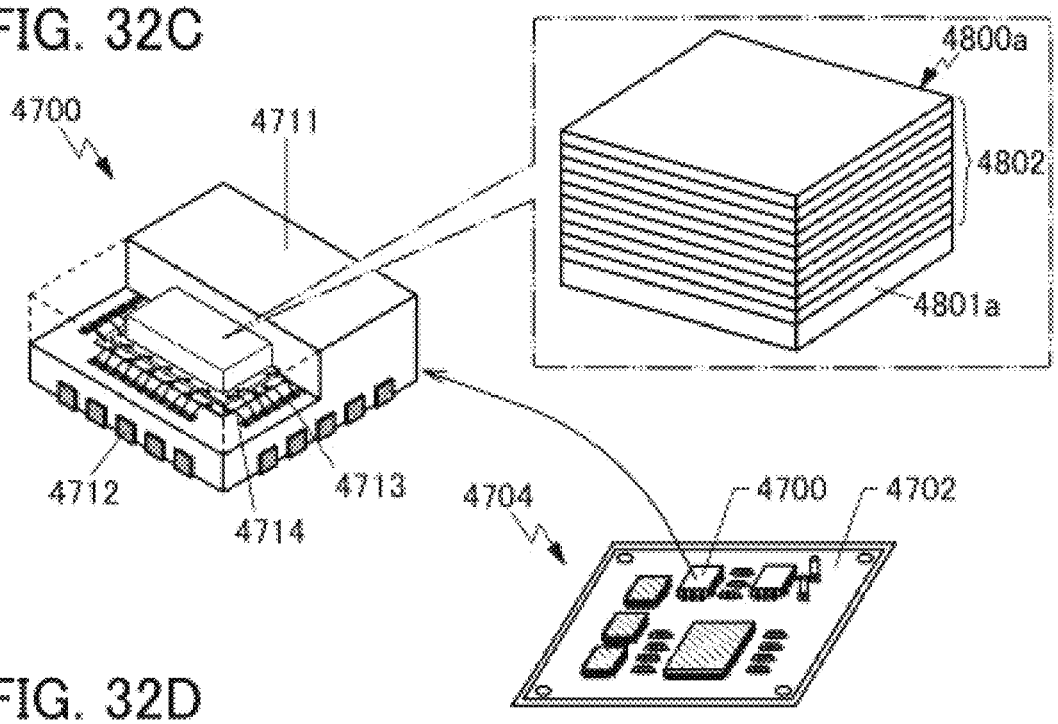
FIG. 32C and FIG. 32D are perspective views showing examples of electronic components.

FIG. 32C is a perspective view of an electronic component 4700 and a substrate (a mounting board 4704) on which the electronic component 4700 is mounted. The electronic component 4700 illustrated in FIG. 32C includes the chip 4800a in a mold 4711. Note that the chip 4800a illustrated in FIG. 32C is shown to have a structure in which the circuit portions 4802 are stacked. That is, the memory device described in the above embodiment can be used for the circuit portion 4802. To illustrate the inside of the electronic component 4700, some portions are omitted in FIG. 32C. The electronic component 4700 includes a land 4712 outside the mold 4711. The land 4712 is electrically connected to an electrode pad 4713, and the electrode pad 4713 is electrically connected to the chip 4800a via a wire 4714. The electronic component 4700 is mounted on a printed circuit board 4702, for example. A plurality of such electronic components are combined and electrically connected to each other on the printed circuit board 4702; thus, the mounting board 4704 is completed.

Figure 32D:
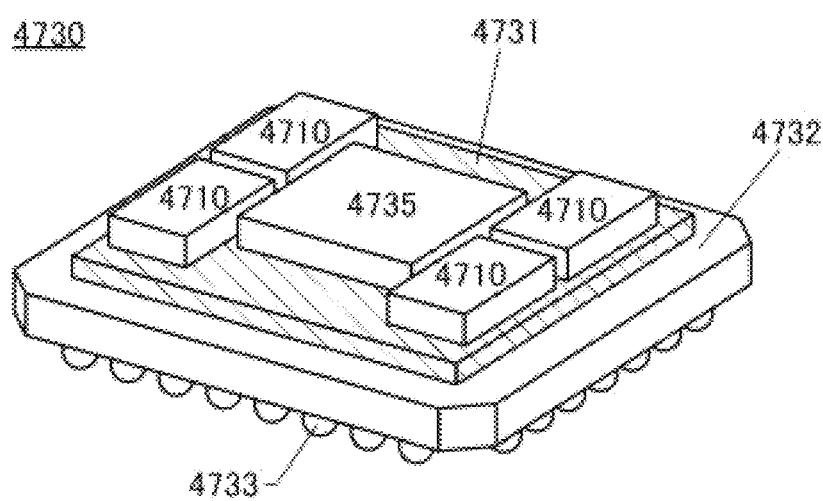

FIG. 32D is a perspective view of an electronic component 4730. The electronic component 4730 is an example of an SiP (System in package) or an MCM (Multi Chip Module). In the electronic component 4730, an interposer 4731 is provided over a package substrate 4732 (a printed circuit board), and a semiconductor device 4735 and a plurality of semiconductor devices 4710 are provided over the interposer 4731.

The electronic component 4730 includes the semiconductor devices 4710. Examples of the semiconductor device 4710 include the memory device described in the above embodiment and a high bandwidth memory (HBM). Moreover, an integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings have a single-layer structure or a multi-layer structure. The interposer 4731 has a function of electrically connecting an integrated circuit provided on the interposer 4731 to an electrode provided on the package substrate 4732. Accordingly, the interposer is sometimes referred to as a redistribution substrate or an intermediate substrate. A through electrode may be provided in the interposer 4731 and used to electrically connect the integrated circuit and the package substrate 4732. In the case of using a silicon interposer, a TSV (Through Silicon $V_{IA}$) can also be used as the through electrode.

A silicon interposer is preferably used as the interposer 4731. The silicon interposer can be manufactured at lower cost than an integrated circuit because it is not necessary to provide an active element. Meanwhile, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, minute wirings are required to be formed densely on an interposer on which an HBM is mounted. For this reason, a silicon interposer is preferably used as the interposer on which an HBM is mounted.

In a SiP, an MCM, or the like using a silicon interposer, a decrease in reliability due to a difference in expansion coefficient between an integrated circuit and the interposer is less likely to occur. Furthermore, the surface of a silicon interposer has high planarity, so that a poor connection between the silicon interposer and an integrated circuit provided thereon is less likely to occur. It is particularly preferable to use a silicon interposer for a 2.5D package (2.5D mounting) in which a plurality of integrated circuits are arranged side by side on an interposer.

A heat sink (radiator plate) may be provided to overlap with the electronic component 4730. When a heat sink is provided, the heights of integrated circuits provided on the interposer 4731 are preferably the same. For example, in the electronic component 4730 described in this embodiment, the heights of the semiconductor devices 4710 and the semiconductor device 4735 are preferably the same.

An electrode 4733 may be provided on the bottom of the package substrate 4732 to mount the electronic component 4730 on another substrate. FIG. 32D illustrates an example in which the electrode 4733 is formed of a solder ball. Solder balls are provided in a matrix on the bottom of the package substrate 4732, whereby a BGA (Ball Grid Array) can be achieved.

Alternatively, the electrode 4733 may be formed of a conductive pin. When conductive pins are provided in a matrix on the bottom of the package substrate 4732, a PGA (Pin Grid Array) can be achieved.

The electronic component 4730 can be mounted on another substrate in a variety of manners other than a BGA and a PGA. For example, an SPGA (Staggered Pin Grid Array), an LGA (Land Grid Array), a QFP (Quad Flat Package), a QFJ (Quad Flat J-leaded package), or a QFN (Quad Flat Non-leaded package) can be employed.

Note that this embodiment can be combined with any of the other embodiments in this specification as appropriate.

Embodiment 9

In this embodiment, a CPU that can include the memory device of the above embodiment will be described.

Figure 33:
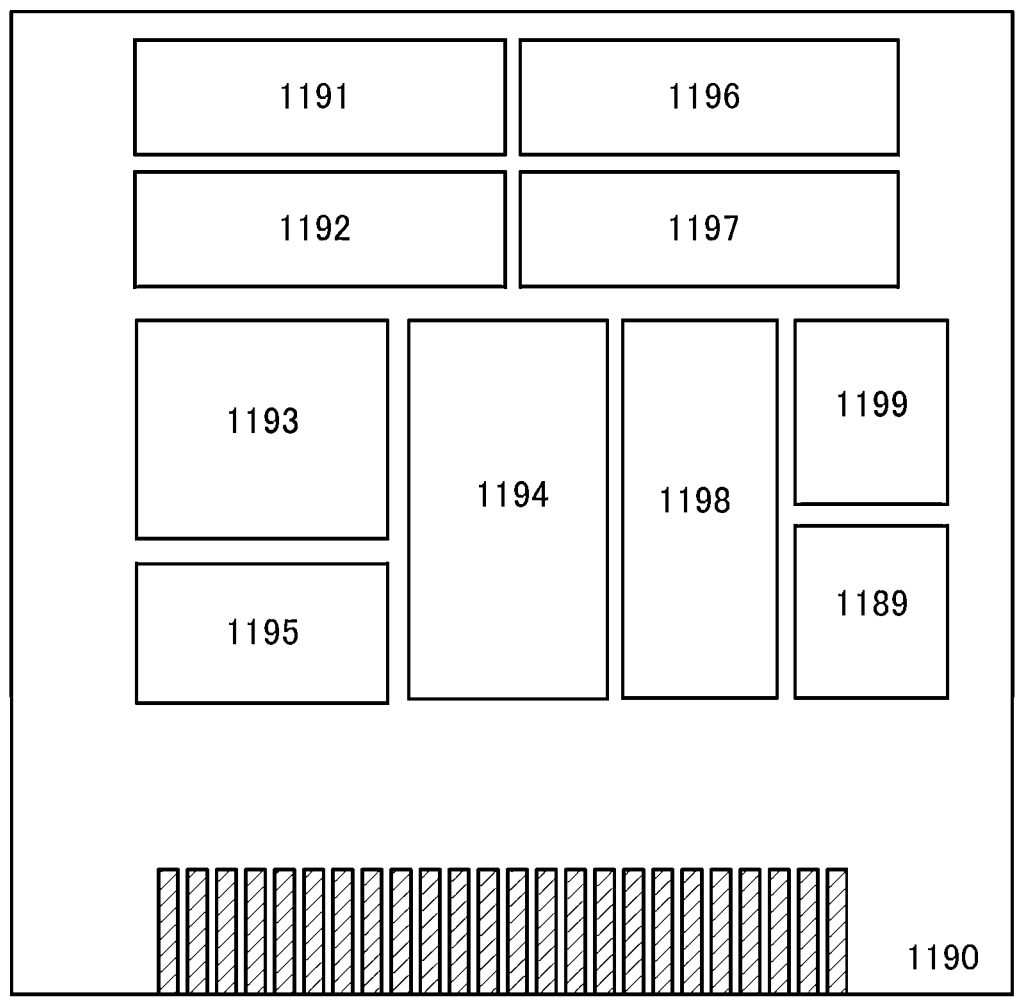
FIG. 33 is a block diagram illustrating a CPU.

FIG. 33 is a block diagram illustrating a structure example of a CPU in part of which the memory device described in the above embodiment is used.

The CPU illustrated in FIG. 33 includes an ALU 1191 (ALU: Arithmetic logic unit), an ALU controller 1192, an instruction decoder 1193, an interrupt controller 1194, a timing controller 1195, a register 1196, a register controller 1197, a bus interface 1198 (Bus I/F), a rewritable ROM 1199, and a ROM interface 1189 (ROM I/F) over a substrate 1190. A semiconductor substrate, an SOI substrate, a glass substrate, or the like is used as the substrate 1190. The ROM 1199 and the ROM interface 1189 may be provided over separate chips. Needless to say, the CPU illustrated in FIG. 33 is just an example of a simplified structure, and an actual CPU may have a variety of structures depending on the usage. For example, the CPU may have a structure in which a structure including the CPU illustrated in FIG. 33 or an arithmetic circuit is considered as one core, a plurality of the cores are included, and the cores operate in parallel, namely a structure like that of a GPU. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device, a peripheral circuit, or the like on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above circuits.

In the CPU illustrated in FIG. 33, a memory cell is provided in the register 1196. The memory device described in any of the above embodiments can be included in the register 1196, for example.

In the CPU illustrated in FIG. 33, the register controller 1197 selects a retaining operation in the register 1196 in accordance with an instruction from the ALU 1191. That is, the register controller 1197 selects whether data is held by a flip-flop or by a capacitor in a memory cell included in the register 1196. When data retention by the flip-flop is selected, power supply voltage is supplied to the memory cell in the register 1196. When data retention by the capacitor is selected, the data is rewritten into the capacitor, and supply of power supply voltage to the memory cell in the register 1196 can be stopped.

Note that this embodiment can be combined with any of the other embodiments in this specification as appropriate.

Embodiment 10

In this embodiment, examples of electronic devices each including the memory device described in the above embodiment will be described. FIG. 34A to FIG. 34I show electronic devices each of which includes the electronic component 4700 including the memory device.

[Mobile Phone]

Figure 34A:
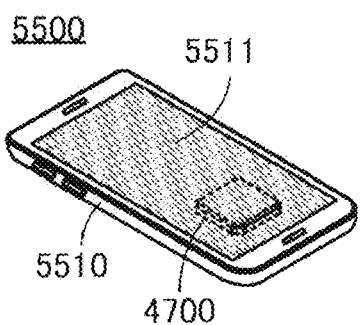
FIG. 34A to FIG. 34I are each a perspective view or a schematic view showing an example of a product.

An information terminal 5500 illustrated in FIG. 34A is a mobile phone (a smartphone), which is a type of information terminal. The information terminal 5500 includes a housing 5510 and a display portion 5511. As input interfaces, a touch panel and a button are provided in the display portion 5511 and the housing 5510, respectively.

By using the memory device described in the above embodiment, the information terminal 5500 can retain a temporary file generated at the time of executing an application (e.g., a web browser's cache).

[Wearable Terminal]

Figure 34B:
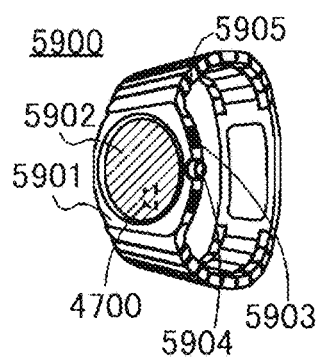

FIG. 34B illustrates an information terminal 5900 as an example of a wearable terminal. The information terminal 5900 includes a housing 5901, a display portion 5902, an operation button 5903, a crown 5904, a band 5905, and the like.

Like the information terminal 5500 described above, the wearable terminal can retain a temporary file generated at the time of executing an application by using the memory device described in the above embodiment.

[Information Terminal]

Figure 34C:

FIG. 34C illustrates a notebook information terminal 5300. The notebook information terminal 5300 illustrated in FIG. 34C includes, for example, a display portion 5331 in a housing 5330*a* and a keyboard portion 5350 in a housing 5330*b*.

Like the information terminal 5500 described above, the notebook information terminal 5300 can retain a temporary file generated at the time of executing an application by using the memory device described in the above embodiment.

Note that although FIG. 34A to FIG. 34C illustrate a smartphone, a wearable terminal, and a notebook information terminal as examples of the electronic device, one embodiment of the present invention can also be applied to an information terminal other than a smartphone, a wearable terminal, and a notebook information terminal. Examples of information terminals other than a smartphone, a wearable terminal, and a notebook information terminal include a PDA (Personal Digital Assistant), a desktop information terminal, and a workstation.

[Consumer Electronics]

Figure 34D:
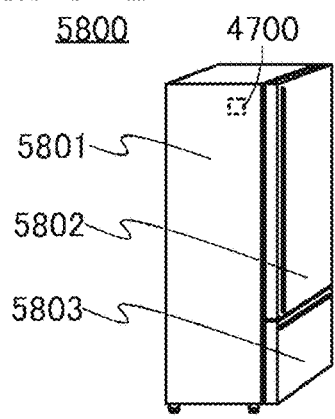

FIG. 34D illustrates an electric refrigerator-freezer 5800 as an example of consumer electronics. The electric refrigerator-freezer 5800 includes a housing 5801, a refrigerator door 5802, a freezer door 5803, and the like.

When the memory device described in the above embodiment is used in the electric refrigerator-freezer 5800, the electric refrigerator-freezer 5800 can be used for IoT (Internet of Things), for example. When used for IoT, the electric refrigerator-freezer 5800 can send and receive data on food stored in the electric refrigerator-freezer 5800 and food expiration dates, for example, to/from the above-described information terminal and the like via the Internet. When sending the data, the electric refrigerator-freezer 5800 can retain the data as a temporary file in the memory device.

Here, an electric refrigerator-freezer is described as an example of consumer electronics, other examples of consumer electronics include a vacuum, a microwave oven, an electric oven, a rice cooker, a water heater, an IH cooker, a water server, a heating-cooling combination appliance such as an air conditioner, a washing machine, a drying machine, and an audio visual appliance.

[Game Machines]

Figure 34E:
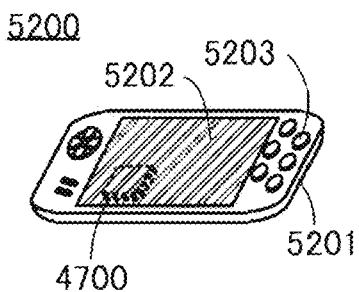

FIG. 34E illustrates a portable game machine 5200 as an example of a game machine. The portable game machine 5200 includes a housing 5201, a display portion 5202, a button 5203, and the like.

Videos displayed on the portable game machine 5200 can be output with a display device such as a television device, a personal computer display, a game display, and a head-mounted display.

When the memory device described in the above embodiment is used in the portable game machine 5200, the portable game machine 5200 with low power consumption can be achieved. Furthermore, heat generation from a circuit can be reduced owing to low power consumption; thus, the influence of heat generation on the circuit itself, the peripheral circuit, and the module can be reduced.

Moreover, with use of the memory device described in the above embodiment, the portable game machine 5200 can hold a temporary file necessary for arithmetic operation that occurs during game play.

Although FIG. 34E illustrates the portable game machine as an example of game machines, the electronic device of one embodiment of the present invention is not limited thereto. Other examples of the electronic device of one embodiment of the present invention include a stationary game machine, an arcade game machine installed in an entertainment facility (e.g., a game center and an amusement park), and a throwing machine for batting practice, installed in sports facilities.

[Moving Vehicle]

The memory device described in the above embodiment can be used for an automobile, which is a moving vehicle, and around the driver's seat in an automobile.

Figure 34F:
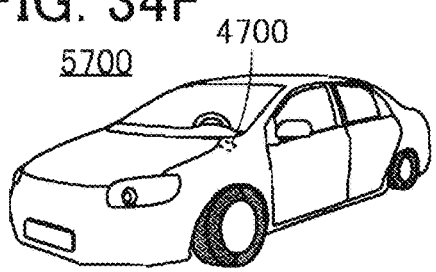

FIG. 34F illustrates an automobile 5700 that is an example of a moving vehicle.

An instrument panel that provides various kinds of information by displaying a speedometer, a tachometer, a mileage, a fuel meter, a gearshift indicator, air-conditioning settings, and the like is provided around the driver's seat in the automobile 5700. In addition, a display device showing the above information may be provided around the driver's seat.

In particular, the display device can compensate for the view obstructed by the pillar or the like, the blind areas for the driver's seat, and the like by displaying a video taken by an imaging device (not illustrated) provided for the automobile 5700, thereby providing a high level of safety.

The memory device described in the above embodiment can temporarily retain data; thus, the memory device can be used to retain temporary data necessary in an automatic driving system for the automobile 5700 and a system for navigation and risk prediction, for example. The display device may be configured to display temporary information regarding navigation, risk prediction, or the like. Moreover, the memory device may be configured to retain a video of a driving recorder provided in the automobile 5700.

Note that although an automobile is described above as an example of the moving vehicle, the moving vehicle is not limited to an automobile. Examples of moving vehicles include a train, a monorail train, a ship, a flying object (a helicopter, an unmanned aircraft (a drone), an airplane, and a rocket), and the like.

[Camera]

The memory device described in the above embodiment can be employed for a camera.

Figure 34G:
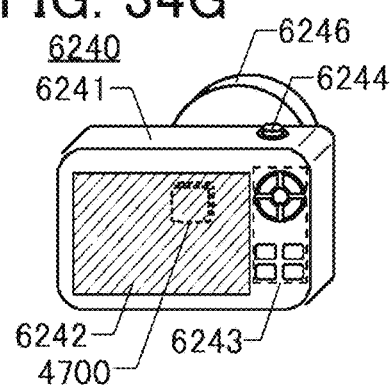

FIG. 34G illustrates a digital camera 6240 that is an example of an imaging device. The digital camera 6240 includes a housing 6241, a display portion 6242, operation buttons 6243, a shutter button 6244, and the like, and a detachable lens 6246 is attached to the digital camera 6240. Here, the lens 6246 of the digital camera 6240 is detachable from the housing 6241 for replacement; alternatively, the lens 6246 may be incorporated into the housing 6241. Moreover, the digital camera 6240 can be additionally equipped with a stroboscope, a viewfinder, or the like.

When the memory device described in the above embodiment is employed for the digital camera 6240, the digital camera 6240 with low power consumption can be achieved. Furthermore, heat generation from a circuit can be reduced owing to low power consumption; thus, the influence of heat generation on the circuit itself, the peripheral circuit, and the module can be reduced.

[ICD]

The memory device described in the above embodiment can be employed for an implantable cardioverter-defibrillator (ICD).

Figure 34H:
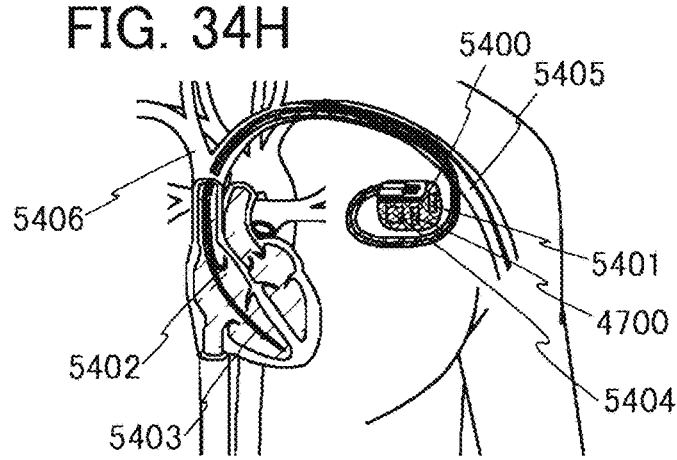

FIG. 34H is a schematic cross-sectional view showing an example of an ICD. An ICD main unit 5400 includes at least a battery 5401, the electronic component 4700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with the end of one of the wires placed in the right ventricle and the end of the other wire placed in the right atrium.

The ICD main unit 5400 functions as a pacemaker and paces the heart when the heart rate is not within a predetermined range. When the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In addition, in the ICD main unit 5400, data on the heart rate obtained by the sensor or the like, the number of times the treatment with pacing is performed, and the time taken for the treatment, for example, can be stored in the electronic component 4700.

In addition, the antenna 5404 can receive power, and the battery 5401 is charged with the power. Furthermore, when the ICD main unit 5400 includes a plurality of batteries, safety can be increased. Specifically, even when one of the batteries in the ICD main unit 5400 is dead, the other batteries can function properly; thus, the batteries also function as an auxiliary power source.

In addition to the antenna 5404 capable of receiving power, an antenna that can transmit physiological signals may be included to construct, for example, a system that monitors cardiac activity by checking physiological signals such as a pulse, a respiratory rate, a heart rate, and body temperature with an external monitoring device.

[Expansion Device for PC]

The memory device described in the above embodiment can be employed for a calculator such as a PC (Personal Computer) and an expansion device for an information terminal.

Figure 34I:
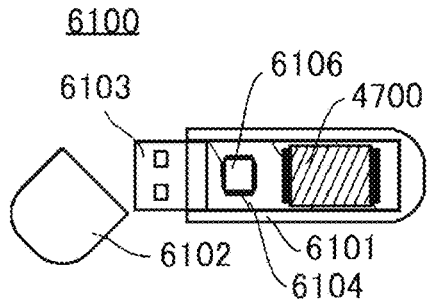

FIG. 34I illustrates, as an example of the expansion device, a portable expansion device 6100 that is externally attached to a PC and includes a chip capable of storing information. When the expansion device 6100 is connected to a PC with a USB (Universal Serial Bus), for example, data can be stored in the chip. FIG. 34I illustrates the portable expansion device 6100; however, the expansion device of one embodiment of the present invention is not limited to this and may be a relatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the memory device or the like described in the above embodiment. For example, the substrate 6104 is provided with the electronic component 4700 and a controller chip 6106. The USB connector 6103 functions as an interface for connection to an external device.

Although not illustrated, the memory device described in any of the above embodiments can be applied to a computer such as a PC (Personal Computer), an SD card or an SSD (Solid State Drive) put in an expansion device for information terminals, or the like.

The semiconductor device or the memory device described in Embodiment 1 or Embodiment 2 is used for memory devices included in the above electronic devices, whereby novel electronic devices can be provided.

Note that this embodiment can be combined with any of the other embodiments in this specification as appropriate.

REFERENCE NUMERALS

MCA: memory cell array, MC: memory cell, MC[1,1]: memory cell, MC[m,1]: memory cell, MC[1,$n$]: memory cell, MC[m,n]: memory cell, WDD: circuit, RDD: circuit, WWD: circuit, RWD: circuit, FECD: circuit, M1: transistor, M2: transistor, M3: transistor, M4A: transistor, M4B: transistor, FJA: FTJ element, FJB: FTJ element, FEA: ferroelectric capacitor, FEB: ferroelectric capacitor, ANA: circuit element, ANB: circuit element, REA: resistor, REB: resistor, WDL: wiring, WDL[1]: wiring, WDL[n]: wiring, RDL: wiring, RDL[1]: wiring, RDL[n]: wiring, WRDL: wiring, WRWL: wiring, WWL: wiring, WWL[1]: wiring, WWL[m]: wiring, RWL: wiring, RWL[1]: wiring, RWL[m]: wiring, FCA: wiring, FCA[1]: wiring, FCA[m]: wiring, FCB: wiring, FCB[1]: wiring, FCB[m]: wiring, RVE: wiring, BSA: wiring, BSB: wiring, VCE: wiring, MP: circuit, MPr: circuit, RDLr: wiring, RWLa: wiring, RWLb: wiring, WDLr: wiring, VCEr: wiring, VCE2: wiring, WHL: wiring, WCL: wiring, M1r: transistor, M2r: transistor, M3a: transistor, M3ar: transistor, M3b: transistor, M3br: transistor, M5: transistor, M6: transistor, FJAr: FTJ element, FJBr: FTJ element, 100: memory device, 110: arithmetic circuit, 300: transistor, 310: substrate, 310A: substrate, 312: element isolation layer, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 411: insulator, 412: insulator, 413: insulator, 414: insulator, 416: conductor, 500: transistor, 503: conductor, 503a: conductor, 503b: conductor, 510: insulator, 512: insulator, 514: insulator, 516: insulator, 518: conductor, 522: insulator, 524: insulator, 530: oxide, 530a: oxide, 530b: oxide, 530ba: region, 530bb: region, 530bc: region, 540: conductor, 540a: conductor, 540b: conductor, 541: insulator, 541a: insulator, 541b: insulator, 542: conductor, 542a: conductor, 542b: conductor, 543: oxide, 543a: oxide, 543b: oxide, 544: insulator, 546: conductor, 550: insulator, 550a: insulator, 550b: insulator, 552: insulator, 554: insulator, 560: conductor, 560a: conductor, 560b: conductor, 571: insulator, 571a: insulator, 571b: insulator, 574: insulator, 576: insulator, 580: insulator, 581: insulator, 582: insulator, 586: insulator, 600: capacitor, 610: conductor, 612: conductor, 620: conductor, 630: insulator, 631: insulator, 640: insulator, 641: insulator, 642: insulator, 650: insulator, 660: conductor, 700: FTJ element, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 4700: electronic component, 4702: printed circuit board, 4704: mounting board, 4710: semiconductor device, 4711: mold, 4712: land, 4713: electrode pad, 4714: wire, 4730: electronic component, 4731: interposer, 4732: package substrate, 4733: electrode, 4735: semiconductor device, 4800: semiconductor wafer, 4800a: chip, 4801: wafer, 4801a: wafer, 4802: circuit portion, 4803: spacing, 4803a: spacing, 5200: portable game machine, 5201: housing, 5202: display portion, 5203: button, 5300: notebook information terminal, 5330a: housing, 5330b: housing, 5331: display portion, 5350: keyboard portion, 5400: ICD main unit, 5401: battery, 5402: wire, 5403: wire, 5404: antenna, 5405: subclavian vein, 5406: superior vena cava, 5500: information terminal, 5510: housing, 5511: display portion, 5700: automobile, 5800: electric refrigerator-freezer, 5801: housing, 5802: refrigerator door, 5803: freezer door, 5900: information terminal, 5901: housing, 5902: display portion, 5903: operation button, 5904: crown, 5905: band, 6100: expansion device, 6101: housing, 6102: cap, 6103: USB connector, 6104: substrate, 6106: controller chip, 6240: digital camera, 6241: housing, 6242: display portion, 6243: operation button, 6244: shutter button, 6246: lens

The invention claimed is:

1. A semiconductor device comprising a first transistor, a second transistor, a first FTJ element and a second FTJ element,
    wherein each of the first FTJ element and the second FTJ element is a ferroelectric tunnel junction element,
    wherein each of the first FTJ element and the second FTJ element comprises an input terminal, a tunnel insulating film, a dielectric, and an output terminal,
    wherein in each of the first FTJ element and the second FTJ element, the input terminal, the tunnel insulating film, the dielectric, and the output terminal are stacked in this order, and
    wherein one of a source and a drain of the first transistor is electrically connected to the output terminal of the first FTJ element, the input terminal of the second FTJ element, and a gate of the second transistor.

2. The semiconductor device according to claim 1,
    wherein the tunnel insulating film comprises silicon oxide or silicon nitride, and
    wherein the dielectric comprises an oxide comprising one or both of hafnium and zirconium.

3. The semiconductor device according to claim 1, wherein one of a source and a drain of the second transistor is electrically connected to the other of the source and the drain of the first transistor.

4. The semiconductor device according to claim 1, further comprising a third transistor,
    wherein one of a source and a drain of the second transistor is electrically connected to one of a source and a drain of the third transistor.

5. The semiconductor device according to claim 4, wherein the other of the source and the drain of the third transistor is electrically connected to the other of the source and the drain of the first transistor.

6. An electronic device comprising:
    the semiconductor device according to claim 1; and
    a housing.

* * * * *